United States Patent
Riley, Jr. et al.

(10) Patent No.: US 11,579,456 B2
(45) Date of Patent: Feb. 14, 2023

(54) TRANSMISSIVE METASURFACE LENS INTEGRATION

(71) Applicant: Metalenz, Inc., Boston, MA (US)

(72) Inventors: Gilbert N. Riley, Jr., Marlborough, MA (US); Robert Devlin, Stoneham, MA (US); Adam Erlich, Arlington, MA (US); Pawel Latawiec, Cambridge, MA (US); John Graff, Swampscott, MA (US)

(73) Assignee: Metalenz, Inc., Boston, MA (US)

( * ) Notice: Subject to any disclaimer, the term of this patent is extended or adjusted under 35 U.S.C. 154(b) by 0 days.

(21) Appl. No.: 17/643,091

(22) Filed: Dec. 7, 2021

(65) Prior Publication Data

US 2022/0091428 A1 Mar. 24, 2022

Related U.S. Application Data

(63) Continuation of application No. 15/931,184, filed on May 13, 2020, which is a continuation of application
(Continued)

(51) Int. Cl.
*G02B 27/09* (2006.01)
*H01L 27/146* (2006.01)
(Continued)

(52) U.S. Cl.
CPC .......... *G02B 27/0916* (2013.01); *G02B 6/24* (2013.01); *G02B 6/42* (2013.01); *G02B 6/4201* (2013.01);
(Continued)

(58) Field of Classification Search
CPC .......... G02B 27/0916; G02B 27/0927; G02B 27/0922; G02B 27/12; G02B 27/10;
(Continued)

(56) References Cited

U.S. PATENT DOCUMENTS

| 3,877,034 A | 4/1975 | Nelson |
| 4,777,116 A | 10/1988 | Kawatsuki et al. |

(Continued)

FOREIGN PATENT DOCUMENTS

| CA | 3006173 A1 | 6/2017 |
| CA | 3020261 A1 | 10/2017 |

(Continued)

OTHER PUBLICATIONS

Voelkel et al., Laser Beam Homogenizing: Limitations and Constraints, DPIE, Europe, Optical Systems Design, 2008 (Year: 2008).*
(Continued)

*Primary Examiner* — Peter Radkowski
(74) *Attorney, Agent, or Firm* — KPPB LLP

(57) ABSTRACT

Metasurface elements, integrated systems incorporating such metasurface elements with light sources and/or detectors, and methods of the manufacture and operation of such optical arrangements and integrated systems are provided. Systems and methods for integrating transmissive metasurfaces with other semiconductor devices or additional metasurface elements, and more particularly to the integration of such metasurfaces with substrates, illumination sources and sensors are also provided. The metasurface elements provided may be used to shape output light from an illumination source or collect light reflected from a scene to form two unique patterns using the polarization of light. In such embodiments, shaped-emission and collection may be combined into a single co-designed probing and sensing optical system.

29 Claims, 29 Drawing Sheets

Related U.S. Application Data

No. 16/120,174, filed on Aug. 31, 2018, now Pat. No. 10,795,168.

(60) Provisional application No. 62/552,455, filed on Aug. 31, 2017.

(51) Int. Cl.

| | |
|---|---|
| *H01S 5/026* | (2006.01) |
| *H01S 5/40* | (2006.01) |
| *H01S 5/42* | (2006.01) |
| *G02B 27/12* | (2006.01) |
| *G02B 27/10* | (2006.01) |
| *G02B 6/24* | (2006.01) |
| *G02B 6/42* | (2006.01) |
| *H01L 31/0232* | (2014.01) |
| *H01L 33/58* | (2010.01) |

(52) U.S. Cl.
CPC ............ *G02B 6/428* (2013.01); *G02B 6/4274* (2013.01); *G02B 27/09* (2013.01); *G02B 27/0922* (2013.01); *G02B 27/0927* (2013.01); *G02B 27/10* (2013.01); *G02B 27/1006* (2013.01); *G02B 27/106* (2013.01); *G02B 27/12* (2013.01); *G02B 27/123* (2013.01); *H01L 27/14625* (2013.01); *H01S 5/026* (2013.01); *H01S 5/4012* (2013.01); *H01S 5/423* (2013.01); *H01L 31/02327* (2013.01); *H01L 33/58* (2013.01)

(58) Field of Classification Search
CPC ............ G02B 27/123; G02B 27/1006; G02B 27/106; G02B 27/09; G02B 6/24; G02B 6/42; G02B 6/4201; G02B 6/4274; G02B 6/428; H01L 27/14625; H01L 31/02327; H01L 33/58; H01S 5/026; H01S 5/4012; H01S 5/423

See application file for complete search history.

(56) References Cited

U.S. PATENT DOCUMENTS

| | | | |
|---|---|---|---|
| 4,856,899 A | 8/1989 | Iwaoka et al. | |
| 5,085,496 A | 2/1992 | Yoshida et al. | |
| 5,245,466 A | 9/1993 | Burns et al. | |
| 5,337,146 A | 8/1994 | Azzam | |
| 5,452,126 A | 9/1995 | Johnson | |
| 5,620,792 A | 4/1997 | Challener, IV | |
| 6,097,856 A | 8/2000 | Hammond, Jr. | |
| 6,731,839 B2 | 5/2004 | Bhagavatula et al. | |
| 6,825,986 B2 | 11/2004 | Ashkinazy et al. | |
| 6,834,027 B1 | 12/2004 | Sakaguchi et al. | |
| 6,924,457 B2 | 8/2005 | Koyama et al. | |
| 6,927,922 B2 | 8/2005 | George et al. | |
| 7,057,151 B2 | 6/2006 | Lezec et al. | |
| 7,061,612 B2 | 6/2006 | Johnston | |
| 7,061,693 B2 | 6/2006 | Zalevsky | |
| 7,171,078 B2 | 1/2007 | Sasaki et al. | |
| 7,171,084 B2 | 1/2007 | Izumi et al. | |
| 7,186,969 B2 | 3/2007 | Altendorf et al. | |
| 7,241,988 B2 | 7/2007 | Gruber et al. | |
| 7,324,210 B2 | 1/2008 | De et al. | |
| 7,327,468 B2 | 2/2008 | Maznev et al. | |
| 7,402,131 B2 | 7/2008 | Mueth et al. | |
| 7,450,618 B2 | 11/2008 | Dantus et al. | |
| 7,547,874 B2 | 6/2009 | Liang | |
| 7,561,264 B2 | 7/2009 | Treado et al. | |
| 7,576,899 B2 | 8/2009 | Kanesaka et al. | |
| 7,679,830 B2 | 3/2010 | Dowski, Jr. | |
| 7,684,097 B2 | 3/2010 | Fukumoto et al. | |
| 7,773,307 B2 | 8/2010 | Shih | |
| 7,800,683 B2 | 9/2010 | Zalevsky et al. | |
| 7,812,295 B2 | 10/2010 | Zalevsky et al. | |
| 7,928,900 B2 * | 4/2011 | Fuller | G01S 7/414 343/700 R |
| 7,929,220 B2 | 4/2011 | Sayag | |
| 7,965,607 B2 | 6/2011 | Fukumoto et al. | |
| 8,009,358 B2 | 8/2011 | Zalevsky et al. | |
| 8,040,604 B2 | 10/2011 | Zalevsky et al. | |
| 8,107,705 B2 | 1/2012 | Dowski, Jr. et al. | |
| 8,152,307 B2 | 4/2012 | Duelli et al. | |
| 8,169,703 B1 | 5/2012 | Mossberg et al. | |
| 8,192,022 B2 | 6/2012 | Zalevsky | |
| 8,212,866 B2 | 7/2012 | Lemmer et al. | |
| 8,318,386 B2 | 11/2012 | Kobrin | |
| 8,328,396 B2 | 12/2012 | Capasso et al. | |
| 8,351,048 B2 | 1/2013 | Millerd | |
| 8,351,120 B2 | 1/2013 | Deng et al. | |
| 8,390,932 B2 | 3/2013 | Jia et al. | |
| 8,430,513 B2 | 4/2013 | Chang et al. | |
| 8,451,368 B2 | 5/2013 | Sung et al. | |
| 8,472,797 B2 | 6/2013 | Ok et al. | |
| 8,481,948 B2 * | 7/2013 | Frach | G01T 1/2002 250/361 R |
| 8,558,873 B2 | 10/2013 | Mceldowney | |
| 8,587,474 B2 * | 11/2013 | Fuller | G01S 7/414 342/21 |
| 8,649,631 B2 | 2/2014 | Islam et al. | |
| 8,681,428 B1 | 3/2014 | Brown | |
| 8,687,040 B2 | 4/2014 | Silveira | |
| 8,716,677 B2 * | 5/2014 | Cui | G02B 26/06 250/459.1 |
| 8,734,033 B2 | 5/2014 | Walters et al. | |
| 8,743,923 B2 * | 6/2014 | Geske | G01S 7/4815 372/50.12 |
| 8,816,460 B2 | 8/2014 | Kalevo et al. | |
| 8,848,273 B2 | 9/2014 | Yu et al. | |
| 8,876,289 B2 | 11/2014 | Dorronsoro Diaz et al. | |
| 8,908,149 B2 | 12/2014 | Freimann | |
| 8,912,973 B2 | 12/2014 | Werner et al. | |
| 8,981,337 B1 | 3/2015 | Burckel et al. | |
| 9,007,451 B2 | 4/2015 | Rogers et al. | |
| 9,116,302 B2 * | 8/2015 | McCarthy | G02B 1/007 |
| 9,151,891 B2 | 10/2015 | Ma et al. | |
| 9,212,899 B2 | 12/2015 | Johnson et al. | |
| 9,298,060 B2 | 3/2016 | Shen et al. | |
| 9,309,274 B2 | 4/2016 | Van et al. | |
| 9,310,535 B1 | 4/2016 | Greiner et al. | |
| 9,329,484 B1 | 5/2016 | Markle et al. | |
| 9,330,704 B2 | 5/2016 | Nishimura et al. | |
| 9,367,036 B2 | 6/2016 | Pyun et al. | |
| 9,369,621 B2 | 6/2016 | Malone et al. | |
| 9,391,700 B1 | 7/2016 | Bruce et al. | |
| 9,392,153 B2 | 7/2016 | Myhre et al. | |
| 9,411,103 B2 * | 8/2016 | Astratov | G02B 1/00 |
| 9,482,796 B2 | 11/2016 | Arbabi et al. | |
| 9,500,771 B2 | 11/2016 | Liu et al. | |
| 9,553,423 B2 * | 1/2017 | Chen | H04N 13/204 |
| 9,557,585 B1 * | 1/2017 | Yap | G01S 7/4815 |
| 9,606,415 B2 | 3/2017 | Zheludev et al. | |
| 9,609,190 B2 | 3/2017 | Lee et al. | |
| 9,739,918 B2 * | 8/2017 | Arbabi | G02B 5/021 |
| 9,766,463 B2 | 9/2017 | Border et al. | |
| 9,778,404 B2 | 10/2017 | Divliansky et al. | |
| 9,825,074 B2 | 11/2017 | Tian et al. | |
| 9,829,700 B2 | 11/2017 | Parent et al. | |
| 9,835,870 B2 | 12/2017 | Astratov et al. | |
| 9,836,122 B2 | 12/2017 | Border | |
| 9,869,580 B2 | 1/2018 | Grossinger et al. | |
| 9,880,377 B1 | 1/2018 | Safrani et al. | |
| 9,885,859 B2 | 2/2018 | Harris | |
| 9,891,393 B2 | 2/2018 | Reece | |
| 9,939,129 B2 | 4/2018 | Byrnes et al. | |
| 9,947,118 B2 | 4/2018 | Khare et al. | |
| 9,952,096 B2 | 4/2018 | Kats et al. | |
| 9,958,251 B1 | 5/2018 | Brock et al. | |
| 9,967,541 B2 | 5/2018 | Piestun | |
| 9,978,801 B2 | 5/2018 | Park et al. | |
| 9,989,680 B2 | 6/2018 | Arbabi et al. | |
| 9,992,474 B2 * | 6/2018 | Grunnet-Jepsen | H04N 13/25 |
| 9,995,859 B2 | 6/2018 | Kamali et al. | |

(56) References Cited

U.S. PATENT DOCUMENTS

| | | |
|---|---|---|
| 9,995,930 B2 | 6/2018 | Arbabi et al. |
| 10,007,118 B2 | 6/2018 | Border |
| 10,054,859 B2 | 8/2018 | Ye et al. |
| 10,108,085 B2 | 10/2018 | Peters et al. |
| 10,126,466 B2 | 11/2018 | Lin et al. |
| 10,132,465 B2 | 11/2018 | Byrnes et al. |
| 10,149,612 B2 | 12/2018 | Muyo et al. |
| 10,155,846 B2 | 12/2018 | Fuji et al. |
| 10,234,383 B2* | 3/2019 | Wang ................ G01J 3/10 |
| 10,254,454 B2 | 4/2019 | Klug et al. |
| 10,267,957 B2 | 4/2019 | Kamali et al. |
| 10,310,148 B2 | 6/2019 | Stewart et al. |
| 10,310,387 B2 | 6/2019 | Palmer et al. |
| 10,317,667 B2 | 6/2019 | Waller et al. |
| 10,324,314 B2 | 6/2019 | Czaplewski et al. |
| 10,338,275 B1 | 7/2019 | Acosta et al. |
| 10,341,640 B2 | 7/2019 | Shechtman et al. |
| 10,345,246 B2 | 7/2019 | Tian et al. |
| 10,345,519 B1 | 7/2019 | Miller et al. |
| 10,365,416 B2 | 7/2019 | Zhan et al. |
| 10,386,620 B2 | 8/2019 | Astratov et al. |
| 10,402,993 B2 | 9/2019 | Han et al. |
| 10,408,416 B2 | 9/2019 | Khorasaninejad et al. |
| 10,408,419 B2 | 9/2019 | Aieta et al. |
| 10,416,565 B2 | 9/2019 | Ahmed et al. |
| 10,440,244 B2 | 10/2019 | Rosenblatt et al. |
| 10,440,300 B2 | 10/2019 | Rephaeli et al. |
| 10,466,394 B2 | 11/2019 | Lin et al. |
| 10,468,447 B2 | 11/2019 | Akselrod et al. |
| 10,481,317 B2 | 11/2019 | Peroz et al. |
| 10,514,296 B2 | 12/2019 | Han et al. |
| 10,527,832 B2 | 1/2020 | Schwab et al. |
| 10,527,851 B2 | 1/2020 | Lin et al. |
| 10,536,688 B2 | 1/2020 | Haas et al. |
| 10,539,723 B2 | 1/2020 | Iazikov et al. |
| 10,545,323 B2 | 1/2020 | Schwab et al. |
| 10,591,643 B2 | 3/2020 | Lin et al. |
| 10,670,782 B2* | 6/2020 | Arbabi ................ G02B 5/1876 |
| 10,725,290 B2 | 7/2020 | Fan et al. |
| 10,795,168 B2* | 10/2020 | Riley, Jr. ............... H01S 5/4012 |
| 10,816,815 B2 | 10/2020 | Aieta et al. |
| 10,916,060 B2 | 2/2021 | West et al. |
| 11,092,717 B2 | 8/2021 | Capasso et al. |
| 11,169,311 B2 | 11/2021 | Rubin et al. |
| 2002/0048727 A1 | 4/2002 | Zhou et al. |
| 2002/0118903 A1 | 8/2002 | Cottrell et al. |
| 2002/0181126 A1 | 12/2002 | Nishioka |
| 2003/0077983 A1 | 4/2003 | Hagan et al. |
| 2003/0107787 A1 | 6/2003 | Bablumyan |
| 2004/0173738 A1* | 9/2004 | Mizuno ................ G02B 26/0841 |
| | | 250/234 |
| 2004/0184752 A1 | 9/2004 | Aoki et al. |
| 2004/0190116 A1 | 9/2004 | Lezec et al. |
| 2005/0151698 A1 | 7/2005 | Mohamadi |
| 2005/0161589 A1 | 7/2005 | Kim et al. |
| 2005/0211665 A1 | 9/2005 | Gao et al. |
| 2005/0220162 A1 | 10/2005 | Nakamura |
| 2005/0239003 A1 | 10/2005 | Chiodini et al. |
| 2006/0042322 A1 | 3/2006 | Mendoza et al. |
| 2006/0127829 A1 | 6/2006 | Deng et al. |
| 2007/0024975 A1 | 2/2007 | McGrew |
| 2007/0026585 A1 | 2/2007 | Wong et al. |
| 2007/0273957 A1* | 11/2007 | Zalevsky ............ G02B 19/0014 |
| | | 359/566 |
| 2008/0014632 A1 | 1/2008 | Cunningham et al. |
| 2009/0135086 A1* | 5/2009 | Fuller ................... G01S 13/885 |
| | | 343/909 |
| 2009/0230333 A1 | 9/2009 | Eleftheriades |
| 2009/0296223 A1 | 12/2009 | Werner et al. |
| 2010/0033701 A1 | 2/2010 | Lee et al. |
| 2010/0055621 A1 | 3/2010 | Hatakeyama et al. |
| 2010/0072170 A1 | 3/2010 | Wu et al. |
| 2010/0110430 A1 | 5/2010 | Ebbesen et al. |
| 2010/0134869 A1 | 6/2010 | Bernet et al. |
| 2010/0187658 A1 | 7/2010 | Wei |
| 2010/0226134 A1 | 9/2010 | Capasso et al. |
| 2010/0232017 A1* | 9/2010 | McCarthy ............ G02B 1/007 |
| | | 359/485.05 |
| 2010/0255428 A1 | 10/2010 | Chen et al. |
| 2011/0012807 A1 | 1/2011 | Sorvala |
| 2011/0019180 A1 | 1/2011 | Kruglick |
| 2011/0187577 A1* | 8/2011 | Fuller ................ H01Q 15/0086 |
| | | 342/22 |
| 2012/0140235 A1 | 6/2012 | Lee et al. |
| 2012/0258407 A1 | 10/2012 | Sirat |
| 2012/0293854 A1* | 11/2012 | Zheludev ............ G02F 1/3501 |
| | | 359/244 |
| 2012/0327666 A1 | 12/2012 | Liu et al. |
| 2012/0328240 A1 | 12/2012 | Ma et al. |
| 2013/0016030 A1 | 1/2013 | Liu et al. |
| 2013/0032949 A1 | 2/2013 | Lin et al. |
| 2013/0037873 A1 | 2/2013 | Suzuki et al. |
| 2013/0050285 A1* | 2/2013 | Takahashi ............ G02B 5/1871 |
| | | 345/87 |
| 2013/0058071 A1 | 3/2013 | Ben |
| 2013/0194787 A1* | 8/2013 | Geske ................ H01S 5/4087 |
| | | 362/231 |
| 2013/0208332 A1* | 8/2013 | Yu ........................ G02B 1/002 |
| | | 977/773 |
| 2014/0043846 A1 | 2/2014 | Yang et al. |
| 2014/0210835 A1 | 7/2014 | Hong et al. |
| 2015/0011073 A1 | 1/2015 | Lei et al. |
| 2015/0017466 A1 | 1/2015 | Ayon et al. |
| 2015/0018500 A1 | 1/2015 | Gerber et al. |
| 2015/0055745 A1 | 2/2015 | Holzner et al. |
| 2015/0068599 A1 | 3/2015 | Chou et al. |
| 2015/0090862 A1 | 4/2015 | Matsui et al. |
| 2015/0092139 A1 | 4/2015 | Eguchi |
| 2015/0098002 A1 | 4/2015 | Wang |
| 2015/0116721 A1* | 4/2015 | Kats .................... G01J 3/0205 |
| | | 359/887 |
| 2015/0219806 A1 | 8/2015 | Arbabi et al. |
| 2015/0241608 A1 | 8/2015 | Shian et al. |
| 2015/0316717 A1* | 11/2015 | Astratov ................ G02B 1/00 |
| | | 385/35 |
| 2016/0025914 A1 | 1/2016 | Brongersma et al. |
| 2016/0037146 A1* | 2/2016 | McGrew ............ G02B 27/0172 |
| | | 353/38 |
| 2016/0077261 A1* | 3/2016 | Arbabi ................ G02B 5/3083 |
| | | 359/493.01 |
| 2016/0161826 A1 | 6/2016 | Shen et al. |
| 2016/0195705 A1 | 7/2016 | Betzig et al. |
| 2016/0254638 A1* | 9/2016 | Chen .................. H01S 5/18388 |
| | | 362/11 |
| 2016/0299337 A1 | 10/2016 | Arbabi et al. |
| 2016/0299426 A1 | 10/2016 | Gates et al. |
| 2016/0306079 A1 | 10/2016 | Arbabi et al. |
| 2016/0306157 A1 | 10/2016 | Rho et al. |
| 2016/0318067 A1 | 11/2016 | Banerjee et al. |
| 2016/0331457 A1 | 11/2016 | Varghese et al. |
| 2016/0341859 A1 | 11/2016 | Shvets et al. |
| 2016/0359235 A1* | 12/2016 | Driscoll ................ G01S 13/931 |
| 2016/0361002 A1 | 12/2016 | Palikaras et al. |
| 2016/0370568 A1* | 12/2016 | Toussaint ................ C03C 17/36 |
| 2017/0003169 A1 | 1/2017 | Shaltout et al. |
| 2017/0010466 A1* | 1/2017 | Klug .................... G02B 5/1833 |
| 2017/0030773 A1 | 2/2017 | Han et al. |
| 2017/0038574 A1 | 2/2017 | Zhuang et al. |
| 2017/0082263 A1* | 3/2017 | Byrnes ................ H01Q 15/0086 |
| 2017/0090221 A1 | 3/2017 | Atwater |
| 2017/0125911 A1 | 5/2017 | Alu et al. |
| 2017/0131460 A1 | 5/2017 | Lin et al. |
| 2017/0146806 A1 | 5/2017 | Lin et al. |
| 2017/0176758 A1* | 6/2017 | Lerner ................ G02B 27/0927 |
| 2017/0186166 A1* | 6/2017 | Grunnet-Jepsen ... H04N 13/239 |
| 2017/0212285 A1* | 7/2017 | Arbabi ................ G02B 1/002 |
| 2017/0235162 A1 | 8/2017 | Shaltout et al. |
| 2017/0250577 A1 | 8/2017 | Ho et al. |
| 2017/0299784 A1 | 10/2017 | Mikkelsen et al. |
| 2017/0310907 A1 | 10/2017 | Wang |
| 2017/0329201 A1 | 11/2017 | Arnold |
| 2017/0374352 A1 | 12/2017 | Horesh |
| 2018/0035101 A1 | 2/2018 | Osterhout |

(56) References Cited

U.S. PATENT DOCUMENTS

| | | |
|---|---|---|
| 2018/0044234 A1 | 2/2018 | Hokansson et al. |
| 2018/0045953 A1 | 2/2018 | Fan et al. |
| 2018/0052276 A1 | 2/2018 | Klienman et al. |
| 2018/0052320 A1 | 2/2018 | Curtis et al. |
| 2018/0107015 A1 | 4/2018 | Dümpelmann et al. |
| 2018/0129866 A1 | 5/2018 | Hicks et al. |
| 2018/0216797 A1 | 8/2018 | Khorasaninejad et al. |
| 2018/0217395 A1 | 8/2018 | Lin et al. |
| 2018/0231700 A1 | 8/2018 | Ahmed et al. |
| 2018/0231702 A1 | 8/2018 | Lin et al. |
| 2018/0236596 A1 | 8/2018 | Ihlemann et al. |
| 2018/0246262 A1 | 8/2018 | Zhan et al. |
| 2018/0248268 A1 | 8/2018 | Shvets et al. |
| 2018/0252857 A1 | 9/2018 | Glik et al. |
| 2018/0259700 A1 | 9/2018 | Khorasaninejad et al. |
| 2018/0259757 A1 | 9/2018 | Urzhumov |
| 2018/0267605 A1 | 9/2018 | Border |
| 2018/0274750 A1 | 9/2018 | Byrnes et al. |
| 2018/0314130 A1 | 11/2018 | Joo et al. |
| 2018/0341090 A1 | 11/2018 | Devlin et al. |
| 2018/0364158 A1* | 12/2018 | Wang ................... G01J 3/10 |
| 2019/0003892 A1 | 1/2019 | Aieta et al. |
| 2019/0025463 A1 | 1/2019 | She et al. |
| 2019/0025477 A1 | 1/2019 | She et al. |
| 2019/0041642 A1 | 2/2019 | Haddick et al. |
| 2019/0041736 A1 | 2/2019 | Grunnet-Jepsen et al. |
| 2019/0044003 A1 | 2/2019 | Heck et al. |
| 2019/0049632 A1 | 2/2019 | Shin et al. |
| 2019/0049732 A1 | 2/2019 | Lee et al. |
| 2019/0057512 A1 | 2/2019 | Han et al. |
| 2019/0064532 A1* | 2/2019 | Riley, Jr. ................. H01S 5/026 |
| 2019/0086579 A1 | 3/2019 | Kim et al. |
| 2019/0086683 A1 | 3/2019 | Aieta et al. |
| 2019/0101448 A1 | 4/2019 | Lee et al. |
| 2019/0113775 A1 | 4/2019 | Jang et al. |
| 2019/0120817 A1 | 4/2019 | Anderson |
| 2019/0121004 A1 | 4/2019 | Ahmed et al. |
| 2019/0137075 A1 | 5/2019 | Aieta et al. |
| 2019/0137793 A1 | 5/2019 | Luo et al. |
| 2019/0154877 A1 | 5/2019 | Capasso et al. |
| 2019/0170655 A1 | 6/2019 | Smith |
| 2019/0196068 A1 | 6/2019 | Tsai et al. |
| 2019/0206136 A1 | 7/2019 | West et al. |
| 2019/0219835 A1 | 7/2019 | Skinner et al. |
| 2019/0235139 A1 | 8/2019 | Chen et al. |
| 2019/0250107 A1 | 8/2019 | Sreenivasan et al. |
| 2019/0369401 A1 | 12/2019 | Rolland et al. |
| 2019/0377084 A1 | 12/2019 | Sleasman et al. |
| 2019/0391378 A1 | 12/2019 | Eichelkraut et al. |
| 2020/0025888 A1 | 1/2020 | Jang et al. |
| 2020/0096672 A1 | 3/2020 | Yu et al. |
| 2020/0271941 A1* | 8/2020 | Riley, Jr. ................. H01S 5/423 |
| 2021/0028215 A1 | 1/2021 | Devlin et al. |
| 2021/0048569 A1 | 2/2021 | Rubin et al. |
| 2021/0109364 A1 | 4/2021 | Aieta et al. |
| 2021/0263329 A1 | 8/2021 | Latawiec |
| 2021/0286188 A1 | 9/2021 | Rubin et al. |
| 2021/0302763 A1* | 9/2021 | Yao ................... G02F 1/0147 |
| 2022/0052093 A1 | 2/2022 | Devlin et al. |
| 2022/0091428 A1* | 3/2022 | Riley, Jr. ................. H01S 5/423 |
| 2022/0107263 A1 | 4/2022 | Biesinger et al. |
| 2022/0206186 A1 | 6/2022 | Chen et al. |

FOREIGN PATENT DOCUMENTS

| | | | | |
|---|---|---|---|---|
| CN | 101158727 A | 4/2008 | | |
| CN | 101164147 A | 4/2008 | | |
| CN | 100476504 C | 4/2009 | | |
| CN | 101510013 B | 6/2010 | | |
| CN | 101510012 B | 8/2010 | | |
| CN | 101510011 B | 9/2010 | | |
| CN | 101241173 B | 8/2011 | | |
| CN | 202854395 U | 4/2013 | | |
| CN | 103092049 A | 5/2013 | | |
| CN | 203799117 U | 8/2014 | | |
| CN | 104067171 A | 9/2014 | | |
| CN | 104374745 A | 2/2015 | | |
| CN | 204422813 U | 6/2015 | | |
| CN | 104932043 A | 9/2015 | | |
| CN | 104956491 A | 9/2015 | | |
| CN | 204719330 U | 10/2015 | | |
| CN | 105068396 A | 11/2015 | | |
| CN | 103869484 B | 1/2016 | | |
| CN | 105223689 A | 1/2016 | | |
| CN | 105278026 A | 1/2016 | | |
| CN | 105278309 A | 1/2016 | | |
| CN | 105655286 A | 6/2016 | | |
| CN | 105676314 A | 6/2016 | | |
| CN | 105917277 A | * | 8/2016 | ............ G02B 26/06 |
| CN | 103257441 B | 10/2016 | | |
| CN | 205620619 U | 10/2016 | | |
| CN | 104834079 B | 4/2017 | | |
| CN | 106611699 A | 5/2017 | | |
| CN | 104834089 B | 6/2017 | | |
| CN | 106848555 A | * | 6/2017 | ............... H01Q 1/38 |
| CN | 106200276 B | 10/2017 | | |
| CN | 104834088 B | 12/2017 | | |
| CN | 105676314 B | 1/2018 | | |
| CN | 107561857 A | 1/2018 | | |
| CN | 108089325 A | 5/2018 | | |
| CN | 108291983 A | 7/2018 | | |
| CN | 207623619 U | 7/2018 | | |
| CN | 106199997 B | 8/2018 | | |
| CN | 108474869 A | 8/2018 | | |
| CN | 108507542 A | 9/2018 | | |
| CN | 207923075 U | 9/2018 | | |
| CN | 108680544 A | 10/2018 | | |
| CN | 108761779 A | 11/2018 | | |
| CN | 109000692 A | 12/2018 | | |
| CN | 208270846 U | 12/2018 | | |
| CN | 109196387 A | 1/2019 | | |
| CN | 106199956 B | 2/2019 | | |
| CN | 109360139 A | 2/2019 | | |
| CN | 106950195 B | 5/2019 | | |
| CN | 106324832 B | 7/2019 | | |
| CN | 106526730 B | 7/2019 | | |
| CN | 106485761 B | 8/2019 | | |
| CN | 110160685 A | 8/2019 | | |
| CN | 110678773 A | 1/2020 | | |
| CN | 108474869 B | 6/2020 | | |
| CN | 111316138 A | 6/2020 | | |
| CN | 111580190 A | 8/2020 | | |
| CN | 111656707 A | 9/2020 | | |
| CN | 111819489 A | 10/2020 | | |
| CN | 113168022 A | 7/2021 | | |
| CN | 114286953 A | 4/2022 | | |
| DE | 102007058558 A1 | 6/2009 | | |
| DE | 102009037629 A1 | 2/2011 | | |
| DE | 102012212753 A1 | 1/2014 | | |
| DE | 102015221985 A1 | 5/2017 | | |
| DE | 102016218996 A1 | 9/2017 | | |
| DE | 112018002811 T5 | 2/2020 | | |
| DE | 112018002670 T5 | 3/2020 | | |
| EP | 1251397 A2 | 10/2002 | | |
| EP | 1252623 B1 | 10/2004 | | |
| EP | 2763519 A2 | 8/2014 | | |
| EP | 2338114 B1 | 3/2017 | | |
| EP | 3226042 A1 | 10/2017 | | |
| EP | 3353578 A1 | 8/2018 | | |
| EP | 3380876 A1 | 10/2018 | | |
| EP | 3385770 A1 | 10/2018 | | |
| EP | 3440484 A1 | 2/2019 | | |
| EP | 3504566 A2 | 7/2019 | | |
| EP | 3631533 A1 | 4/2020 | | |
| EP | 3676973 A1 | 7/2020 | | |
| EP | 3743764 A1 | 12/2020 | | |
| EP | 3799626 A1 | 4/2021 | | |
| EP | 4004608 A1 | 6/2022 | | |
| GB | 2490895 A | * | 11/2012 | ........... G02F 1/3501 |
| GB | 2499869 B | 3/2018 | | |
| GB | 2578233 A | 4/2020 | | |
| GB | 2578236 A | 4/2020 | | |
| GB | 2578049 A | 5/2020 | | |
| HK | 40010538 | 7/2020 | | |

(56) References Cited

FOREIGN PATENT DOCUMENTS

| | | | | |
|---|---|---|---|---|
| JP | 20040302457 | A | 10/2004 | |
| JP | 2005017408 | A | 1/2005 | |
| JP | 2005274847 | A | 10/2005 | |
| JP | 2008046428 | A | 2/2008 | |
| JP | 2008299084 | A | 12/2008 | |
| JP | 2010085977 | A | 4/2010 | |
| JP | 2015502581 | A | 1/2015 | |
| JP | 2015092234 | A | 5/2015 | |
| JP | 2016511936 | A | 4/2016 | |
| JP | 2017062373 | A | 3/2017 | |
| JP | 2018536204 | A | 12/2018 | |
| JP | 2018537804 | A | 12/2018 | |
| JP | 2019516128 | A | 6/2019 | |
| JP | 2021511553 | A | 5/2021 | |
| JP | 6925358 | B2 | 8/2021 | |
| KR | 20080099452 | A | 11/2008 | |
| KR | 20080103149 | A | 11/2008 | |
| KR | 20090002583 | A | 1/2009 | |
| KR | 20100027995 | A | 3/2010 | |
| KR | 101493928 | B1 | 3/2015 | |
| KR | 20150113041 | A | 10/2015 | |
| KR | 20170015109 | A | 2/2017 | |
| KR | 20180083885 | A | 7/2018 | |
| KR | 20180121309 | A | 11/2018 | |
| KR | 20180124106 | A | 11/2018 | |
| KR | 101905444 | B1 | 12/2018 | |
| KR | 20190038221 | A | 4/2019 | |
| KR | 102036640 | B1 | 10/2019 | |
| KR | 10-2020-0008630 | A | 1/2020 | |
| KR | 1020200108901 | A | 9/2020 | |
| KR | 20210088520 | A | 7/2021 | |
| KR | 10-2363805 | B1 | 2/2022 | |
| KR | 1020220035971 | A | 3/2022 | |
| SG | 11201804346 | P | 6/2018 | |
| SG | 11201808772 | W | 11/2018 | |
| SG | 11201808772 | W | 11/2021 | |
| TW | 201017338 | A | 5/2010 | |
| TW | 201438242 | A | 10/2014 | |
| TW | 201908232 | A | 3/2019 | |
| WO | WO-0043750 | A2 * | 7/2000 | ............ A61B 10/00 |
| WO | 2007141788 | A2 | 12/2007 | |
| WO | 2009067540 | A1 | 5/2009 | |
| WO | 2009124181 | A2 | 10/2009 | |
| WO | 2011106553 | A2 | 9/2011 | |
| WO | 2011106553 | A3 | 1/2012 | |
| WO | 2012144997 | A1 | 10/2012 | |
| WO | WO-2012139634 | A1 * | 10/2012 | ......... G02B 27/0905 |
| WO | 2012172366 | A1 | 12/2012 | |
| WO | 2013033591 | A1 | 3/2013 | |
| WO | 2014116500 | A1 | 7/2014 | |
| WO | 2015021255 | A1 | 2/2015 | |
| WO | 2015077926 | A1 | 6/2015 | |
| WO | 2015112939 | A1 | 7/2015 | |
| WO | 2015160412 | A2 | 10/2015 | |
| WO | 2016051325 | A1 | 4/2016 | |
| WO | 2016086204 | A1 | 6/2016 | |
| WO | 2016140720 | A2 | 9/2016 | |
| WO | WO-2016140720 | A2 * | 9/2016 | ............ G02B 1/002 |
| WO | 2016140720 | A3 | 10/2016 | |
| WO | 2016168173 | A1 | 10/2016 | |
| WO | WO-2016178740 | A2 * | 11/2016 | ............... G01J 4/02 |
| WO | 2016191142 | A2 | 12/2016 | |
| WO | 2017005709 | A1 | 1/2017 | |
| WO | 2017040854 | A1 | 3/2017 | |
| WO | 2017053309 | A1 | 3/2017 | |
| WO | 2017091738 | A1 | 6/2017 | |
| WO | 2017176921 | A1 | 10/2017 | |
| WO | 2018063455 | A1 | 4/2018 | |
| WO | 2018067246 | A2 | 4/2018 | |
| WO | 2018063455 | A9 | 5/2018 | |
| WO | 2018118984 | A1 | 6/2018 | |
| WO | 2018134215 | A1 | 7/2018 | |
| WO | 2018067246 | A3 | 8/2018 | |
| WO | 2018142339 | A1 | 8/2018 | |
| WO | 2018204856 | A1 | 11/2018 | |
| WO | 2018218063 | A1 | 11/2018 | |
| WO | 2018219710 | A1 | 12/2018 | |
| WO | 2018222944 | A1 | 12/2018 | |
| WO | 2019015735 | A1 | 1/2019 | |
| WO | 2019039241 | A1 | 2/2019 | |
| WO | 2019043016 | A1 | 3/2019 | |
| WO | 2019046827 | A1 | 3/2019 | |
| WO | 2019057907 | A1 | 3/2019 | |
| WO | 2019075335 | A1 | 4/2019 | |
| WO | 2019101750 | A2 | 5/2019 | |
| WO | 2019103762 | A2 | 5/2019 | |
| WO | 2019108290 | A1 | 6/2019 | |
| WO | 2019116364 | A1 | 6/2019 | |
| WO | 2019118646 | A1 | 6/2019 | |
| WO | 2019119025 | A1 | 6/2019 | |
| WO | 2019103762 | A3 | 7/2019 | |
| WO | 2019136166 | A1 | 7/2019 | |
| WO | 2019103762 | A9 | 8/2019 | |
| WO | 2019147828 | A1 | 8/2019 | |
| WO | 2019148200 | A1 | 8/2019 | |
| WO | 2019164542 | A1 | 8/2019 | |
| WO | 2019164849 | A1 | 8/2019 | |
| WO | 2019173357 | A1 | 9/2019 | |
| WO | 2019198568 | A1 | 10/2019 | |
| WO | 2019203876 | A2 | 10/2019 | |
| WO | 2019204667 | A1 | 10/2019 | |
| WO | 2019206430 | A1 | 10/2019 | |
| WO | 2020001938 | A1 | 1/2020 | |
| WO | 2020010084 | A1 | 1/2020 | |
| WO | 2020214617 | A1 | 10/2020 | |
| WO | 2021021671 | A1 | 2/2021 | |

OTHER PUBLICATIONS

Sayyah et al., Two-dimensional pseudo-random optical phased array based on tandem optical injection locking of vertical cavity surface emitting lasers, Jul. 27, 2015 | vol. 23, No. 15 | DOI:10.1364/OE.23.019405 | Optics Express 19405 (Year: 2015).*

Arbabi et al., Dielectric Metasurfaces for Complete Control of Phase and Polarization with Subwavelength Spatial Resolution and High Transmission, arXiv:1411.1494v2 [physics.optics] Sep. 4, 2015 (Year: 2015).*

Silvestri et al., Robust design procedure for dielectricresonator metasurface lens array, vol. 24, No. 25 | Dec. 12, 2016 | Optics Express 29154 (Year: 2016).*

Khorasaninejad et al., Metalenses at visible wavelengths: Diffraction-limited focusing and subwavelength resolution imaging, Science, Jun. 3, 2016 • vol. 352 Issue 6290 (Year: 2016).*

Orazbayev et al., Tunable beam steering enabled by graphene Metamaterials, Apr. 18, 2016 | vol. 24, No. 8 | DOI:10.1364/OE.24.008848 | Optics Express 8848 (Year: 2016).*

Cumme et al., From regular periodic micro-lens arrays to randomized continuous phase profiles, Adv. Opt. Techn. 2015; 4(1): 47-61 (Year: 2015).*

Aieta et al., Multiwavelength achromatic metasurfaces by dispersive phase compensation, Mar. 20, 2015 • vol. 347 Issue 6228 (Year: 2015).*

Arbabi et al., Subwavelength-thick lenses with high numerical apertures and large efficiency based on high-contrast transmit arrays, Nature Communications | 6:7069 | DOI: 10.1038/ncomms8069 |www.nature.com/naturecommunications, 2015. (Year: 2015).*

Lin et al., Dielectric gradient metasurface optical elements, Science, Jul. 18, 2014 • vol. 345 Issue 6194, (Year: 2014).*

Khorasaninejad et al., Broadband Multifunctional Efficient Meta-Gratings Based on Dielectric Waveguide Phase Shifters, Nano Lett. 2015, 15, 6709-6715. (Year: 2015).*

Byrnes et al., Designing large, high-efficiency, high-numerical aperture, transmissive meta-lenses for visible light, Mar. 7, 2016 | vol. 24, No. 5 | DOI:10.1364/OE.24.005110 | Optics Express 5110 (Year: 2016).*

Zhou et al., "Progress on vertical-cavity surface-emitting laser arrays for infrared illumination applications," Proc. SPIE 9001, Vertical-Cavity Surface-Emitting Lasers XVIII, 90010E (Feb. 27, 2014); doi: 10.1117/12.2040429 (Year: 2014).*

(56) References Cited

OTHER PUBLICATIONS

Seurin et al., "High-efficiency VCSEL arrays for illumination and sensing in consumer applications," Proc. SPIE 9766, Vertical-Cavity Surface-Emitting Lasers XX, 97660D (Mar. 4, 2016); doi:10.1117/12.2213295 (Year: 2016).*
Extended European Search Report for European Application 17858861.2, Report Completed Mar. 13, 2020, dated Mar. 23, 2020, 9 Pgs.
Extended European Search Report for European Application No. 18852460.7, Search completed Mar. 25, 2021, dated Apr. 6, 2021, 13 pgs.
Extended Search Report for European Application No. 18805669.1, Search completed Feb. 9, 2021, dated Feb. 18, 2021, 13 pgs.
International Preliminary Report on Patentability for International Application PCT/US2019/040302, Report dated Jan. 5, 2021, dated Jan. 14, 2021, 5 pgs.
International Preliminary Report on Patentability for International Application No. PCT/US2018/031204, Report dated Nov. 5, 2019, dated Nov. 14, 2019, 8 pgs.
International Preliminary Report on Patentability for International Application PCT/US2008/084068, Report dated May 25, 2010, 5 pgs.
International Preliminary Report on Patentability for International Application PCT/US2017/036897, Report dated Dec. 11, 2018, dated Dec. 20, 2018, 8 pgs.
International Preliminary Report on Patentability for International Application PCT/US2017/048469, Report dated Feb. 26, 2019, dated Mar. 7, 2019, 5 pgs.
International Preliminary Report on Patentability for International Application PCT/US2020/043600, Report dated Feb. 1, 2022, dated Feb. 10, 2022, 8 pgs.
International Search Report and Written Opinion for International Application No. PCT/US2019/014975, Search completed Jun. 17, 2019, dated Jul. 8, 2019, 10 pgs.
International Search Report and Written Opinion for International Application No. PCT/US2019/018615, Search completed Apr. 12, 2019, dated May 6, 2019, 12 pgs.
International Search Report and Written Opinion for International Application No. PCT/US2019/040302, completed Aug. 29, 2019, dated Oct. 17, 2019, 6 pgs.
International Search Report and Written Opinion for International Application No. PCT/US2020/043600, Search completed Sep. 29, 2020, dated Nov. 24, 2020, 11 pgs.
International Search Report and Written Opinion for International Application No. PCT/US2008/084068, Completed Jan. 13, 2009, dated Feb. 2, 2009, 6 pgs.
International Search Report and Written Opinion for International Application No. PCT/US2017/036897, Search completed Jan. 31, 2018, dated Feb. 21, 2018, pgs.
International Search Report and Written Opinion for International Application No. PCT/US2017/048469, Search completed Apr. 20, 2018, dated May 4, 2018, 9 pgs.
International Search Report and Written Opinion for International Application No. PCT/US2018/031204, Search completed Jun. 29, 2018, dated Jul. 23, 2018, 14 pgs.
Partial European Search Report for European Application No. 19744012.6, Search completed Sep. 2021, dated Sep. 15, 2021, 12 pgs.
"These Tiny, Incredible 'Metalenses' are the Next Giant Leap in Optics", PetaPixel, Jun. 3, 2016, 21 pgs.
Arbabi et al., "Dielectric Metasurfaces for Complete Control of Phase and Polarization with Subwavelength Spatial Resolution and High Transmission", Nature Nanotechnology, Aug. 31, 2015, 27 pgs., doi: 10.1038/nnano.2015.186.
Arbabi et al., "Miniature Optical Planar Camera Based on a Wide-Angle Metasurface Doublet Corrected for Monochromatic Aberrations", Nature Communications, Nov. 28, 2016, vol. 7, Article No. 13682, 9 pgs., doi:10.1038/ncomms13682.
Azadegan et al., "A novel approach for miniaturization of slot antennas", IEEE Transactions on Antennas and Propagation, Mar. 2003, vol. 51, No. 3, pp. 421-429, doi: 10.1109/TAP.2003.809853.
Blanchard et al., "Modeling nanoscale, V-shaped antennas for the design of optical phased arrays", Physical Review, Apr. 30, 2012, vol. B 85, pp. 155457-1-55457-11, DOI: 10.1103/physRevB.85.155457.
Campione et al., "Tailoring dielectric resonator geometries for directional scattering and Huygens' metasurface", Optics Express, Feb. 9, 2015, vol. 23, Issue 3, published online Jan. 28, 2015, pp. 2293-2307, arXiv:1410.2315, DOI: 10.1364/OE.23.002293.
Chen et al., "High-Efficiency Broadband Meta-Hologram with Polarization-Controlled Dual Images", Nano Letters, 2014, vol. 14, No. 1, published online Dec. 13, 2013, pp. 225-230, https://doi.org.10.1021/nl403811d.
Chen et al., "Integrated Plasmonic Metasurfaces for Spectropolarimetry", Nanotechnology, Institute of Physics Publishing, Apr. 26, 2016, vol. 27, No. 22, 7 pgs., doi: 10.1088/0957-4484/27/22/224002.
Chen et al., "Phase and dispersion engineering of metalenses: broadband achromatic focusing and imaging in the visible", Nov. 26, 2017. Cornell University, [retrieved on Apr. 11, 2019). Retrieved from the Internet: <URL:https://arxiv.org/abs/1711.09343v1 >. entire document.
Chou et al., "Imprint lithography with 25-nanometer resolution", Science, Apr. 5, 1996, vol. 272, Issue 5258, pp. 85-87.
Dayal et al., "Polarization control of 0.85μm vertical-cavity surface-emitting lasers integrated with gold nanorod arrays", Applied Physics Letters, 2007, vol. 91, pp. 111107-1-111107-3, published online Sep. 12, 2007, DOI: 10.1063/1.2783281.
Decker et al., "High-efficiency light-wave control with all-dielectric optical Huygens' metasurfaces", Advanced Optical Materials, arXiv: 1405.5038, May 2014, pp. 813-820, doi: 10.1002/adom.201400584.
Ding et al., "Gradient Metasurfaces: Fundamentals and Applications", arXiv:1704:03032v1 [physics.optics], Apr. 10, 2017, 83 pgs.
Evlyukhin et al., "Optical response features of Si-nanoparticle arrays", Physical Review B, 2010, vol. 82, 045404-1-045404-11, DOI: 10.1103/PhysRevB.82.045404.
Hidber et al., "Microcontact printing of Palladium colloids: micron-scale patterning by electroless deposition of copper", 1996, Langmuir, The ACS Journal of Surfaces and Colloids, vol. 12, pp. 1375-1380.
Extended European Search Report for European Application No. 17779772.7, Search completed Oct. 15, 2019, dated Oct. 25, 2019, 10 Pgs.
Extended European Search Report for European Application No. 16869282.0, Search completed Nov. 8, 2019, dated Nov. 20, 2019, 15 Pgs.
International Preliminary Report on Patentability for International Application PCT/US2018/049276, Report dated Mar. 3, 2020, dated Mar. 12, 2020, 8 Pgs.
International Preliminary Report on Patentability for International Application No. PCT/US2018/038357, Report dated Dec. 24, 2019, dated Jan. 2, 2020, 6 Pgs.
International Preliminary Report on Patentability for International Application No. PCT/US2012/053434, Report dated Mar. 4, 2014, dated Mar. 13, 2014, 6 Pgs.
International Preliminary Report on Patentability for International Application No. PCT/US2015/064930, Report dated Jun. 13, 2017, dated Jun. 22, 2017, 8 Pgs.
International Preliminary Report on Patentability for International Application No. PCT/US2016/063617, Report dated May 29, 2018, dated Jun. 7, 2018, 6 Pgs.
International Preliminary Report on Patentability for International Application No. PCT/US2017/026206, Report dated Oct. 9, 2018, dated Oct. 18, 2018, 8 Pgs.
International Preliminary Report on Patentability for International Application No. PCT/US2018/035502, Report dated Dec. 3, 2019, dated Dec. 12, 2019, 7 Pgs.
International Preliminary Report on Patentability for International Application No. PCT/US2018/046947, dated Feb. 18, 2020, dated Feb. 27, 2020, 6 Pgs.
International Preliminary Report on Patentability for International Application PCT/US2016/052685, Report dated Mar. 27, 2018, dated Apr. 5, 2018, 8 Pgs.
International Preliminary Report on Patentability for International Application PCT/US2018/034460, Report dated Nov. 26, 2019, dated Dec. 5, 2019, 6 Pgs.

(56) References Cited

OTHER PUBLICATIONS

International Search Report and Written Opinion for International Application No. PCT/US2012/053434, Search completed Oct. 17, 2012, dated Dec. 17, 2012, 7 Pgs.
International Search Report and Written Opinion for International Application No. PCT/US2015/064930, Search completed Sep. 9, 2016, dated Sep. 20, 2016, 11 Pgs.
International Search Report and Written Opinion for International Application No. PCT/US2016/052685, Search completed Nov. 30, 2016, dated Dec. 9, 2016, 12 Pgs.
International Search Report and Written Opinion for International Application No. PCT/US2016/063617, Search completed Jan. 19, 2017, dated Mar. 31, 2017, 9 Pgs.
International Search Report and Written Opinion for International Application No. PCT/US2017/026206, Search completed Jun. 10, 2017, dated Jun. 28, 2017, 11 Pgs.
International Search Report and Written Opinion for International Application No. PCT/US2018/034460, Search completed Jul. 29, 2018, dated Aug. 24, 2018, 10 Pgs.
International Search Report and Written Opinion for International Application No. PCT/US2018/035502, Search completed Jul. 31, 2018, dated Aug. 24, 2018, 13 Pgs.
International Search Report and Written Opinion for International Application No. PCT/US2018/038357, Search completed Apr. 9, 2019, dated May 13, 2019, 12 Pgs.
International Search Report and Written Opinion for International Application No. PCT/US2018/046947, Search completed Oct. 14, 2019, dated Oct. 25, 2019, 10 Pgs.
International Search Report and Written Opinion for International Application No. PCT/US2018/049276, Search completed Oct. 26, 2018, dated Jan. 15, 2019, 12 Pgs.
Office Action for Chinese Patent Application No. 201680077924.9, dated Aug. 30, 2019, 10 pgs.
Office Action for Chinese Patent Application No. 201780031669.9, dated Mar. 4, 2020, 29 pgs.
Search Report and Written Opinion for International Application No. 11201808772W, Search completed Jan. 20, 2020, dated Jan. 28, 2020, 12 Pgs.
Search Report for Chinese Patent Application No. 201680077924.9, dated Aug. 30, 2019, 10 Pages.
Search Report for Chinese Patent Application No. 201780031669.9, dated Mar. 4, 2020, 29 Pages.
Supplementary Partial European Search Report for European Application No. 16869282.0, Search completed Jun. 19, 2019, dated Jul. 2, 2019, 12 Pgs.
"Materials for High and Low Refractive Index Coatings", Sigma-Aldrich tech. www.sigmaaldrich.com/materials-science/organic-electronics/ri-coatings.html (3 pages).
Aieta et al., "Aberration-Free Ultrathin Flat Lenses and Axicons at Telecom Wavelengths Based on Plasmonic Metasurfaces", Nano Lett., Web publication date Aug. 15, 2012, vol. 12, No. 9, pp. 4932-4936.
Aieta et al., "Aberrations of flat lenses and aplanatic metasurfaces", Optics Express, Dec. 16, 2013, vol. 21, No. 25, pp. 31530-31539, doi: 10.1364/oe.21.031530.
Aieta et al., "Multiwavelength Achromatic Metasurfaces by Dispersive Phase Compensation", Sciences, Harvard University, Cambridge, MA 02138, USA, Mar. 20, 2015, vol. 347, No. 6228, pp. 1342-1345, doi: 10.1126/science.aaa2494.
Aieta et al., "Out-of-Plane Reflection and Refraction of Light by Anisotropic Optical Antenna Metasurfaces with Phase Discontinuities", Nano Letters, Feb. 15, 2012, vol. 12, No. 3, pp. 1702-1706, doi: 10.1021/nl300204s.
Arbabi et al., "Subwavelength-thick lenses with high numerical apertures and large efficiency based on high-contrast transmitarrays", Nature Communications, May 5, 2015, vol. 6, pp. 7069, doi:10.1038/ncomms8069.
Buralli et al., "Optical Performance of Holographic Kinoforms", Applied Optics, Mar. 1, 1989, vol. 28, No. 5, pp. 976-983, doi: 10.1364/AO.28.000976.

Byrnes et al., "Designing Large, High-Efficiency, High-Numerical-Aperture, Transmissive Meta-Lenses for Visible Light", Optics Express, Mar. 7, 2016, vol. 24, No. 5, pp. 5110-5124.
Chen et al., "A broadband achromatic metalens for focusing and imaging in the visible", Nature Nanotechnology, Jan. 1, 2018, vol. 13, pp. 220-226, doi: 10.1038/d41565-017-0034-6.
Chen et al., "A review of metasurfaces: physics and applications", Reports on Progress in Physics, Jun. 16, 2016, vol. 79, 076401, 40 pgs., doi: 10.1088/0034-4885/79/7/076401.
Chen et al., "Dual-polarity plasmonic metalens for visible light", Nature Communications, Nov. 13, 2012, vol. 3, No. 1198, pp. 1-6, DOI 10.10388/ncomms2207.
Chen et al., "Immersion Meta-Lenses at Visible Wavelengths for Nanoscale Imaging", Nano Letters, Apr. 7, 2017, vol. 17, No. 5, pp. 3188-3194, doi: 10.1021/acs.nanolett.7b00717.
Devlin et al., "Arbitrary spin-to-orbital angular momentum conversion of light", Science, Nov. 17, 2017, vol. 358, pp. 896-901.
Devlin et al., "Broadband high-efficiency dielectric metasurfaces for the visible spectrum", Proceedings of the National Academy of Sciences of USA, Sep. 20, 2016, vol. 113, No. 38, pp. 10473-10478, doi: 10.1073/pnas.1611740113.
Devlin et al., "High Efficiency Dielectric Metasurfaces at Visible Wavelengths", Retrieved from the Internet: URL: https://arxiv.org/ftp/arxiv/papers/1603/1603.02735.pdf, Mar. 8, 2016, 18 pgs.
Dong et al., "Zero-index photonic crystal as low-aberration optical lens (Conference Presentation)", Proc. SPIE 9918, Metamaterials, Metadevices, and Metasystems, Nov. 9, 2016, 991822, available at https://doi.org/10.1117/12.2237137, 1 pg.
Fattal et al., "Flat dielectric grating reflectors with focusing abilities", Nature Photonics, May 2, 2010, vol. 4, No. 7, XP055162682, doi: 10.1038/nphoton.2010.116.
Genevet et al., "Breakthroughs in Photonics 2013: Flat Optics: Wavefronts Control with Huygens' Interfaces", IEEE Photonics Journal, Apr. 1, 2014, vol. 6, No. 2, pp. 1-4, XP011546594, doi: 10.1109/jphot.2014.2308194.
Genevet et al., "Recent advances in planar optics: from plasmonic to dielectric metasurfaces", Optica, Jan. 19, 2017, vol. 4, No. 1, doi: 10.1364/OPTICA.4.000139.
Goldberg, "Genetic Algorithms in Search, Optimization, and Machine Learning", Addison-Wesley, 1989, 432 pgs., (presented in two parts).
Groever et al., "Meta-Lens Doublet in the Visible Region", Nano Letters, Jun. 29, 2017, vol. 17, No. 8, pp. 4902-4907, doi: 10.1021/acs.nanolett.7b01888.
Hartwig et al., "Challenges for Reducing the Size of Laser Activated Remote Phosphor Light Engines for DLP Projection", Proceedings of SPIE, International Optical Design Conference, Dec. 17, 2014, vol. 9293, pp. 929313-1 to 929313-6, doi: 10.1117/12.2073275, ISBN: 978-1-62841-730-2.
Jin et al., "Waveforms for Optimal Sub-keV High-Order Harmonics with Synthesized Two- or Three-Colour Laser Fields", Nature Communications, May 30, 2014, vol. 5, No. 4003, pp. 1-6.
Khorasaninejad et al., "Visible Wavelength Planar Metalenses Based on Titanium Dioxide", IEEE Journal of Selected Topics in Quantum Electronics, May/Jun. 2017, vol. 23, No. 3, pp. 43-58.
Khorasaninejad et al., "Achromatic Metalens over 60 nm Bandwidth in the Visible and Metalens with Reverse Chromatic Dispersion", Nano Letters, Jan. 26, 2017, vol. 17, No. 3, pp. 1819-1824, doi: 10.1021/acs.nanolett.6b05137.
Khorasaninejad et al., "Achromatic Metasurface Lens at Telecommunication Wavelengths", Nanno Letters, Jul. 13, 2015, vol. 15, No. 8, pp. 5358-5362, doi: 10.1021/acs.nanolett.5b01727.
Khorasaninejad et al., "Broadband Multifunctional Efficient Meta-Gratings Based on Dielectric Waveguide Phase Shifters", Nano Letters, Sep. 15, 2015, vol. 15, No. 10, pp. 6709-6715, doi: 10.1021/acs.nanolett.5b02524.
Khorasaninejad et al., "Metalenses at Visible Wavelengths: Diffraction-Limited Focusing and Subwavelength Resolution Imaging", Science, Jun. 3, 2016, vol. 352, No. 6290, pp. 1190-1194, doi: 10.1126/science.aaf6644.
Khorasaninejad et al., "Multispectral Chiral Imaging with a Metalens", Nano Letters, Jun. 7, 2016, vol. 16, pp. 4595-4600, doi: 10.1021/acs.nanolett.6b01897.

(56) References Cited

OTHER PUBLICATIONS

Khorasaninejad et al., "Planar Lenses at Visible Wavelengths", Arxiv, May 7, 2016, 17 pages.
Khorasaninejad et al., "Polarization-Insensitive Metalenses at Visible Wavelengths", Nano Letters, Oct. 24, 2016, vol. 16, No. 11, pp. 7229-7234, doi: 10.1021/acs.nanolett.6b03626.
Khorasaninejad et al., "Super-Dispersive Off-Axis Meta-Lenses for Compact High Resolution Spectroscopy", Nano Letters, Apr. 27, 2016, vol. 16, No. 6, pp. 3732-3737, doi: 10.1021/acs.nanolett.6b01097.
Li et al., "Achromatic Flat Optical Components via Compensation between Structure and Material Dispersions.", Scientific Reports, 2016, vol. 6, No. 19885, 7 pgs., DOI:10.1038/srep19885.
Lo et al., "New Architecture for Space Telescopes Uses Fresnel Lenses", SPIE Newsroom, Aug. 9, 2006, 2 pgs., doi: 10.1117/2.1200608.0333.
Lu et al., "Planar high-numerical-aperture low-loss focusing reflectors and lenses using subwavelength high contrast gratings", Optics Express, Jun. 7, 2010, vol. 18, No. 12, pp. 12606-12614, doi: 10.1364/OE.18.012606.
Mao et al., "Nanopatterning Using a Simple Bi-Layer Lift-Off Process for the Fabrication of a Photonic Crystal Nanostructure", Nanotechnology, Feb. 1, 2013, vol. 24, No. 8, 6 pgs., doi: 10.1088/0957-4484/24/8/085302.
Mao et al., "Surface Patterning of Nonscattering Phosphors for Light Extraction", Optics Letters, Aug. 1, 2013, vol. 38, No. 15, pp. 2796-2799, doi: 10.1364/OL.38.002796.
Miyazaki et al., "Ultraviolet-Nanoimprinted Packaged Metasurface Thermal Emitters for Infrared CO2 Sensing", Science and Technology of Advanced Materials, Published May 20, 2015, vol. 16, No. 3, 5 Pgs., doi: 10.1088/1468-6996/16/3/035005.
Mueller et al., "Metasurface Polarization Optics: Independent Phase Control of Arbitrary Orthogonal States of Polarization", Physical Review Letters, Mar. 17, 2017, vol. 118, 113901, 5 pgs.
Pacheco-Peña et al., "Epsilon-near-zero metalenses operating in the visible", Optics & Laser Technology, Jan. 19, 2016, 80, pp. 162-168.
Saeidi et al., "Wideband plasmonic focusing metasurfaces", Applied Physics Letters, Aug. 2014, vol. 105, pp. 053107-1-053107-4, http://dx.doi.org/10.1063/1.4892560.
Sales et al., "Diffractive-Refractive Behavior of Kinoform Lenses", Applied Optics, Jan. 1, 1997, vol. 36, pp. 253-257, No. 1, doi: 10.1364/AO.36.000253.
She et al., "Large area metalenses: design, characterization, and mass manufacturing", Optics Express, Jan. 22, 2018, vol. 26, No. 2, pp. 1573-1585, doi: 10.1364/OE.26.001573.
Vo et al., "Sub-wavelength grating lenses with a twist", IEEE Photonics Technology Letters, Jul. 1, 2014, vol. 26, No. 13, pp. 1375-1378, DOI: 10.1109/LPT.2014.2325947.
Wu et al., "Spectrally selective chiral silicon metasurfaces based on infrared Fano resonances", Nature Communications, 2014, vol. 5, No. 3892, pp. 1-32, published online May 27, 2014.
Wu et al., "Spectrally selective chiral silicon metasurfaces based on infrared Fano resonances", Nature Communications, May 27, 2014, vol. 5, No. 3892, pp. 1-9, doi:10.1038/ncomms4892.
Yao et al., "Wide Wavelength Tuning of Optical Antennas on Graphene with Nanosecond Response Time", Nano Letters, 2014, First Published Dec. 3, 2013, vol. 14, No. 1, pp. 214-219, doi: 10.1021/nl403751p.
Yu et al., "A Broadband, Background-Free Quarter-Wave Plate Based on Plasmonic Metasurfaces", Nano Letters, Nov. 3, 2012, vol. 12, No. 12, pp. 6328-6333, dx.doi.org/10.1021/nl303445u.
Yu et al., "Flat optics with designer metasurfaces", Nature Materials, Feb. 2014, vol. 13, pp. 139-150, published online Jan. 23, 2014, DOI:10.1038/NMAT3839.
Yu et al., "Flat optics: Controlling wavefronts with optical antenna metasurfaces", IEEE Journal of Selected Topics, 2013, vol. 19, No. 3, 23 pgs.

Yu et al., "Light Propagation with Phase Discontinuities: Generalized Laws of Reflection and Refraction", Science, Oct. 21, 2011, vol. 334, No. 6054, pp. 333-337, doi: 10.1126/science.1210713.
Zhu et al., "Ultra-compact visible chiral spectrometer with meta-lenses", APL Photonics, Feb. 7, 2017, vol. 2, pp. 036103-1-036103-12, 13 pgs., doi: 10.1063/1.4974259.
International Preliminary Report on Patentability for International Application PCT/US2020/028159, Report dated Sep. 28, 2021, dated Oct. 28, 2021, 6 Pgs.
International Search Report and Written Opinion for International Application No. PCT/US2020/028159, Search completed Jun. 15, 2020, dated Aug. 11, 2020, 07 Pgs.
Chen et al., "Broadband Achromatic Metasurface-Refractive Optics", Nano Lett. 2018, vol. 18, 7801-7808.
Engelberg et al., "Near-IR Wide Field-of-View Huygens Metalens for Outdoor Imaging Applications", CLEO, 2019, 2 pgs.
Li et al., "Dispersion controlling meta-lens at visible frequency", Optics Express, 2017, vol. 25, Issue 18, pp. 21419-21427.
Wang et al., "Broadband achromatic optical metasurface devices", Nature Communications, Aug. 4, 2017, vol. 8, No. 187, 9 pgs., DOI: 10.1038/s41467-017-00166-7.
Zhou et al., "Characteristic Analysis of Compact Spectrometer Based on Off-Axis Meta-Lens", Applied Sciences, 2018, vol. 8, vol. 321, doi:10.3390/app8030321, 11 pgs.
Zou et al., "Dielectric resonator nanoantennas at visible frequencies", Optics Express, Jan. 14, 2013, vol. 21, No. 1, pp. 1344-1352, published online Jan. 11, 2013.
Kats et al., "Giant birefringence in optical antenna arrays with widely tailorable optical anisotropy", PNAS, Jul. 31, 2012, vol. 109, No. 31, pp. 12364-12368, www.pnas.org/dgi/doi/10.1073/pnas.1210686109.
Khorasaninejad et al., "Broadband and chiral binary dielectric meta-holograms", Science Advances, May 13, 2016, vol. 2, No. 5, 6 pgs., doi:10.1126/sciadv.1501258.
Khorasaninejad et al., "Silicon Nanofin Grating as a Miniature Chirality-Distinguishing Beam-Splitter", Nature Communications, Nov. 12, 2014, vol. 5, No. 5386, pp. 1-6, doi: 10.1038/ncomms6386.
Kildishev et al., "Planar Photonics with Metasurfaces", Science, Mar. 15, 2013, vol. 339, No. 6125, pp. 1232009-1-1232009-6.
Kokkoris et al., "Nanoscale Roughness Effects at the Interface of Lithography and Plasma Etching: Modeling of Line-Edge-Roughness Transfer During Plasma Etching", IEEE Transactions on Plasma Science, Sep. 2009, vol. 37, No. 9, pp. 1705-1714, DOI:10.1109/TPS.2009.2024117.
Kominami et al., "Dipole and Slot Elements and Arrays on Semi-Infinite Substrates", IEEE Transactions on Antennas and Propagation, Jun. 1985, vol. AP33, No. 6, pp. 600-607.
Krasnok et al., "All-dielectric optical nanoantennas", Optics Express, Aug. 23, 2012, vol. 20, No. 18, pp. 20599-20604.
Kress et al., "Applied Digital Optics from Micro-Optics to Nanophotonics", Applied Digital Optics, 2009, Wiley, 30 pgs.
Lalanne et al., "Interaction between optical nano-objects at metallo-dielectric interfaces", Nature Physics, Aug. 2006, vol. 2. pp. 551-556, doi:10.1038/nphys364.
Leveque et al., "Transient behavior of surface plasmon polaritons scattered at a subwavelength groove", Physical Reviews B, 76, Oct. 18, 2007, pp. 155418-1-155418-8, DOI: 10.1103/PhysRevB.76.155418.
Lezec et al., "Beaming Light from a Subwavelength Aperture", Science Express, Aug. 2, 2002, vol. 297, pp. 820-822, doi:10.1126/science.1071895.
Li et al., "Flat metasurfaces to focus electromagnetic waves in reflection geometry", Optics Letters, 2012, vol. 37, No. 23, pp. 4940-4942.
Lin et al., "Dielectric gradient metasurface optical elements", Science, Jul. 18, 2014, vol. 345, Issue 6194, pp. 298-302, DOI: 10.1126/science.1253213.
Liu et al., "Realization of polarization evolution on higher-order Poincare sphere with metasurface", Applied Physics Letters, 2014, vol. 104, pp. 191110-1-191101-4, http://dx.doi.org/10.1063/1.4878409.
Luk et al., "Dielectric Resonator Antennas", Research Studies Press LTD, Hertfordshire, 2003, 404 pgs. (presented in two parts).

(56) References Cited

OTHER PUBLICATIONS

Maguid et al., "Multifunctional Interleaved Geometric-Phase Dielectric Metasurfaces", Nature Light Science & Applications, 2017, vol. 6, E17027, 7 pgs., published online Aug. 11, 2017, DOI: 10.1038/lsa.2017.27.

Mártin-Moreno, "Theory of highly directional emission from a single sub-wavelength aperture surrounded by surface corrugations", Physical Review Letters, Apr. 25, 2003, vol. 90, No. 16, 167401, pp. 167401-1-167401-4, published online Apr. 23, 2003, doi:10.1103/PhysRevLett.9.167401.

Mcleod, "Thin-Film Optical Filters", Adam Hilger, 1986, 667 pgs. (presented in four parts).

Monticone et al., "Full Control of Nanoscale Optical Transmission with a Composite Metascreen", Physical Review Letters, May 17, 2013, vol. 110, pp. 203903-1-203903-.5, DOI: 10.1103/PhysRevLett.110.203903.

Mueller et al., "Ultracompact Metasurface In-Line Polarimeter", Optica, Jan. 8, 2016, vol. 3, No. 1, pp. 42-47, hppt://dx.doi.org/10.1364/OPTICA.3.000042.

Ni et al., "Broadband Light Bending with Plasmonic Nanoantennas", Science, Jan. 27, 2012, vol. 335, Issue 6067, 3 pgs., published online Dec. 22, 2011, DOI: 10.1126/science.1214686.

Ni et al., "Ultra-thin, planar, Babinet-inverted plasmonic metalenses", Light Science & Applications, 2013, vol. 2, e72, pp. 1-6, published online Apr. 26, 2013, doi:10.1038/lsa.2013.28.

Okaya et al., "The Dielectric Microwave Resonator", Proceedings of the IRE, Oct. 1962, vol. 50, Issue 10, pp. 2081-2092, DOI: 10.1109/JRPROC.1962.288245.

Peinado et al., "Optimization and performance criteria of a Stokes polarimeter based on two variable retarders", Optics Express, Apr. 12, 2010, vol. 18, No. 8, pp. 9815-9530.

Petosa et al., "An Overview of Tuning Techniques for Frequency-Agile Antennas", IEEE Antennas and Propagation Magazine, Oct. 2012, vol. 52, pp. 5, pp. 271-296.

Pfeiffer et al., "Metamaterial Huygens' Surface: Tailoring Wave Fronts with Reflectionless Sheets", Physical Review Letters, May 10, 2013, vol. 110, pp. 197401-1-197401-5. DOI: 10.1103/PhysRevLett.110.197401.

Pors et al, "Broadband Focusing Flat Mirrors Based on Plasmonic Gradient Metasurfaces", Nano Letters, Jan. 23, 2013, vol. 13, No. 2, pp. 829-834, https://doi.org/10.1021/nl304761m.

Pors et al., "Plasmonic Metagratings for Simultaneous Determination of Strokes Parameters", Optica, Aug. 6, 2015, vol. 2, No. 8, pp. 716-723, http://dx.doi.org/10.1364/OPTICA.2.000716.

Reichelt et al., "Capabilities of diffractive optical elements for real-time holographic displays", Proceedings of SPIE, Feb. 2008, vol. 6912, pp. 69120-69130, pttp://dx.doi.org/10.1117/12.762887.

Rubin et al., "Polarization State Generation and Measurement with A Single Metasurface", Optics Express, Aug. 20, 2018, vol. 26, Issue No. 17, pp. 21455-21478.

Sancho-Parramon et al., "Optical characterization of HfO2 by spectroscopic ellipsometry: dispersion models and direct data inversion", Thin Solid Films, 2008, vol. 516, pp. 7990-7995, available online Apr. 10, 2008, doi:10.1016/j.tsf.2008.04.007.

Sun et al., "High-Efficiency Broadband anomalous Reflection by Gradient Meta-Surfaces", Nano Letters, 2012, vol. 12, No. 12, pp. 6223-6229, dx.doi.org/10.1021/nl3032668.

Voelz, "Computational Fourier Optics: A Matlab® Tutorial", (SPIE Press, 2011), pp. 89-111.

Walther et al., "Spatial and Spectral Light Shaping with Metamaterials", Advanced Materials, 2012, vol. 24, pp. 6300-6304, doi: 10.1002/adma.201202540.

Wang et al., "Generation of steep phase anisotropy with zero-backscattering by arrays of coupled dielectric nano-resonators", Applied Physics Letters, 2014, vol. 105, pp. 121112-1-121112-5, published online Sep. 25, 2014, https://doi.org/10.1063/1.4896631.

Wei et al., "Design of Ultracompact Polarimeters based on Dielectric Metasurfaces", Optics Letters, Apr. 11, 2017, vol. 42, No. 8, pp. 1580-1583, https://doi.org/10.1364/OL.42.001580.

Wu et al., "Spectrally selective chiral silicon metasurfaces based on infrared Fano resonances", Nature Communications, 2014, vol. 5, No. 3892, published online May 27, 2014, 9 pgs., DOI: 10.1038/ncomms4892.

Yang et al., "Design of ultrathin plasmonic quarter-wave plate based on period coupling", Optics Letters, 2013, vol. 38, No. 5, pp. 679-681, https://doi.org/10.1364/OL.38.000679.

Yu et al., "High-Transmission Dielectric Metasurface with $2\pi$ Phase Control at Visible Wavelengths", Laser & Photonics Reviews, Jun. 26, 2015, No. 4, pp. 412-418, DOI: 10.1002/lpor.201500041.

Yu et al., "Optical Metasurfaces and Prospect of their Applications Including Fiber Optics", Journal of Lightwave Technology, 2015, vol. 33, No. 12, pp. 2344-2358, DOI: 10.1109/JLT.2015.2404860.

Yu et al., "Quantum cascade lasers with integrated plasmonic antenna-array collimators", Optics Express, Nov. 24, 2008, vol. 16, No. 24, pp. 19447-19461, published online Nov. 10, 2008.

Yu et al., "Small divergence edge-emitting semiconductor lasers with two-dimensional plasmonic collimators", Applied Physics Letters, 2008, vol. 93, pp. 181101-1-181101-3, doi: 10.1063/1.3009599.

Yu et al., "Small-divergence semiconductor lasers by plasmonic collimation", Nature Photonics, Sep. 2008, vol. 2, pp. 564-570, doi: 10.1038/nphoton.2008.052.

Zhan et al., "Low-contrast dielectric metasurface optics", ACS Photonics 2016, vol. 3, pp. 209-214, DOI: 10.1 021/acsphotonics.5b00660.

Zhao et al., "Mie resonance-based dielectric metamaterials", Materials Today, Dec. 2009, vol. 12, No. 12, pp. 60-69.

Zhao et al., "Recent Advances on Optical Metasurfaces", Journal of Optics, Institute of Physics Publishing, 2014, vol. 16, Issue 12, 14 pgs., doi:10.1088/2040489781/16/12/123001.

Zhao et al., "Twisted Optical metamaterials or planarized ultrathin broadband circular polarizers", Nature Communications, 2012, vol. 3, No. 870, pp. 1-7, DOI: 10.1038/ncomms1877.

Zhou et al., "Characteristic Analysis of Compact Spectrometer Based on Off-Axis Meta-Lens", Applied Sciences, 2018, vol. 8, vol. 321, 11 pgs., doi:10.3390/app8030321.

Zhou et al., "Plasmonic holographic imaging with V-shaped nanoantenna array", Optics Express, Feb. 25, 2013, vol. 21, No. 4, pp. 4348-4354, published online Feb. 12, 2013.

Zou et al., "Dielectric resonator nanoantennas at visible frequencies", Optics Express, Jan. 14, 2013, vol. 21, No. 1, published online Jan. 11, 2013pp. 1344-1352.

Arbabi et al., "Efficient Dielectric Metasurface Collimating Lenses for Mid-Infrared Quantum Cascade Lasers", Optics Express, vol. 23, No. 26, Dec. 28, 2015, pp. 33310-33317, https://doi.org/10.1364/OE.23.033310.

Herrera-Fernandez et al., "Double Diffractive Optical Element System for Near-Field Shaping", Applied Optics, Aug. 10, 2011, vol. 50, Issue 23, pp. 4587-4593.

Hsiao et al., "Fundamentals and Applications of Metasurfaces", Small Methods, Mar. 24, 2017, 1, 1600064, 20 pgs.

Lee et al., "Giant Nonlinear Response from Plasmonic Metasurfaces Coupled to Intersubband Transitions", Nature, Jul. 3, 2014, vol. 511, 11 pgs.

Li et al., "All-Silicon Nanorod-Based Dammann Gratings", Optics Letters, Sep. 15, 2015, vol. 40, Issue 18, pp. 4285-4288.

Li et al., "Broadband Diodelike Asymmetric Transmission of Linearly Polarized Light in Ultrathin Hybrid Metamaterial", Applied Physics Letters, Nov. 19, 2014, 105, 201103; doi: 10.1063/1.4902162.

Mackus et al., "The Use of Atomic Layer Deposition in Advanced Nanopatterning", Nanoscale, Jul. 25, 2014, 6, 10941, 20 pgs.

Meng et al., "A Novel Nanofabrication Technique of Silicon-Based Nanostructures", Nanoscale Research Letters 11(1):504, 9pgs. DOI: 10.1186/S11671-016-1702-4.

Pfeiffer et al., "Cascaded Metasurfaces for Complete Phase and Polarization Control", Applied Physics Letters, vol. 102, Article 231116, 2013, 5 pgs., doi: 10.1063/1.4810873.

Schulz et al., "Quantifying the Impact of Proximity Error Correction on Plasmonic Metasurfaces", Optical Materials Express, published Nov. 10, 2015, vol. 5, Issue 12, pp. 2798-2803.

(56) References Cited

OTHER PUBLICATIONS

Song et al., "Vividly-Colored Silicon Metasurface Based on Collective Electric and Magnetic Resonances", 11th Conference on Lasers and Electro-Optics Pacific Rim, Jan. 11, 2016, 2 pgs.

Xu et al., "Metasurface External Cavity Laser", Applied Physics Letters, vol. 107, Article 221105, 2015, 6 pgs., doi: 10.1063/1.4936887.

* cited by examiner

FIG. 6
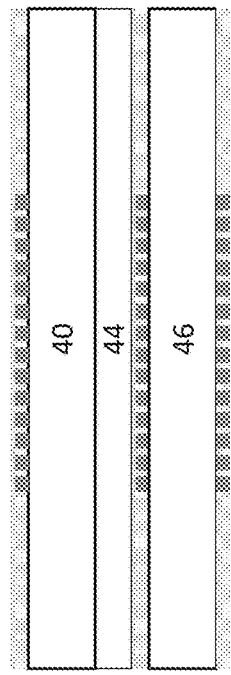
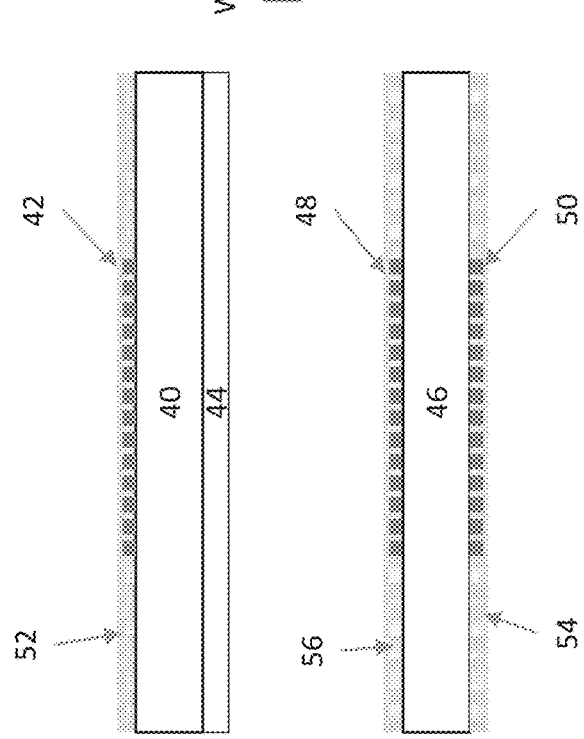

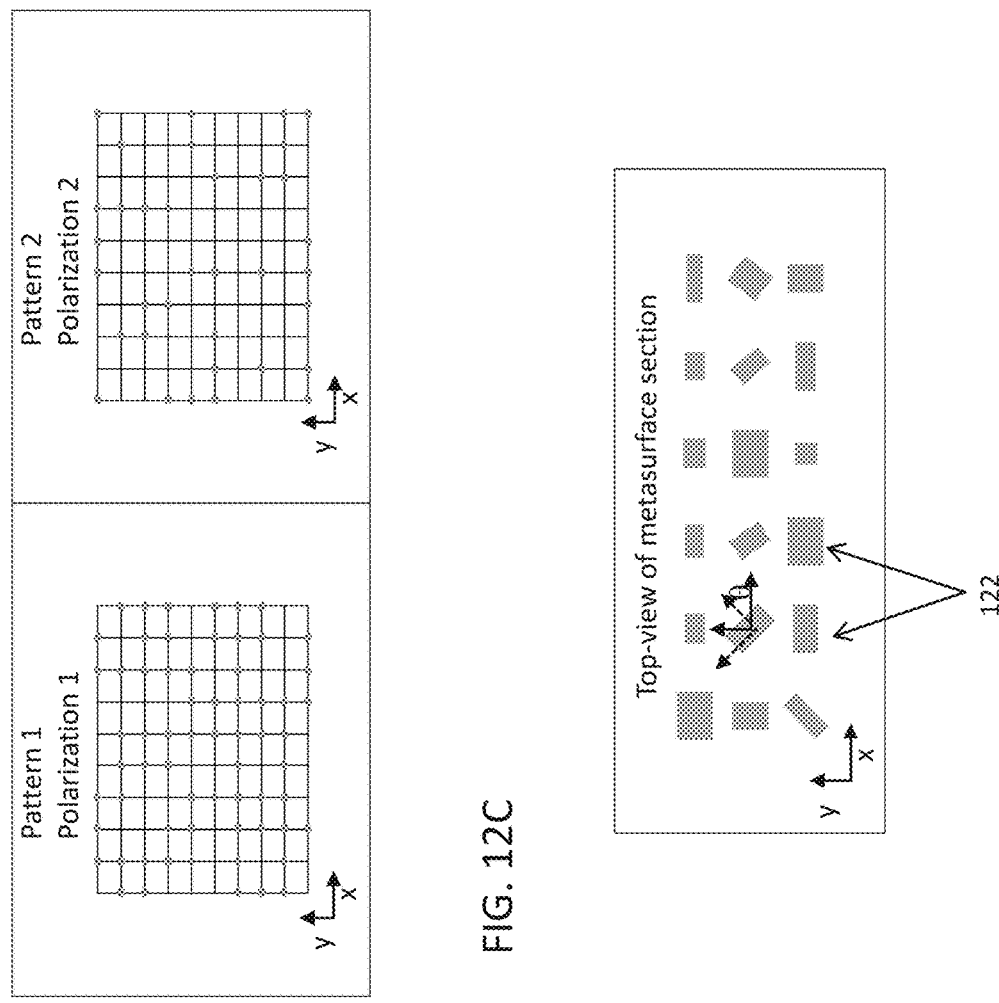
FIG. 12B
FIG. 12C
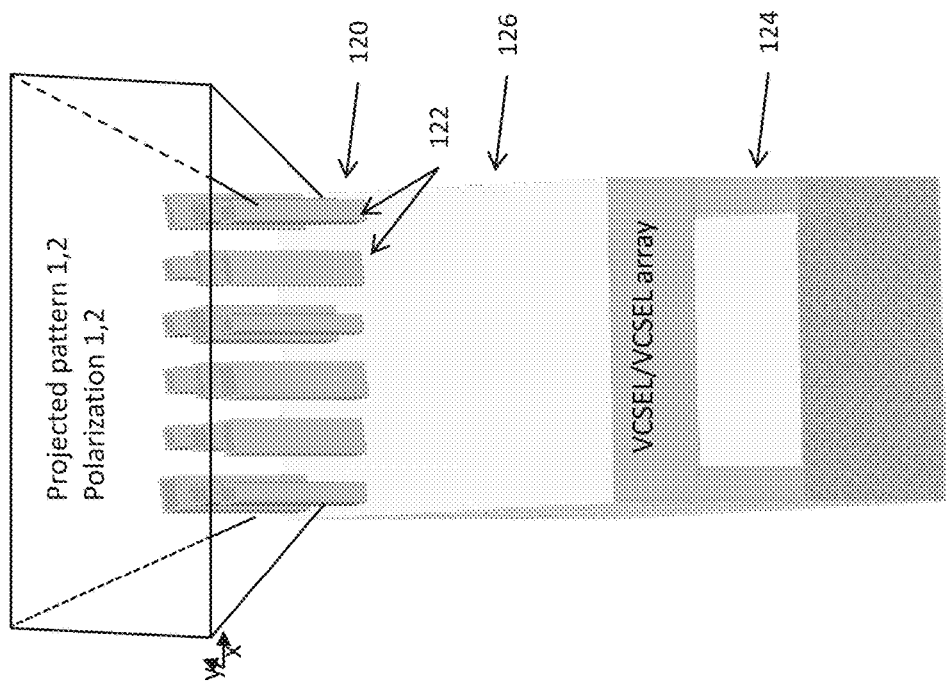
FIG. 12A

Image sensor

TRANSMISSIVE METASURFACE LENS INTEGRATION

CROSS-REFERENCE TO RELATED APPLICATIONS

The current application is a continuation of U.S. patent application Ser. No. 15/931,184, filed May 13, 2020, which is a continuation of U.S. patent application Ser. No. 16/120,174, filed Aug. 31, 2018, which application claims priority to U.S. Provisional Patent Application No. 62/552,455, filed Aug. 31, 2017, the disclosures of which are incorporated herein by reference.

FIELD OF THE INVENTION

The current disclosure is directed optical arrangements of metasurface elements, integrated systems incorporating light sources and/or detectors with such metasurace elements, and methods of the manufacture of such optical arrangements and integrated systems.

BACKGROUND OF THE INVENTION

Metasurface elements are diffractive optics in which individual waveguide elements have subwavelength spacing and have a planar profile. Metasurface elements have recently been developed for application in the UV-IR bands (300-10,000 nm). Compared to traditional refractive optics, metasurface elements abruptly introduce phase shifts onto light field. This enables metasurface elements to have thicknesses on the order of the wavelength of light at which they are designed to operate, whereas traditional refractive surfaces have thicknesses that are 10-100 times (or more) larger than the wavelength of light at which they are designed to operate. Additionally, metasurface elements have no variation in thickness in the constituent elements and thus are able to shape light without any curvature, as is required for refractive optics. Compared to traditional diffractive optical elements (DOEs), for example binary diffractive optics, metasurface elements have the ability to impart a range of phase shifts on an incident light field, at a minimum the metasurface elements can have phase shifts between $0-2\pi$ with at least 5 distinct values from that range, whereas binary DOEs are only able to impart two distinct values of phase shift and are often limited to phase shifts of either 0 or $1\pi$. Compared to multi-level DOE's, metasurface elements do not require height variation of its constituent elements along the optical axis, only the in-plane geometries of the metasurface element features vary.

BRIEF SUMMARY OF THE INVENTION

The application is directed to optical arrangements of metasurface elements, integrated systems incorporating light sources and/or detectors with such metasurace elements, and methods of the manufacture of such optical arrangements and integrated systems.

Many embodiments are directed to methods for fabricating one or more metasurface elements or systems including:
  depositing a hard mask material layer on at least one surface of a substrate, wherein the substrate is transparent to light over a specified operational bandwidth;
  depositing a pattern material layer on the hard mask material layer;
  patterning the pattern material to form an array pattern atop the hard mask layer, the array pattern comprising one of either a positive or negative reproduction of a metasurface feature array, the metasurface feature array comprising a plurality of metasurface features having feature sizes smaller than the wavelength of light within the specified operational bandwidth and configured to impose a phase shift on impinging light within the plane of plurality of metasurface features;
  etching the hard mask layer using an anisotropic etch process to form a plurality of voids and raised features corresponding to the array pattern in the hard mask; and
  removing any residual pattern material from atop the hard mask layer.

In many other embodiments, the substrate is formed of a material selected from the group consisting of: fused silica, sapphire, borosilicate glass and rare-earth oxide glasses.

In still many other embodiments, the hard mask material layer is formed of a material selected from the group consisting of: silicon, silicon nitride of various stoichiometries, silicon dioxide, titanium dioxide, alumina, and is disposed using a deposition process selected from the group consisting of: sputtering, chemical vapor deposition, and atomic layer deposition.

In yet many other embodiments, the pattern material layer is formed from one of either a photoresist patterned using a lithographic process, or a polymer patterned using a nanoimprint process.

In still yet many other embodiments, the array pattern is etched using a reactive ion etching process selected from the group consisting of: $SF_6$, $C_{12}$, $BCl_3$, $C_4F_8$ or any static or multiplexed mixture thereof.

In still yet many other embodiments, the residual pattern material is removes using a process selected form the group consisting of: chemical solvent, chemical etchant, and plasma etchant.

In still yet many other embodiments, the patterned hard mask material is a dielectric and forms the metasurface features of the metasurface element.

In still yet many other embodiments, the methods further includes:
  depositing a dielectric metasurface material layer on the patterned hard mask material layer such that the metasurface material layer fills the voids in the hard mask material layer and extends above the raised features of the hard mask material layer forming an over-layer of metasurface material atop the hard mask layer; and
  planarizing the over-layer such that the metasurface material layer and the hard mask layer terminate at a uniform height above the substrate.

In still yet many other embodiments, the metasurface material layer is formed from a material selected from silicon, silicon nitride of various stoichiometries, silicon dioxide, titanium dioxide, alumina, and is deposited using a conformal process selected from the group of: chemical vapor deposition, and atomic layer deposition.

In still yet many other embodiments, the planarization uses a process selected from an etch process selected from the group consisting of wet etch and a plasma etch, or a chemical-mechanical planarization technique.

In still yet many other embodiments, the metasurface material disposed in the voids forms the metasurface features of the metasurface element, and wherein the hard mask material is configured as an embedding material having a lower index of refraction at the specified operational bandwidth than the metasurface material.

In still yet many other embodiments, the hard mask material has negligible absorption over the specified operational bandwidth and has an index of refraction at the specified operational bandwidth between about 1 and about 2.4

In still yet many other embodiments, the method further includes removing the hard mask material layer using a selective etch such that the metasurface material layer disposed in the voids of the patterned hard mask remains on the surface of the substrate after removal of the hard mask material layer to form a plurality of isolated metasurface features separated by a plurality of air gaps.

In still yet many other embodiments, the method further includes depositing an embedding material layer on the isolated metasurface features such that the air gaps between the features are filled and such that the embedding material layer extends above the surface of the metasurface material layer, wherein the embedding material layer has a lower index of refraction at the specified operational bandwidth than the metasurface material.

In still yet many other embodiments, the embedding material is a polymer selected form the group consisting of poly(methyl methacrylate), SUB, and benzocyclobutene.

In still yet many other embodiments, the embedding material is a solid film selected from the group consisting of silicon dioxide, aluminum oxide, titanium dioxide, silicon nitride, hafnium oxide, zinc oxide, and spin-on-glass.

In still yet many other embodiments, the method further includes planarizing the embedding material layer such that the metasurface material layer and the embedding material layer terminate at a uniform height above the substrate.

In still yet many other embodiments, the method further includes depositing an anti-reflective coating atop one or both the embedding material layer and the side of the substrate disposed opposite the metasurface element.

In still yet many other embodiments, the antireflective coating is composed of alternating layers of any combination of materials selected from the group consisting of silicon dioxide, titanium dioxide, aluminum oxide, silicon nitride, aluminum nitride, and amorphous silicon, wherein each of the alternating layers has a thickness less than the wavelength of light within the operational bandwidth.

In still yet many other embodiments, the substrate is one of either disposed atop an illuminator or sensor, or is itself an illuminator or sensor.

In still yet many other embodiments, the substrate has a substrate thickness unsuitable for use with a target optical system at and further comprising at least one of the following:
  removing at least a portion of the backside of the substrate through one or both grinding or chemical etching; and
  aligning and fusing an additional substrate to the substrate of the metasurface element.

In still yet many other embodiments, the additional substrate itself has a metasurface element disposed on one surface thereof, and wherein the substrate and additional substrate are fused along surface opposite the surfaces on which the relative metasurface elements are disposed.

In still yet many other embodiments, the method of fusing uses a bonding process having a thermal budget below 600° C.

In still yet many other embodiments, the bonding process is a wafer bonding process using an adhesive selected from the group of an optical epoxy, benzocyclobutene, a UV cured polymer, SU8, and a plasma activate silicon dioxide film.

In still yet many other embodiments, the method further includes removing at least a portion of the backside of one or both of the substrates prior to fusing.

In still yet many other embodiments, the method further includes forming at least a first metasurface element on a first side of a first substrate, and forming at least a second metasurface element on a first side of a second substrate, and fusing the first and second substrates together along sides opposite the first sides of said substrates using a bonding process having a thermal budget below 600° C.

In still yet many other embodiments, the plurality of metasurface features are inhomogeneous.

In still yet many other embodiments, the plurality of metasurface features diverge from an ideal shape by a pre-determinable amount based on the dimensions of the metasurface features.

In still yet many other embodiments, the metasurface element is embedded and planarized and comprises two layers of metasurface features offset from each other by a distance smaller than or on the same order as the wavelength of light within the specified operational bandwidth such that the two layers of metasurface features operate in conjunction to impose a phase shift on impinging light.

In still yet many other embodiments, the plurality of metasurface features are inhomogeneous and diverge from an ideal shape by a pre-determinable amount based on the dimensions of the metasurface features, and wherein the ideal shape is a square, and where the ideal square has a side dimension of less than 200 nm the metasurface features are formed as circles, and where the ideal square has a side dimension of less than 300 nm the metasurface features are formed as squares having rounded edges.

In still yet many other embodiments, the method further includes:
  forming a plurality of identical or unique first metasurface elements;
  providing a plurality of identical or unique illumination sources disposed in a planar array and integrating at least one of the plurality of first metasurface elements with each of the plurality of illumination sources in the array such that light from each of said plurality of illumination sources passes through at least one of the first metasurface elements and an angular deflection is imposed thereby;
  disposing a first spacer layer between the planar array of illumination sources and the first metasurface elements, the first spacer layer being configured to create divergence in light emitted from each of the illumination sources of the planar array prior to impinging on the respective first metasurface element;
  disposing a second metasurface element at a distance from the plurality of first metasurface elements, the second metasurface element configured to imprint a far-field illumination pattern onto a light field formed by the emission of all of the plurality illumination sources; and
  disposing a second spacer layer between the first and second metasurface elements such that an offset distance is formed therebetween.

Various embodiments are directed to methods of forming a multi-metasurface element comprising forming at least a first metasurface element on a first side of a first substrate, and forming at least a second metasurface element on a first side of a second substrate, and fusing the first and second substrates together along sides opposite the first sides of said substrates using a bonding process having a thermal budget below 600° C.

In various other embodiments, the bonding process is a wafer bonding process using an adhesive selected from the group of an optical epoxy, benzocyclobutene, a UV cured polymer, SU8, and a plasma activate silicon dioxide film.

In still various other embodiments, the method further includes removing at least a portion of the backside of one or both of the substrates prior to fusing.

In yet various other embodiments the method further includes:
  embedding and planarizing at least one of the first and second metasurface elements;
  forming at least a third metasurface element on a first side of a third substrate; and
  fusing the side of the third substrate opposite the first side to the planarized first or second metasurface using a bonding process having a thermal budget below 600° C.

In still yet various other embodiments, the planarization further comprises embedding at least one of the first and second metasurface elements in one of either a polymer or a solid-state bonding agent.

In still yet various other embodiments, the method further includes iterating the steps of forming, embedding, and fusing to form a layered stack of four or more metasurface elements.

In still yet various other embodiments, at least one of layers of at one end of the layered stack is one of either an illuminator or a sensor.

In still yet various other embodiments, the method further includes:
  inserting a spacer substrate between the sides of the first and second substrates opposite the metasurface elements, the spacer substrate having at least one aperture disposed therethrough; and
  fusing the spacer substrate to the first and second substrates using a bonding process having a thermal budget below 600° C., such that the at least one aperture forms an air gap between the first and second substrates.

In still yet various other embodiments, the spacer substrate is formed of a low-index of refraction material selected from the group of: polymer, $SiO_2$, and glass.

In still yet various other embodiments, the spacer material is coated in black chrome.

In still yet various other embodiments, the method further includes iterating the steps of forming, inserting, and fusing to form a layered stack of three or more metasurface elements.

In still yet various other embodiments, at least one of layers at one end of the layered stack is one of either an illuminator or a sensor.

In still yet various other embodiments, the plurality of metasurface features are inhomogeneous.

In still yet various other embodiments, the plurality of metasurface features diverge from an ideal shape by a pre-determinable amount based on the dimensions of the metasurface features.

Further embodiments are directed to methods of forming a compound metasurface element comprising forming two layers of metasurface features atop a substrate, wherein the two layers are offset from each other by a distance smaller than or on the same order as the wavelength of light within the specified operational bandwidth such that the two layers of metasurface features operate in conjunction to impose a phase shift on impinging light.

Additional embodiment are directed to methods of forming a metasurface element including:
  forming a plurality of identical or unique first metasurface elements;
  providing a plurality of identical or unique illumination sources disposed in a planar array and integrating at least one of the plurality of first metasurface elements with each of the plurality of illumination sources in the array such that light from each of said plurality of illumination sources passes through at least one of the first metasurface elements and an angular deflection is imposed thereby;
  disposing a first spacer layer between the planar array of illumination sources and the first metasurface elements, the first spacer layer being configured to create divergence in light emitted from each of the illumination sources of the planar array prior to impinging on the respective first metasurface element,
  disposing a second metasurface element at a distance from the plurality of first metasurface elements, the second metasurface element configured to imprint a far-field illumination pattern onto a light field formed by the emission of all of the plurality illumination sources; and
  disposing a second spacer layer between the first and second metasurface elements such that an offset distance is formed therebetween.

In additional other embodiments, at least the first spacer layer comprises a solid-state material.

In additional other embodiments, at least the second spacer layer comprises an air gap.

In still additional other embodiments, the plurality of metasurface features are inhomogeneous.

In yet additional other embodiments, the plurality of metasurface features diverge from an ideal shape by a pre-determinable amount based on the dimensions of the metasurface features.

In still yet additional other embodiments, the method further includes:
  forming a plurality of identical or unique first metasurface elements;
  providing a plurality of identical or unique sensor elements disposed in a planar array and integrating at least one of the plurality of first metasurface elements with each of the plurality of sensor elements in the array such that light impinging on each of said plurality of sensor elements passes through at least one of the first metasurface elements and an angular deflection is imposed thereby;
  disposing a first spacer layer between the planar array of sensor elements and the first metasurface elements, the first spacer layer being configured to create convergence in light impinging on each of the first metasurface elements of prior to impinging on the respective sensor elements of the planar array;
  disposing a second metasurface element at a distance from the plurality of first metasurface elements, the second metasurface element configured to imprint a far-field illumination pattern onto a light field impinging thereon; and
  disposing a second spacer layer between the first and second metasurface elements such that an offset distance is formed therebetween.

Numerous other embodiments are directed to methods of forming a metasurface element including:
  forming a plurality of identical or unique first metasurface elements;
  providing a plurality of identical or unique sensor elements disposed in a planar array and integrating at least one of the plurality of first metasurface elements with each of the plurality of sensor elements in the array such that light impinging on each of said plurality of sensor elements passes through at least one of the first metasurface elements and an angular deflection is imposed thereby;

disposing a first spacer layer between the planar array of sensor elements and the first metasurface elements, the first spacer layer being configured to create convergence in light impinging on each of the first metasurface elements of prior to impinging on the respective sensor elements of the planar array;

disposing a second metasurface element at a distance from the plurality of first metasurface elements, the second metasurface element configured to imprint a far-field illumination pattern onto a light field impinging thereon; and disposing a second spacer layer between the first and second metasurface elements such that an offset distance is formed therebetween.

Several embodiments are directed to metasurface elements including:

an array of metasurface features disposed atop a substrate transparent to light over a specified operational bandwidth, the array comprising a plurality of metasurface features having feature sizes smaller than the wavelength of light within the specified operational bandwidth and configured to impose a phase shift on impinging light within the plane of plurality of metasurface features;

wherein the plurality of metasurface features are inhomogeneous, and diverge from an ideal shape by a pre-determinable amount based on the dimensions of the metasurface features.

In several other embodiments, the ideal shape is a square, and where the ideal square has a side dimension of less than 200 nm the metasurface features are formed as circles, and where the ideal square has a side dimension of less than 300 nm the metasurface features are formed as squares having rounded edges.

Many embodiments are directed to metasurface enabled illumination or sensor arrays including:

a plurality of identical or unique illumination sources or sensor elements, arranged in a planar array;

a first spacer layer disposed above the planar array of illumination sources and configured to create divergence in light emitted from each of the illumination sources of the planar array or convergences in light impinging on each of the sensor elements;

a plurality of identical or unique first metasurface elements disposed above the first spacer layer, at least one of the plurality of first metasurface elements being associated with each of the plurality of illumination sources or sensor elements in the array such that light emitted from each of the plurality of illumination source or impinging on each of said plurality of sensor elements passes through at least one of the first metasurface elements and an angular deflection is imposed thereby;

a second metasurface element disposed at a distance from the plurality of first metasurface elements, the second metasurface element configured to imprint a far-field illumination pattern onto a light field impinging thereon; and a second spacer layer between the first and second metasurface elements such that an offset distance is formed therebetween.

In many other embodiments, the plurality of metasurface features on each of the metasurface elements are inhomogeneous, and diverge from an ideal shape by a pre-determinable amount based on the dimensions of the metasurface features.

In still many other embodiments, the plurality of metasurface features on at least the first or second metasurface element are configured to have an asymmetric cross-section and are disposed at least two different angles of rotation such that the metasurface element is configured to imprint at least two patterns having orthogonal polarization and being linearly offset one from the other on the illumination sources or detect such patterns from the impinging light prior to illumination of the sensor elements, the array being configured such that three-dimensional information is obtained from a scene by the array in a single-shot.

In yet many other embodiments, the illumination sources are polarized or unpolarized, and selected from the group consisting of: VCSELs, solid-state laser, quantum cascade laser, LED, and superluminescent LED.

In still yet many other embodiments, the two patterns are unique.

In still yet many other embodiments, the two patterns have at least 50,000 combined points.

In still yet many other embodiments, at least a first pattern is configured to obtain a measurement of the foreground of the scene, and wherein at least a second pattern is configured to obtain a measurement of the background of the scene.

In still yet many other embodiments, the two patterns are diagonally polarized relative to the laser polarization.

In still yet many other embodiments, more than two patterns having more than two different polarizations are used.

Various embodiments are directed to metasurface element enabled sensors including:

at least one sensor element;

at least one first and at least one second metasurface element disposed at an offset distance above the at least one sensor element, and having a first spacing layer disposed therebetween;

wherein each of the at least one first and second metasurface elements comprise an array of metasurface features disposed atop at least one substrate transparent to light over a specified operational bandwidth, the array comprising a plurality of metasurface features having feature sizes smaller than the wavelength of light within the specified operational bandwidth and configured to impose a phase shift on impinging light within the plane of plurality of metasurface features; and wherein the arrays of metasurface features on each of the at least one first and second metasurface elements are configured to gather light of a specified operational bandwidth across a specified field of view and shift the incoming light such that it impinges the sensor element at a zero or near-zero degree critical ray angle.

In various other embodiments, the first spacing layer is one of either a solid-state spacer material or an air gap.

In still various other embodiments, the field of view is ±44 degrees.

In yet various other embodiments, the sensor further includes a narrow bandwidth optical filter disposed between the metasurface elements and the sensor element.

In still yet various other embodiments, the narrow bandwidth optical filter is comprised of alternating layers with a low index of refraction and high index of refraction selected from the group consisting of silicon dioxide, titanium dioxide, amorphous silicon, silicon nitride and aluminum oxide.

In still yet various other embodiments, the sensors further include a plurality of identical microlenses disposed between the metasurface elements and the sensor element.

In still yet various other embodiments, the at least one first metasurface element and at least one second metasurface elements are disposed on opposite sides of the same substrate, and wherein the substrate comprises the first spacing layer.

In still yet various other embodiments, the two metasurface elements on either side of the substrate have the same height.

In still yet various other embodiments, the two metasurface elements are formed from a film deposited simultaneously on the front surface and back surface of the same substrate using a conformal deposition process selected from the group of pressure chemical vapor deposition and atomic layer deposition.

In still yet various other embodiments, the at least one first metasurface element and at least one second metasurface elements are disposed facing inward toward each other on separate substrates separated by an air gap.

In still yet various other embodiments, the sensors further include an optical bandpass filter integrated into the outward facing surface of the substrate of the at least one second metasurface.

In still yet various other embodiments, the sensors further include at least third metasurface element disposed between the first and second metasurface elements and the CMOS sensor and configured to angularly diverge the path of the incoming light such that the light impinging on the CMOS sensor has a non-zero chief ray angle.

In still yet various other embodiments, the at least three metasurfaces are configured to minimize grid distortion to less than 5% over the specified field of view.

In still yet various other embodiments, the sensor element is a CMOS sensor.

Further embodiments are directed to a metasurface element enabled single platform imaging/sensing system including:
    at least one sensor element and at least one illumination source;
    at least one separate metasurface element disposed at an offset distance above each of the at least one sensor element and at least one illumination source, and having at least one spacing layer associated with each respectively;
    wherein each of the metasurface elements comprise an array of metasurface features disposed atop a substrate transparent to light over a specified operational bandwidth, the array comprising a plurality of metasurface features having feature sizes smaller than the wavelength of light within the specified operational bandwidth, and wherein the at least one illumination metasurface element disposed in association with the illumination source is configured to impose a radiation pattern on a light field emitted therefrom within the plane of plurality of metasurface features, and wherein the at least one sensor metasurface element disposed in association with the at least on sensor element is configured to detect the radiation pattern of the light field after the illumination of a scene.

In still further embodiments, the system further includes a plurality of separate metasurface elements and spacer layers associated with each of the illumination source and the sensor element.

In yet further embodiments, the metasurface elements associated with the illumination source imprint two orthogonal polarizations on the light field to produce at least two patterns having orthogonal polarization and being linearly offset one from the other on the light field illuminating the scene, and wherein the metasurface elements associated with the sensor element are configured to detect the at least two patterns such that three-dimensional information about the scene can be gathered.

Numerous embodiments are directed to methods for fabricating a metasurface element for imprinting a desired far-field intensity on an illumination source including:
    calculate an illumination source far field;
    calculate a target far field, wherein the target is a metasurface element;
    calculate a least-squares fit to the target far field to obtain a pseudo far field such that the convolution of the pseudo far field and the illumination source far field yields the target far field;
    set the initial metasurface feature array grid and phase to an initial condition;
    determine one or more objective cost functions and calculate a gradient function for each of the one or more cost functions for each of a plurality of pixels of the metasurface element;
    input a result from the one or more cost functions and the gradient function into an optimization algorithm;
    update the phases for each of the plurality of pixels of the metasurface element and repeat gradient calculation and optimization until the objective cost function converges; and
    output a calculated metasurface element phase profile.

In numerous other embodiments, the cost function is selected from the group consisting of: squared distance from target, nearest neighbor distance, squared error of the far field projection of the metasurface element under illumination, and smoothness of calculated far field.

In still numerous other embodiments, the optimization algorithm is one of either conjugate gradient or L-Broyden-Fletcher-Goldfarb-Shannon.

Several embodiments are also directed to methods of forming a metasurface element on a substrate comprising a plurality of metasurface features having feature sizes smaller than the wavelength of light within the specified operational bandwidth and configured to impose a phase shift on impinging light within the plane of plurality of metasurface features, wherein the substrate has a substrate thickness unsuitable for use with a target optical system at and further including at least one of the following:
    removing at least a portion of the backside of the substrate through one or both grinding or chemical etching; and
    aligning and fusing an additional substrate to the substrate of the metasurface element.

In several other embodiments, the additional substrate itself has a metasurface element disposed on one surface thereof, and wherein the substrate and additional substrate are fused along surface opposite the surfaces on which the relative metasurface elements are disposed.

In still several other embodiments, the method of fusing uses a bonding process having a thermal budget below 600° C.

In yet several other embodiments, the bonding process is a wafer bonding process using an adhesive selected from the group of an optical epoxy, benzocyclobutene, a UV cured polymer, SU8, and a plasma activate silicon dioxide film.

In still yet several other embodiments, the methods further include removing at least a portion of the backside of one or both of the substrates prior to fusing.

In still yet several other embodiments, the methods further include forming at least a first metasurface element on a first side of a first substrate, and forming at least a second metasurface element on a first side of a second substrate, and fusing the first and second substrates together along sides opposite the first sides of said substrates using a bonding process having a thermal budget below 600° C.

In still yet several other embodiments, the plurality of metasurface features are inhomogeneous.

In still yet several other embodiments, the plurality of metasurface features diverge from an ideal shape by a pre-determinable amount based on the dimensions of the metasurface features.

In still yet several other embodiments, the methods further include:
  embedding and planarizing at least one of the first and second metasurface elements;
  forming at least a third metasurface element on a first side of a third substrate; and
  fusing the side of the third substrate opposite the first side to the planarized first or second metasurface using a bonding process having a thermal budget below 600° C.

In still yet several other embodiments, the planarization further comprises embedding at least one of the first and second metasurface elements in one of either a polymer or a solid-state bonding agent.

In still yet several other embodiments, including iterating the steps of forming, embedding, and fusing to form a layered stack of four or more metasurface elements.

In still yet several other embodiments, at least one of layers of at one end of the layered stack is one of either an illuminator or a sensor.

In still yet several other embodiments, the methods further include:
  inserting a spacer substrate between the sides of the first and second substrates opposite the metasurface elements, the spacer substrate having at least one aperture disposed therethrough; and
  fusing the spacer substrate to the first and second substrates using a bonding process having a thermal budget below 600° C., such that the at least one aperture forms an air gap between the first and second substrates.

Numerous other embodiments are directed to a metasurface element including:
  an array of metasurface features disposed atop a substrate transparent to light over a specified operational bandwidth, the array comprising a plurality of metasurface features having feature sizes smaller than the wavelength of light within the specified operational bandwidth and configured to impose a phase shift on impinging light within the plane of plurality of metasurface features, and wherein the plurality of metasurface features are formed from one of the group consisting of:
  amorphous-Si metasurface features embedded in $SiO_2$ having a pillar height from 500 to 1000 nm and a pillar diameter from 100 to 300 nm;
  amorphous-Si metasurface features embedded in $SiO_2$ having a pillar height of 600 nm and a pillar diameter from 100 to 300 nm;
  amorphous-Si metasurface features having air gaps disposed therebetween and having a pillar height from 1 to 500 nm and a pillar diameter from 100 to 350 nm;
  amorphous-Si metasurface features having air gaps disposed therebetween and having a pillar height from 480 nm and a pillar diameter from 100 to 280 nm;
  $TiO_2$ metasurface features having air gaps disposed therebetween and having a pillar height from 300 to 1000 nm and a pillar diameter from 100 to 350 nm;
  $TiO_2$ metasurface features having air gaps disposed therebetween and having a pillar height of 975 nm and a pillar diameter from 100 to 300 nm;
  amorphous-Si metasurface features embedded in benzocyclobutane and having a pillar height of 590 nm and a pillar diameter from 100 to 300 nm;
  amorphous-Si metasurface features embedded in $SiO_2$ and having a pillar height of 600 nm and a pillar diameter from 100 to 275 nm;
  amorphous-Si metasurface features embedded in SU8 and having a pillar height of 675 nm and a pillar diameter from 100 to 300 nm; and
  amorphous-Si metasurface features in air and having a pillar height of 600 nm and a pillar diameter from 100 to 300 nm with an element spacing of 450 nm.

In numerous other embodiments where amorphous-Si is the material of choice, the amorphous Si may be hydrogenated resulting in higher optical transmission as compared to amorphous silicon where hydrogen is not present in the structures.

Additional embodiments and features are set forth in part in the description that follows, and in part will become apparent to those skilled in the art upon examination of the specification or may be learned by the practice of the disclosure. A further understanding of the nature and advantages of the present disclosure may be realized by reference to the remaining portions of the specification and the drawings, which forms a part of this disclosure.

BRIEF DESCRIPTION OF THE DRAWINGS

The description will be more fully understood with reference to the following figures, which are presented as exemplary embodiments of the invention and should not be construed as a complete recitation of the scope of the invention, wherein:

FIG. 6 provides a schematic illustrating the combination of multiple substrates having multiple metasurface elements in accordance with embodiments of the invention.

FIGS. 12A to 12C provide schematics illustrating a polarization splitting metasurface element producing two unique radiation patterns out of a VCSEL array in accordance with embodiments of the invention.

DETAILED DESCRIPTION OF THE INVENTION

Figure 1A:
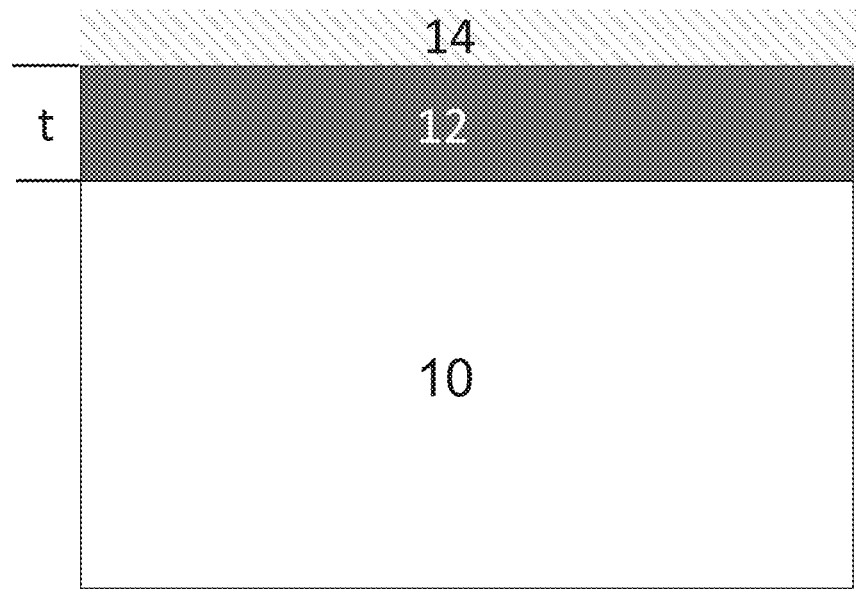
FIGS. 1A to 1G provides schematics illustrating a fabrication process for metasurface elements in accordance with embodiments of the invention.

Turning now to the drawings, metasurface elements, integrated systems incorporating such metasurface elements with light sources and/or detectors, and methods of the manufacture and operation of such optical arrangements and integrated systems are provided. Many embodiments are directed to systems and methods for integrating transmissive metasurface elements with other semiconductor devices or additional metasurface elements, and more particularly to the integration of such metasurfaces with substrates, illumination sources and sensors. In some embodiments, the metasurface elements may be used to shape output light from an illumination source or collect light reflected from a scene to form two unique patterns using the polarization of light. In such embodiments, shaped-emission and collection may be combined into a single co-designed probing and sensing optical system.

In many embodiments, metasurface elements may incorporate multi-layer metasurface elements comprising combinations of two or more metasurface optical elements. In various such embodiments the multi-layer metasurface elements may be free-standing (i.e., not directly integrated with a specific illuminator or sensor into a system). In some such embodiments, the optical system may consist of a single physical component or substrate having metasurface elements disposed on either side thereof. In some embodiments, multiple substrates having multiple metasurface elements may be combined to make more complex systems. In such embodiments, the thickness of the substrate may be determined by the requirements of the optical system, manufacturing constraints and the specific designs of the two metasurfaces. In various embodiments, the multi-layer metasurface elements may be formed by patterning each individual metasurface element on unique substrates and subsequently fusing the substrates together through a suitable technique, e.g., wafer bonding, optical adhesive. In general, however, in accordance with embodiments any number of metasurface elements may be combined through any number of steps using CMOS or related processes.

In many embodiment, the metasurface elements may be free standing or may be embedded within another material. In various such embodiments, the selection of the embedding material includes the appropriate selection of refractive index and absorption characteristics. In many such embodiments, the embedding material may provide mechanical stability and protection as well as an additional design degree of freedom that enables the metasurface to perform a desired optical function.

In various embodiments, the metasurface elements may be directly mounted or fabricated on an LED, VCSEL facet or each facet of a VCSEL in an array to minimize device thickness and optimize metasurface-illuminator/sensor alignment. In some such embodiments the resultant system can be used to convert a natural Lambertian or some arbitrary light distribution to a broad range and essentially arbitrary light distribution including, for example, a so-called top hat, a so-called bat-wing profiles, or any other desired structured light pattern.

In some embodiments, a spacing layer of a defined thickness (e.g., the working distance) may be deposited on the CMOS image sensor, LED, VCSEL, etc., to implement an optical distance appropriate for a desired camera design, illuminator design or optimal system performance. In various such embodiments, the spacing layer material may be organic or inorganic and may have a lower refractive index than the dielectric elements comprising the metasurface. In some such embodiments, the thickness of the spacing layer may be modified to provide appropriate optical spacing for the specific optical system.

Various embodiments are also directed to methods of fabricating metasurface elements. In some such embodiments, methods are directed to the manufacture of metasurface elements on a wafer incorporating other devices, such as sensors or illuminators, thereby avoiding, in some embodiments, expensive manufacturing processes, such as, for example, the mechanical assembly of small dimension elements, or the active alignment of optics with sensors. In some such embodiments, metasurface elements may be integrated with the sensor (or the illuminator) in a series of operations at a semiconductor fab. In many such embodiments a sequence may include: (i) sensor or illuminator, (ii) optional microlens array/collimator, optional filter, optional spacing layer, optional metasurface element(s), optional additional spacing layer, optional metasurface element(s), optional anti-reflection (AR) layer, optional protection layer. In many such embodiments a sequence of elements may include: (i) sensor or illuminator, (ii) optional microlens array/collimator, optional filter, optional spacing layer, optional metasurface element(s), optional additional spacing layer, optional metasurface element(s), optional anti-reflection (AR) layer, optional protection layer.

Embodiments for Manufacturing Metasurface Elements

Currently the manufacture of metasurface elements requires the use of specialized processes and systems that are incompatible with mass manufacturing limiting the implementation and adoption of such metasurface elements in CMOS devices. An exemplary description of a conventional process for forming metasurface elements can be found, for example, in U.S. Pat. No. 8,848,273, the disclosure of which is incorporated herein by reference. The capability to produce metasurfaces via standard semiconductor processes, would enable direct integration of metasurface optics with functional elements such as light emitting diodes (LEDs), vertical cavity surface emitting laser (VCSEL), complimentary metal-oxide-semiconductor (CMOS) image sensors, micro-electromechanical (MEMs) devices, etc., where direct integration means combination of a metasurface element and sensor/illuminator using unit processes identical or similar to those used to make the functional CMOS elements.

Accordingly, many embodiments are directed to methods for the fabrication of metasurface elements and systems, and more particularly to methods that are capable of being implemented within a conventional semiconductor foundry. In various embodiments, conventional processes adapted for the manufacture of metasurface elements may include photolithography, nanoimprinting, various chemical vapor deposition (CVD), atomic layer deposition (ALD) and physical vapor deposition (PVD) mass transfer processes, and chemical and plasma etching (and CMC), among others. Turning to the figures, an exemplary set of fabrication processes tailored for the manufacture of various aspects of embodiments of metasurface elements is presented in the schematic of FIGS. 1A to 1G.

Figure 1B:
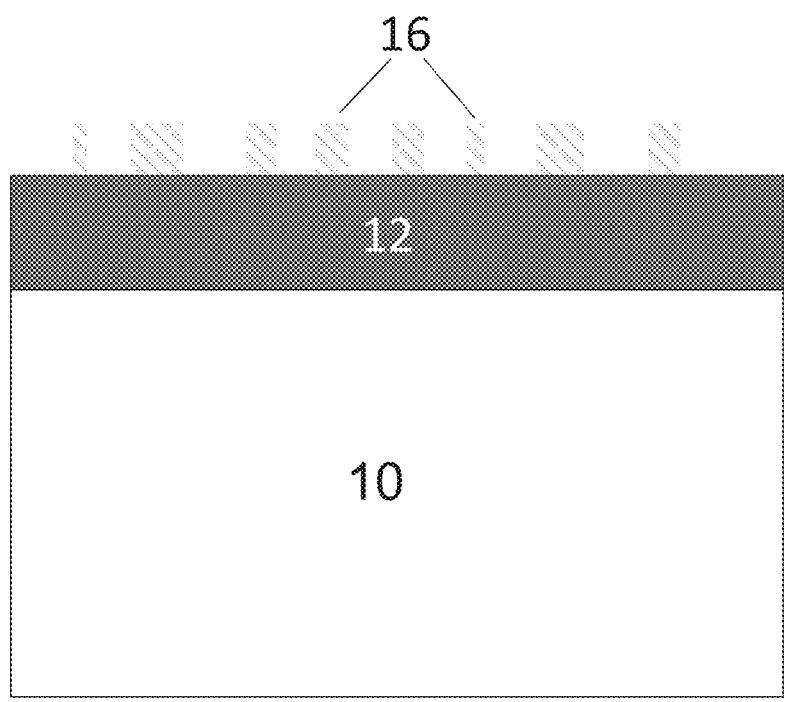
Figure 1C:
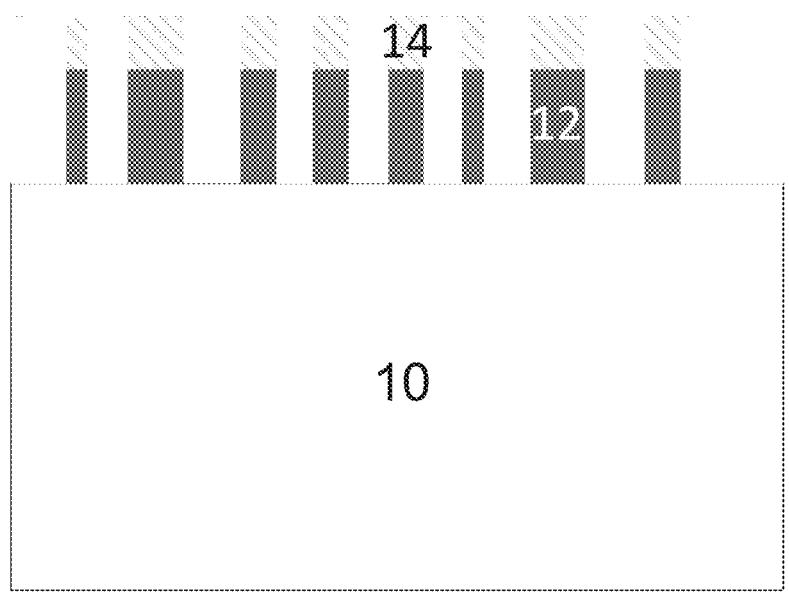

Metasurface optical elements are comprised of dielectrics with feature sizes from 10's of nanometers to micron scale, or generally smaller than the wavelength of light at which the metasurface is being used. Referring to FIGS. 1A to 1C, in many embodiments, an initial step to manufacturing metasurface elements comprises the patterning and formation of an array of metasurface features. In many such embodiments, as shown in FIG. 1A, this metasurface feature formation process is accomplished by depositing a patterning material (14) on top of an appropriate hard mask material (12) of thickness t (t being the thickness of the film and the height of the final metasurface) that itself is disposed atop a suitable substrate (10). Any suitable deposition technique may be used to form these layers, including, for example, sputtering, chemical vapor deposition (CVD) or atomic layer deposition (ALD).

Although throughout this disclosure exemplary materials will be discussed in relation to specific embodiments, it will be understood that any suitable combination of patterning material, hard mask material, and substrate may be used for these purposes. For example, in various embodiments, the substrate material is selected to provide suitable structural support and to be transparent to light over a desired bandwidth. Exemplary substrate materials that have been successfully implemented using the processes described in embodiments include, for example, fused silica, sapphire, borosilicate glass and rare-earth oxide glasses. Similarly, the hard mask material may be chosen from any readily available material suitable for use in semiconductor foundries. Exemplary hard mask materials include, for example, silicon, silicon nitride of various stoichiometries, silicon dioxide, titanium dioxide, alumina etc. In various embodiments, such as, for example, where the hard mask material forms an embedding material (as described in greater detail below) the hard mask material may be chosen to have a low (e.g., from 1 to 2.4) refractive index at a specific wavelength of light. Finally, the patterning material in accordance with embodiments may be formed of any suitable photoresist, such as, for example, a photoresist tuned for a lithographic wavelength capable of forming metasurface features of a desired size. Exemplary lithographic processes include, for example, ultraviolet and deep ultraviolet (DUV) lithography. In other embodiments, the patterning layer may be a polymer material suitable for use in nanoimprint lithography. Independent of the specific material used, the patterning material must be capable of reproducing a desired pattern of features from 10's of nanometers to micron scale, and must suitably protect the underlying hard mask film in selective areas in subsequent steps.

In particular, as shown in FIG. 1B, once the substrate (10), hard mask (12) and patterning material (14) layers are in place, the patterning material is patterned to reproduce an array of features (16) corresponding to either a negative or positive reproduction of the final intended metasurface feature array structure. The process of producing this feature array pattern can take any form suitable to produce the desired feature sizes. For example, in embodiments of metasurface elements for use in visible or near-IR applications UV lithography (e.g., where the wavelength of operation of the UV lithography step is below 193 nm) may be used. In still other embodiments, patterns may be imprinted physically by a master stamp in a nanoimprint lithography process.

As shown in FIG. 1C, once the desired feature array pattern (16) is in place, an anisotropic etch process is used to transfer the desired feature pattern into the hard mask layer (12). An exemplary anisotropic etch process for use in accordance with embodiments is reactive ion etching process. It will be understood that a number of possible chemistries may be used in the reactive ion etching process including, for example, $SF_6$ gas, $Cl_2$ gas, $BCl_3$ gas, $C_4F_8$ or any mixture of these gases. Further, the gas mixture may be static or timed in a multiplexed manner where one or more of the gasses is introduced followed after some set time period by a second unique set of one or more of the gases. Regardless of the specific anisotropic etch process used, once the pattern is etched into the hard coat layer the remaining photoresist may be removed using any suitable method (e.g., chemical solvent, chemical etchant, plasma etchant, etc.). Note, in various embodiments it may be desirable to use the feature array (16) formed in the hard mask material (14) as the final metasurface element. In such embodiments, the process can be stopped here, or combined with the deposition of suitable AR coatings or mechanical protection embedding layers as described, for example, in FIG. 1G.

Figure 1D:
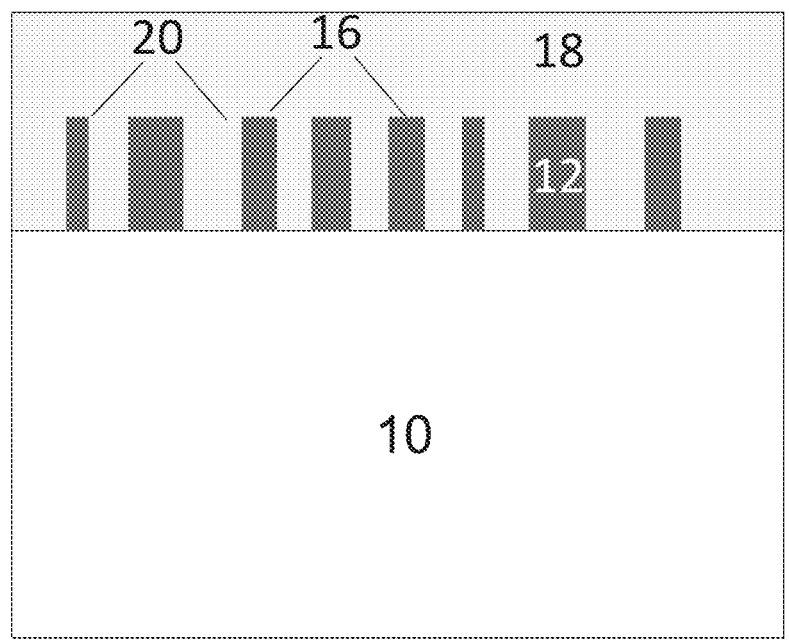

As shown in FIG. 1D, where a specific metasurface material is to be used in the final metasurface element, the feature pattern (16) formed in the etched hard mask (12) (as described above in FIG. 1C) can act as a template for the final metasurface structure. In such embodiments, a separate metasurface material (18) is deposited using a suitable conformal coating method such as chemical vapor deposition (CVD), atomic layer deposition (ALD), etc., to fill the mask negative and produce the metasurface element. As shown the metasurface material (18) overfills the spaces formed by the feature pattern (16) etched in the hard mask (12) to completely fill the voids. In addition to filling the voids (20), this process leaves an over-layer of the metasurface material above the remaining hard mask. Again, although specific metasurface materials will be discussed throughout, it will be understood that metasurface materials in accordance with embodiments may be chosen from any readily available dielectric material having a desired refractive index and suitable for use in semiconductor foundries. Exemplary metasurface materials include, for example, silicon, silicon nitride of various stoichiometries, silicon dioxide, titanium dioxide, alumina etc.

Figure 1E:
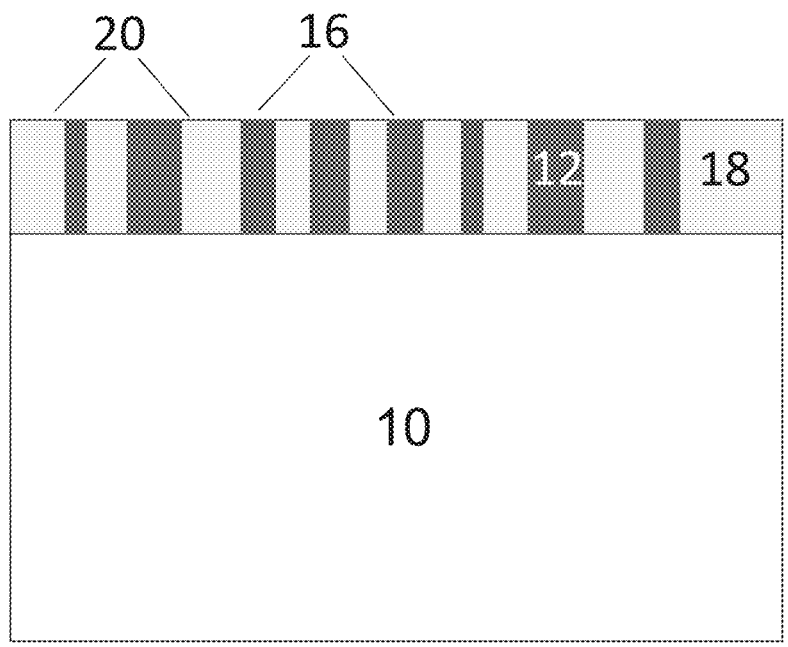
Figure 1F:
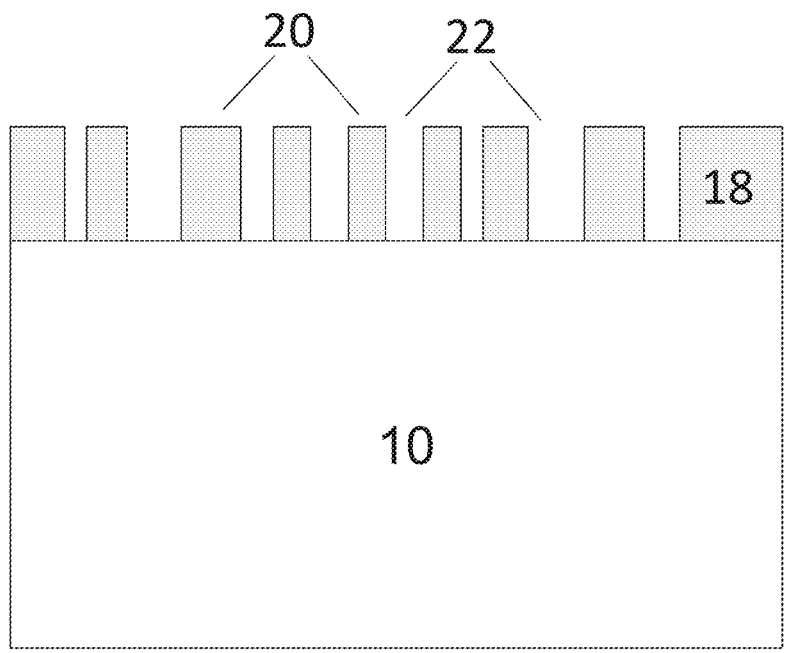

Referring to FIG. 1E, once the overfill of metasurface material (18) is deposited, an etch or chemical-mechanical planarization may be performed in accordance with embodiments to remove the overfill layer providing a uniform height to the patterned hard mask (12) and metasurface material (12). In embodiments where an embedded metasurface is desired, and where a suitable hard coat material has been chosen to act as the embedding material (as previously described) the process may be stopped and the resultant metasurface material embedded with hard coat material structure used as the final metasurface element. This metasurface element may then be optionally coated with suitable AR coating layers or mechanical protection layers as described below.

In various embodiments, as shown in FIG. 1E, the hard mask material (12) is removed leaving behind free-standing metasurface elements (20). In such embodiments, the hard mask may be removed using a selective etch chemistry which etches the hard mask material (12) at a much higher rate than the metasurface material (18) (e.g., 100:1 or 1000:1 or greater). As will be understood by those skilled in the art, such processes are dependent on the specific selection of metasurface material and hard mask material. For example, in embodiments where the hard mask is silicon and the metasurface is $TiO_2$, a $XeF_2$ etch chemistry will selectively remove the silicon while leaving the metasurface material essentially unaltered. Note, in embodiments where the metasurface element is designed to be freestanding, i.e., the metasurface element features protrude from the end of the substrate with only air gaps (22) separating them, the process is complete at this step.

Figure 1G:
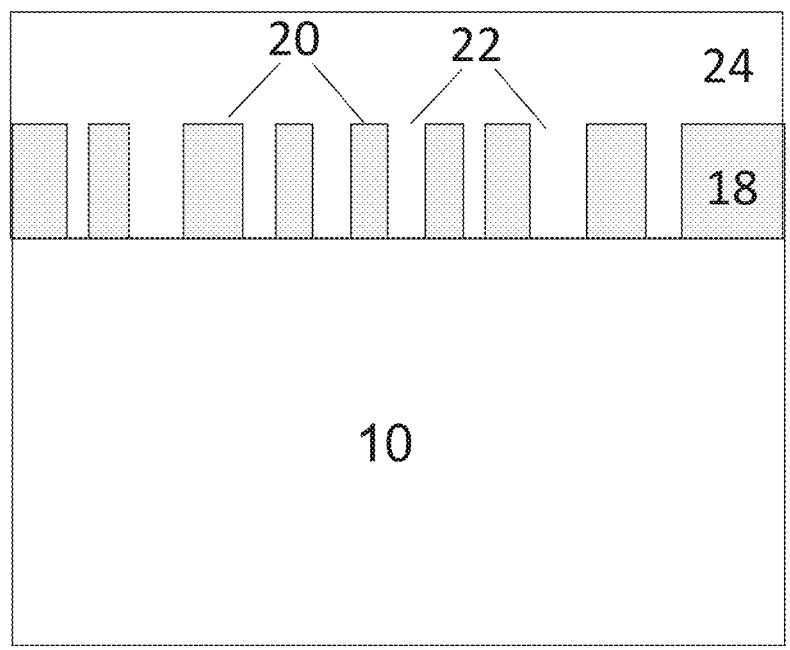

Finally, as previously discussed, in certain embodiments where it is desirable for the metasurface to have an AR coating or mechanical protection layer, additional steps are required to complete the final metasurface element. Referring to FIG. 1G, in various embodiments an AR coating or mechanical protection or planarizing layer (24) may also be deposited to file the voids (22) between the metasurface features (20) and extend above the surface of the metasurface material layer (18). It will be understood that any material having optical properties suitable for a specific optical system design, such as, for example, a suitable refractive index and minimal optical absorption at a desired wavelength or over the bandwidth of interest (the planarizing layer can allow for multiple levels of metasurface elements for complex optics systems) may be used in this process. As described above, in order to protect the metasurface and provide improved functionality the metasurface constituent elements and substrate faces in many embodiments are coated in one or more materials or layers of material. Referring to FIG. 2A, a schematic of an embedded metasurface is shown. As illustrated, the metasurface features (20), which can be any material with desired optical properties as described above, are embedded in an embedding medium (24) typically having a lower-index of refraction. Exemplary embedding materials include, for example, poly(methyl methacrylate), SUB, benzocyclobutene, and/or a solid film such as: silicon dioxide, aluminum oxide, titanium dioxide, silicon nitride, hafnium oxide, zinc oxide, or spin-on-glass. The low-index embedding medium encapsulates the metasurface features and may extend some thickness above the metasurface features. In such embodiments, the low-index medium may act as a protective barrier to the metasurface elements (i.e., provide mechanical stability). The embedding material may also provide an additional design degree of freedom for the system that allows for certain properties to be optimized, e.g., to improve the overall transmission or efficiency of the metasurface and in some instances obviate the need for a separate AR coating. It is shown here that the embedded metasurface is fabricated on a substrate but the metasurface could also be extending from a sensor/illuminator, as will be described in detail below. The combined element (metasurface, embedding medium and substrate) may also be coated with a suitable anti-reflection coating on the side of the substrate containing the metasurface (26') and/or on the backside of the substrate (26). In many embodiments, the AR coating may comprise alternating layers of any combination of silicon dioxide, titanium dioxide, aluminum oxide, silicon nitride, aluminum nitride, or amorphous silicon, where each has a thickness less than the wavelength of light within the operational bandwidth of the metasurface. Additionally, as described above the embedding medium itself can potentially be used as an anti-reflection coating.

Figure 2B:
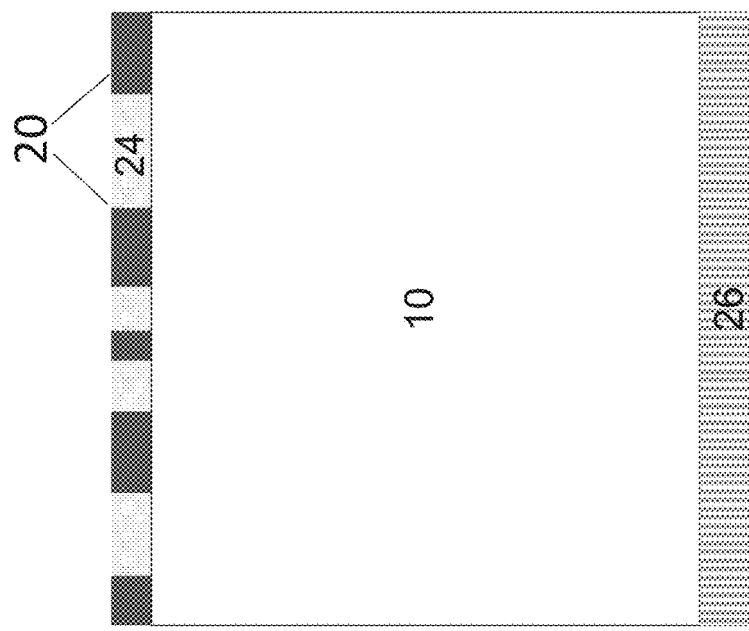
FIG. 2B provides a schematic illustrating a planarized-embedded metasurface element with anti-reflection coatings in accordance with embodiments of the invention.
Figure 2A:
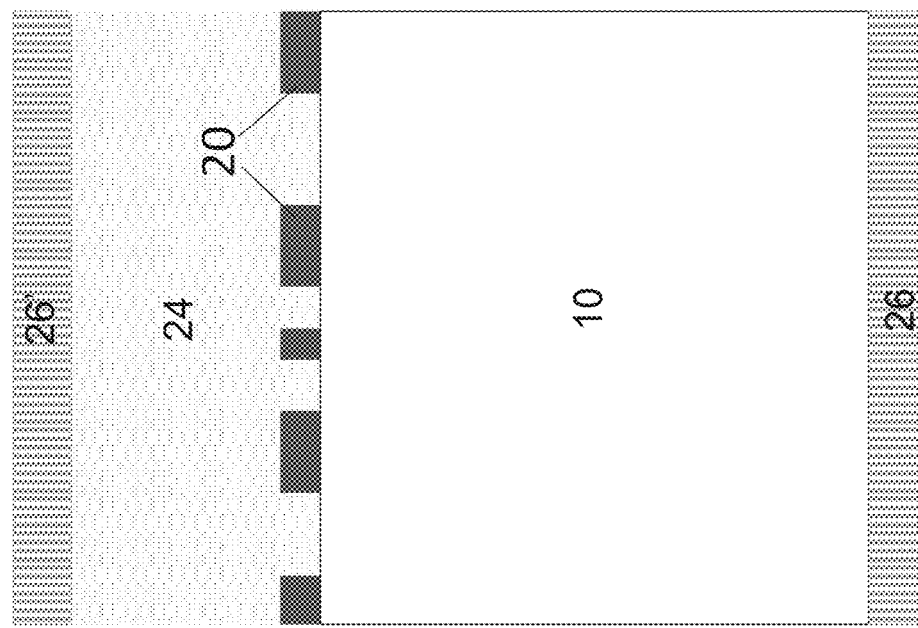
FIG. 2A provides a schematic illustrating an embedded metasurface element with anti-reflection coatings in accordance with embodiments of the invention.

Although certain embedded metasurface embodiments are described above, in various other embodiments the metasurface can be embedded and planarized, as shown in FIG. 2B. In such embodiments, the metasurface elements may be embedded in a suitable low-index material (as described above), and in an additional step, the embedding medium (24) is then etched or planarized such that its height is commensurate with the metasurface elements (20). Optional anti-reflection coatings may also be included on either the bare substrate surface (26) or on the patterned metasurface side (not shown).

Embodiments for Manufacturing Metasurface Elements On Conventional Substrates Although the above discussion has described in detail manufacturing processes capable of forming a variety of free-standing or embedded metasurface elements using conventional CMOS fabrication techniques, in practice it may not be possible to adapt conventional metasurface elements to allow for the economic production of metasurface elements using pre-existing equipment in foundries. For example, one of the design criteria used conventionally to tailor the optical properties of a metasurface element is the substrate thickness. Varying this substrate thickness provides the metasurface element designer another degree of freedom in obtaining desired optical properties However, the pre-existing equipment in most foundries have limitations that lead to specific mechanical requirements on the substrate upon which the metasurface elements will be fabricated. For the case of standard substrate diameters within foundries, e.g., 200 mm and 300 mm, the thickness of the substrate is limited to 725 microns and 775 microns, respectively. These fixed substrate thicknesses, in turn, impose specific requirements on the optical function, and therefore the design, of a metasurface formed on the substrate or a system of multiple metasurfaces formed on such a substrate (in mass production there may be, for example, 5,000 metasurfaces formed on a single die, or more).

Accordingly, many embodiments are directed to processes for tailoring the fabrication of the metasurface element or system to the specific substrate thickness upon which the metasurface or metasurface system is being produced. For example, in various embodiments the phase shifts that need to be imparted by the metasurface elements to impart a specific function to the overall optical component(s) will be specific to the substrate thickness upon which the elements are formed. Accordingly, in some embodiments the procedure for designing and fabricating the metasurface element comprises: (1) considering the device specifications of the metasurface element, (2) considering the thickness and optical properties (index of refraction and absorption) of the substrate on which the metasurface is being formed, (3) optimizing the phase profile of the metasurface to obtain the desired specifications for the properties of the substrate, and (4) determining the thickness and in-plane dimensions of the metasurface elements required to reproduce the phase profile.

Figure 3:
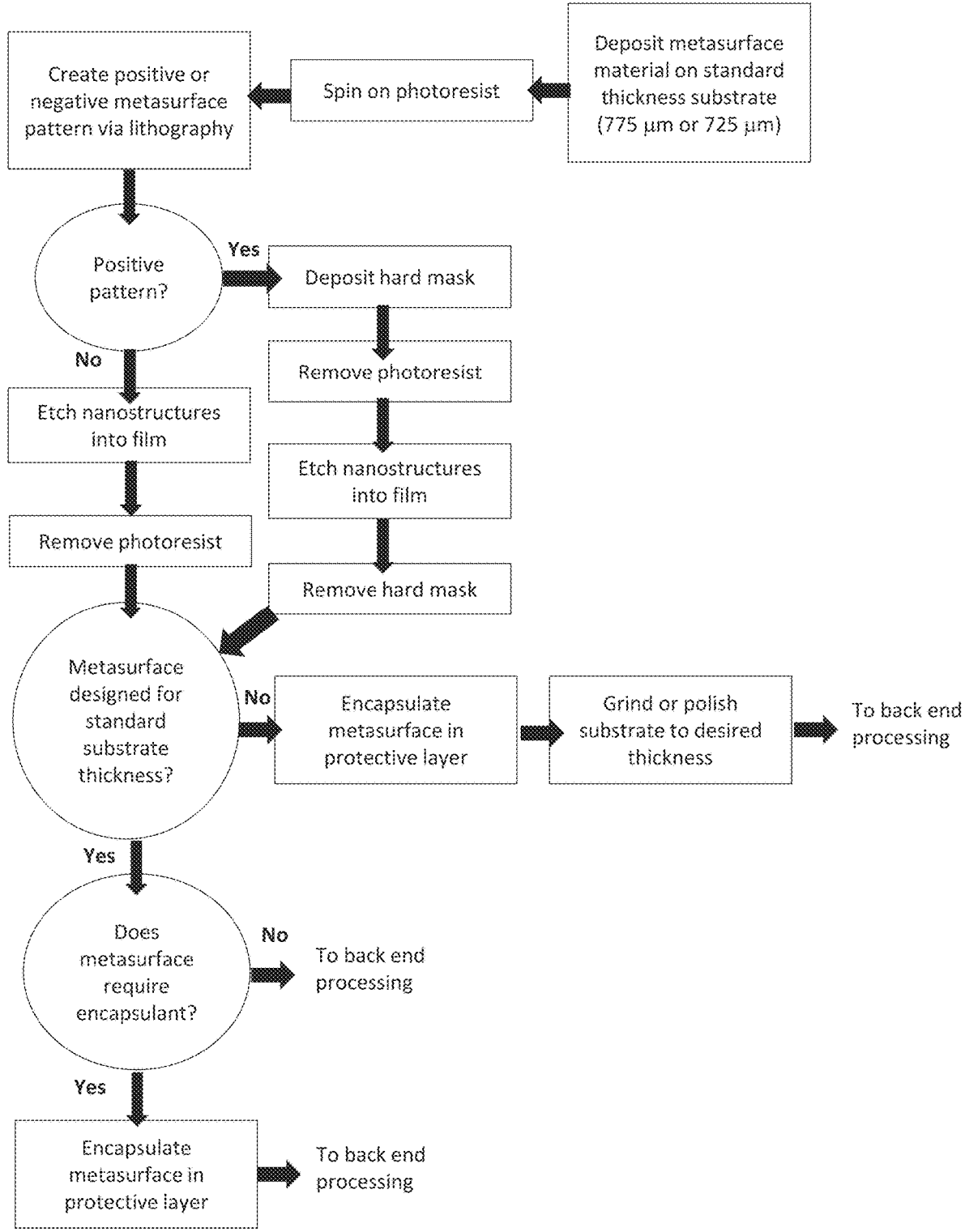
FIG. 3 provides a schematic flowchart illustrating a process for fabricating metasurface elements in accordance with embodiments of the invention.

Referring to FIG. 3, an exemplary process in accordance with producing metasurfaces using standard substrate thicknesses is provided. As shown, following deposition of the metasurface material and lithographic patterning and etching (as described in FIGS. 1A to 1G, above), if the metasurface layer is designed for the standard substrate thickness an additional protective layer or AR coating may be disposed on the metasurface layer before being sent for further back end processing. In many such embodiments, back end processing may comprise singulating the thousands of metasurfaces formed across the substrate using a dicing process.

Further, in embodiments where it is desirable to produce a metasurface that has a final substrate thickness different than the standard thicknesses discussed above an additional step to alter the thickness of the underlying substrate may be performed. In such embodiments, the metasurface would initially be formed on a standard substrate diameter (200 or 300 mm) with a thickness standard in semiconductor processes (725 or 775 micron, respectively), again to coincide with industry standards. After initial definition of the metasurface on the standard thickness substrates, subsequent back end processing would then be performed to alter the substrate thickness. Suitable methods for altering the thickness of the substrate according to embodiments include, for example, grinding or combination of grinding and chemical processing to gradually remove substrate material. In such embodiments, the final substrate thickness upon which the metasurface has been formed can be any value less than the starting standard thickness. Alternatively, if thicker substrate is required, two independent wafers each comprising any number of metasurfaces (1,000 to 10,000 individual metasurfaces) can be combined in accordance with embodiments to achieve desired thickness via wafer-bonding processes such that the final monolithic unit, with a set of metasurfaces on either side, has a total thickness as required by the final design. Processes according to such embodiments may be carried out for either two substrates with standard thicknesses, if the final thickness required is 2 times the standard thickness, or it can be carried out for two substrates that have been thinned so that the final thickness of the combined unit has any desired thickness. In such embodiments, the "back end processing" may comprise an additional wafer bonding step where each of the individual substrates can be aligned to each other before being combined.

Embodiments for Manufacturing Metasurface Elements with Non-Ideal Features

In conventional processes for designing metasurfaces, shape fidelity from the designed metasurface to the fabricated is often assumed to be either a 1 to 1 correspondence or to be maintained to within some error range. This approach leads to metasurface arrays often being comprised of a single set of shapes where one feature of that set of shapes changes, e.g., circles with varying diameters across the metasurface. However, fabrication techniques used for potential mass production of metasurfaces e.g., UV lithography as detailed above, are generally unable to carry-out faithful reproduction of certain geometrical shapes. As such, many embodiments are directed to metasurface elements and metasurface fabrication processes where the function of the metasurface is reproduced using non-ideal and inhomogeneous shapes.

Figure 4A:
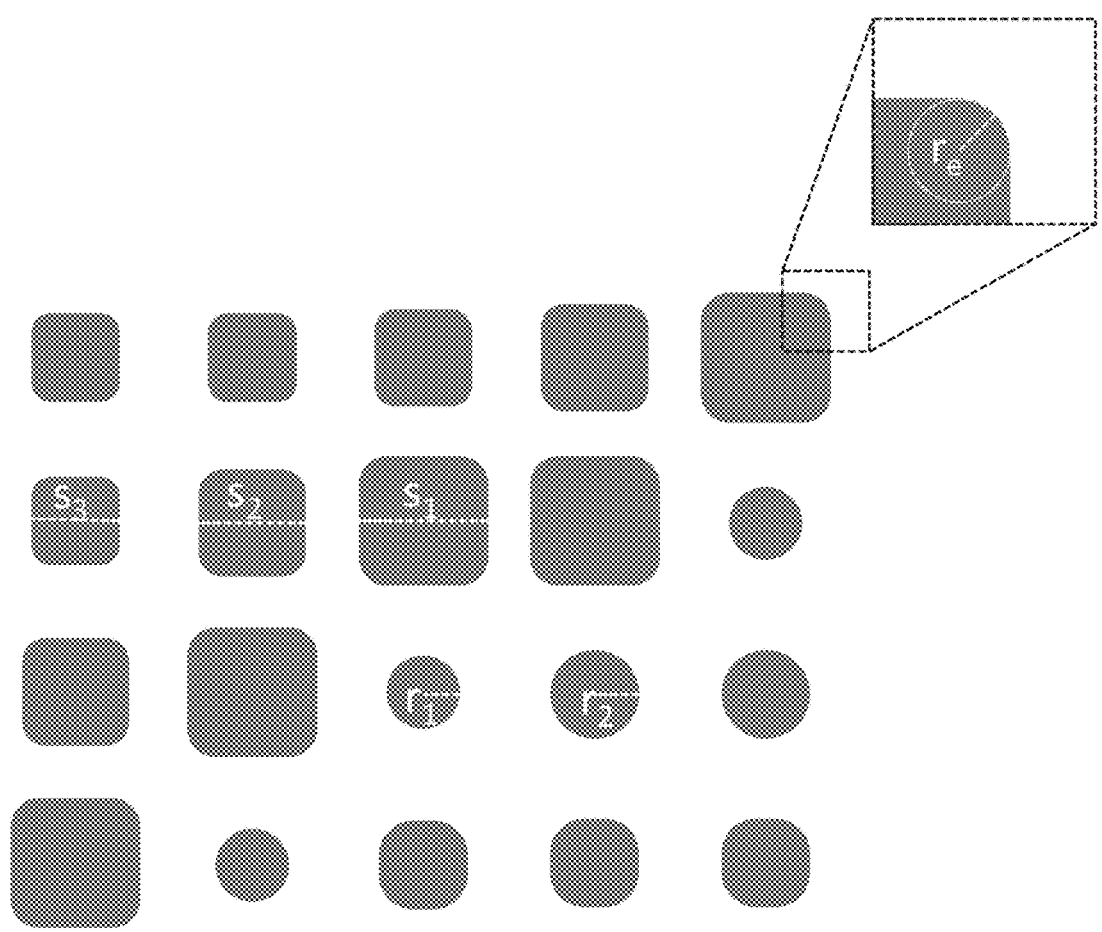
FIG. 4A to 4C provide schematics of a metasurface element having features of varying cross-section in accordance with embodiments of the invention.

For example, FIG. 4A provides a cross-sectional schematic of an exemplary section of a metasurface where an inhomogeneous set of shapes is distributed across the metasurface. In this specific embodiment, square pillars are desired. However, after fabrication what is actually formed within a given metasurface are an array of squares with varying side lengths (e.g., $s_1$), squares with rounded corners of varying radii, re and circles with varying radii $r_1$ or $r_2$. Specifically, the larger features here are designed to be squares or squares with rounded corners; however, as the side lengths of the squares are reduced below some minimum side length the squares become circles. In processes according to embodiments, manufacturing limitations are simulated on each desired metasurface feature shape, and these non-ideal or inhomogeneous feature elements then used to determine the final metasurface element array structure.

Figure 4B:
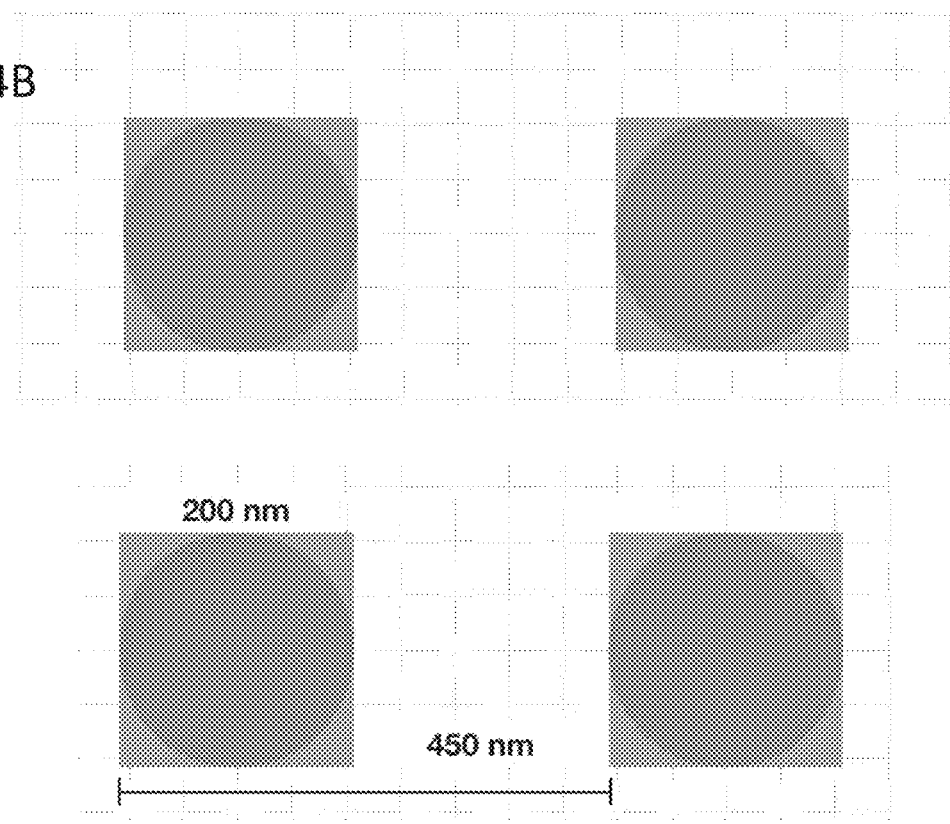
Figure 4C:
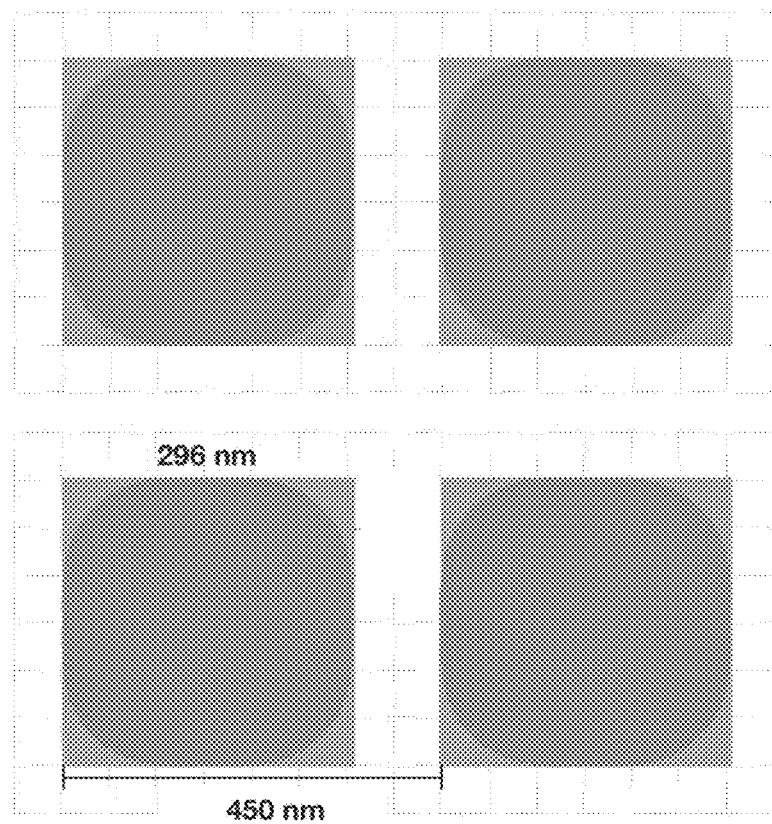

For example, FIGS. 4B and 4C, provide diagrams illustrating the variation of printed and designed patterns from a metasurface element mask reticle. As shown, in embodiments for a designed square feature of side 200 nm and period of 450 nm, the printed fabrication technique will actually replicate a circle of diameter 200 nm (FIG. 4B). By contrast, for a square feature of side 296 nm and spacing of 450 nm, the fabricated feature is a square with rounded corners (FIG. 4C). Accordingly, many embodiments of metasurface elements where square metasurface features are designed may be substituted with rounded squares below ~300 nm and circle below ~200 nm to allow for the use of industrial standard CMOS replication techniques.

Embodiments for Manufacturing Multiple Metasurface Elements

As previously discussed, various embodiments are directed to methods for wafer bonding two substrates incorporating metasurface elements together. Such embodiments may be modified to allow for the facile fabrication of multiple metasurface elements, such as, for example, doublets and triplets (e.g., metasurface elements comprising two or three separate metasurface feature arrays). In particular, although many wafer bonding processes exist each imposes a specific thermal budget on the substrates being joined. Since many embodiments of metasurface elements use amorphous Si as the metasurface material, excess heating of the substrates can result in the crystallization of the Si. Accordingly, embodiments are presented that allow for the formation of metasurface doublets and triplets using low temperature processes, such as, for example, using UV cured polymers (such as benzocyclobutane (BCB) or the like), or plasma activated $SiO_2$ to allow for wafer bonding of two or more metasurface elements at low temperature.

Figure 5:
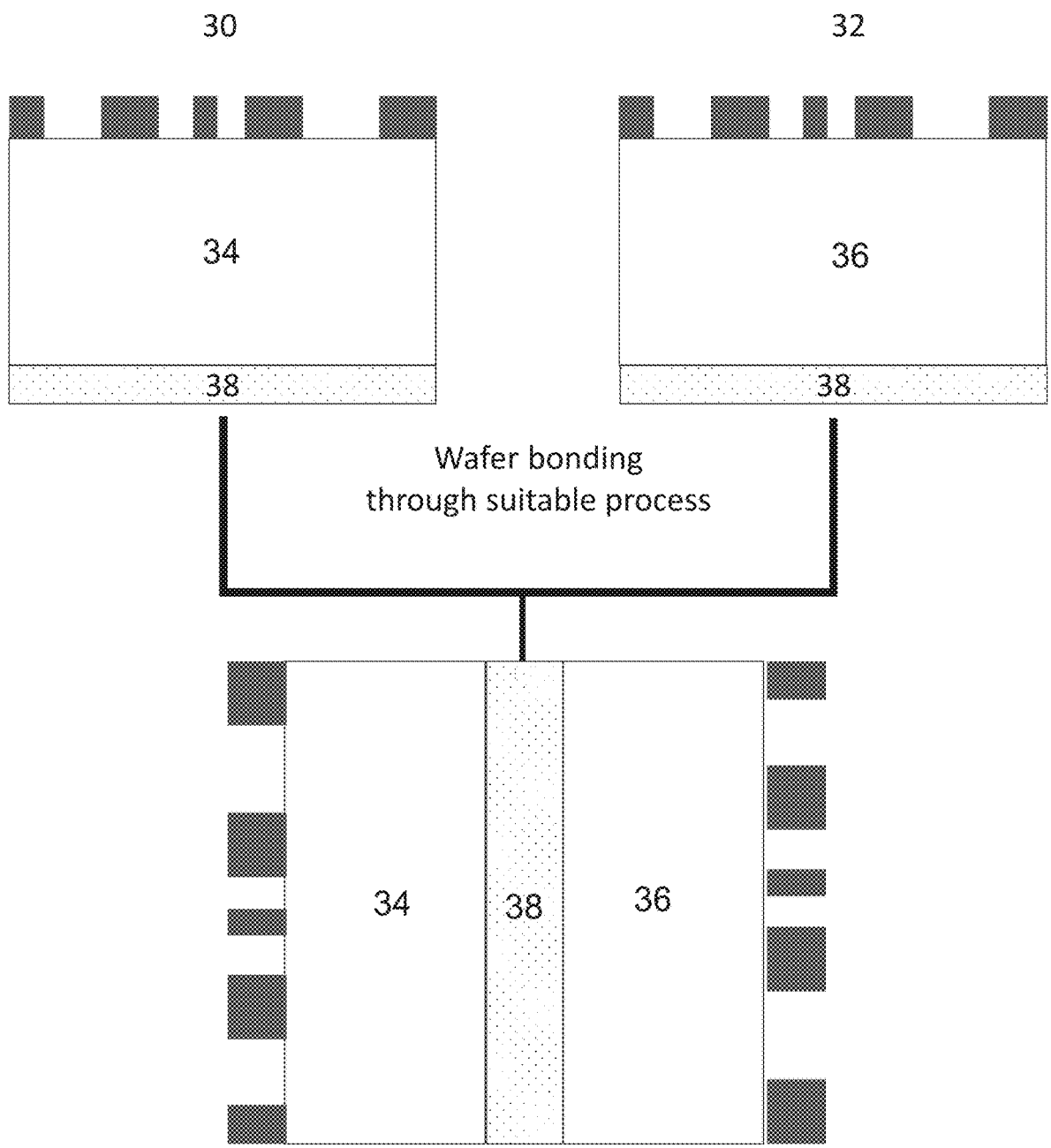
FIG. 5 provides a schematic illustrating the combination of multiple substrates having metasurface elements in accordance with embodiments of the invention.

Referring to FIG. 5, a schematic for forming a metasurface doublet in accordance with embodiments is shown. As illustrated, in many such embodiments, a plurality of unique metasurface elements (30 & 32) are fabricated on two distinct substrates (34 & 36). The metasurface elements are then made into a combined system by fusing the bottom (e.g., the portion of the face of the substrate without any metasurface elements) of each unique substrate. As discussed above, the substrates may be fused by wafer bonding techniques, optical epoxy, or any suitable method for combining the two unique elements into a single element within the allowed thermal budget of the metasurface material used. The bonding material (38) in many embodiments can be adhesives such as benzocyclobutene, cured polymers SU8 or a silicon dioxide film that facilitates a glass bond. In cases where the thermal budget of the metasurface material is low (less than 600° C.) the silicon dioxide bond can be a low temperature plasma-activated $SiO_2$ bond. Additionally, although not illustrated, the metasurfaces may be embedded as described in the embodiments illustrated in FIGS. 2A and 2B. In addition, as described in reference to FIG. 3, the thickness of the two substrates, which ultimately constitutes the total thickness of the space between the metasurfaces, may additionally be altered to optimize certain properties of the combined system.

Although the disclosure thus far has detailed embodiments incorporating only two metasurface elements, the process may be generalized to any number of metasurface elements. For example, certain applications may require three or more metasurfaces to be combined into a monolithic unit. In such a case, two substrates comprising separate metasurface elements may form the initial uncombined units. An illustration of exemplary embodiment of such a process is provided in FIG. 6. As shown, in many such embodiments, at least one of the metasurface substrates (40) has only one side patterned with a metasurface element (42) while the opposite side of the substrate can be completely unpatterned or may also include a bandpass filter (44) for a specific wavelength of interest. In such embodiments the filter may be formed of one or more suitable materials, including, for example, alternating layers of low index of refraction and high index of refraction materials such as silicon dioxide, titanium dioxide, amorphous silicon, silicon nitride, and aluminum oxide. At least a second metasurface substrate (46) has two unique metasurface elements (48 & 50) on each face of the substrate (this second metasurface substrate may also have been formed through an intermediate bonding step of its own as described above in relation to FIG. 5). The metasurface substrates (40 & 46) are then made into a combined system by fusing the bottom (e.g., the portion of the face of the first substrate (40) without any metasurface elements with the portion of the face of the second substrate (46) containing one of the two metasurface elements (48 & 50)) of each unique substrate. As discussed above, the substrates may be fused by wafer bonding techniques, optical epoxy, or any suitable method for combining the two unique elements into a single element within the allowed thermal budget of the metasurface material used. The bonding material in many embodiments can be adhesives such as benzocyclobutene, cured polymers SU8 or a silicon dioxide film that facilitates a glass bond. In cases where the thermal budget of the metasurface material is low (less than 600° C.) the silicon dioxide bond can be a low temperature plasma-activated $SiO_2$ bond. This bonding material is disposed on or between the faces of the two substrates to be joined. In certain implementations, various metasurface elements can be optionally encapsulated (52 & 54) as outlined above. However, in many embodiments for the facilitation of a bonding process, at least the metasurface element (48) proximal to either the bare substrate face or bandpass filter (44) in the combined triplet device is embedded in a polymer and/or solid-state bonding agent (56).

Figure 7:
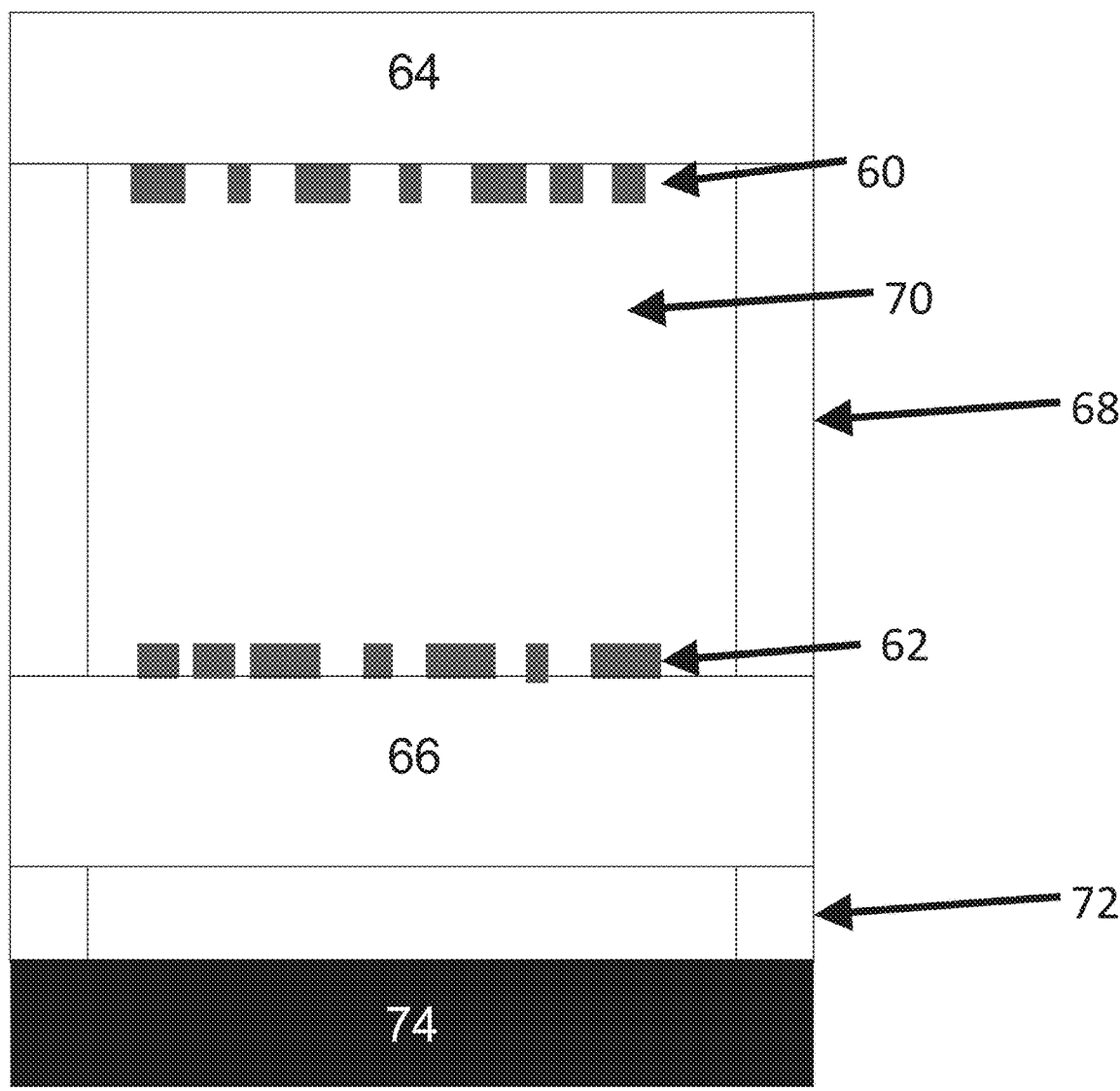
FIG. 7 provides a schematic illustrating the combination of multiple substrates having multiple metasurface elements incorporating an air gap in accordance with embodiments of the invention.

While the above instances of combining metasurface elements have had each metasurface element separated by a solid substrate, in some embodiments each metasurface elements may instead be separated by an air gap. Referring to FIG. 7, a schematic of a metasurface doublet comprising an air gap is illustrate. As shown, in many such embodiments, two or more metasurface elements (60 & 62) are formed on unique substrates (64 & 66) using a suitable method, such as that described above in relation to FIG. 5. The unique metasurface elements are then combined with a third substrate or spacer substrate (68) comprising one or more apertures (70) etched to make a monolithic unit where the space within the aperture between the metasurfaces is unfilled (i.e., such that an air gap is formed between the metasurfaces elements (60 & 62)). The space between the metasurfaces provides an additional design tool for system-level optimization. For example, in many embodiments by adjusting the spacer wafer thickness one can implement a variety of different designs. In addition, in various embodiments, as also shown in FIG. 7, it is possible to add additional spacer substrates (72) to incorporate other system elements, such as illuminators and/or sensors (74).

In embodiments incorporating such spacer substrates, any suitable substrate material may be used. For example, in many embodiments the spacer substrates may be any low-index material, such as, for example, polymer, $SiO_2$, glass, etc. In addition, in other embodiments the spacer material may be coated in black chrome. The metasurface elements may also be formed of any material, which has been optimized for a specific bandwidth, such as for example, silicon, $TiO_2$, alumina, metal, etc. The metasurface elements may also be fabricated using such methods as described in FIGS. 1A to 1G or using semiconductor fabrication processes in general.

The above embodiments described processes for combining two and three metasurfaces; however, such embodiments may be extended beyond just two or three metasurfaces. For example, by iterating on the steps described above in relation to FIGS. 5 to 7, embodiments allow for the stacking of any number of metasurface elements. Referring to FIG. 8A, in various embodiments a set of metasurfaces (80, 82, 84, etc.) and spacer layers (86, 88, etc.) may be directly integrated with an illuminator or sensor. In such embodiments, an optional spacer layer (90) is first formed on a sensor/illuminator (92) through a suitable deposition process, as described, for example, in relation to FIGS. 1A to 1G. Following the spacer layer (90), any number of metasurface elements (80 to metasurface n+1) may be fabricated as needed to carry out a desired function. Each subsequent metasurface may also be separated by a spacer layer (86 to spacer n+1) and the thickness of each spacing layer may be varied as required by the optical design. As previously discussed, the spacer layers in such embodiments may be any low-index material, e.g., polymer, $SiO_2$, glass. As also previously discussed, the metasurface elements in such embodiments may also be any material, which has been optimized for a specific bandwidth, e.g., silicon, $TiO_2$, alumina, metal, etc. The metasurface elements may be fabricated using such methods as described in FIGS. 1A to 1G or using other suitable semiconductor fabrication processes in general.

Although the above description assumes integration with a sensor or illuminator (92), a set of metasurface elements and spacer layers can also be iteratively fabricated on a substrate (90), as illustrated in FIG. 8B. As shown, in such embodiments, the process is as described in relation to FIG. 8A, but rather than integrating the metasurface/spacer stack onto a sensor/illuminator (92), the stack is produced on a stand-alone substrate (90). The combined substrate and stack in accordance with such embodiments may then be integrated into an optical system or be used as a stand-alone optical component.

Embodiments of Multilayer Metasurface Elements and Their Manufacture

While in the previously-detailed embodiments each metasurface element is designed to carry out a unique optical function in a larger optical system and the metasurface elements are typically separated by macroscopic distances (distances of 10 or more wavelengths), in various embodiments a plurality of two layers of patterned material may be provided at a distance to each other microscopic distances (e.g., at distances to each other smaller than or on the same order as the wavelength of light) such that the layer in combination form a single metasurface element performing a single optical function. This may be particularly advantageous where an optical function requiring very complex metasurface features is called for. Such complex features may be beyond the capability of standard CMOS fabrication techniques to fabricate. In such cases, combinations of simple features disposed at microscopic distances in accordance with embodiments may be used to replicate the optical functions of the complex features shapes. Referring to FIG. 9, a schematic of an embodiment of a metasurface element comprising two layers of patterned materials separated by a distance, $t_{offset}$, is provided. Although only a schematic for a two-layer system is shown, it will be understood that any number of such layers may be provided so long as the distance $t_{offset}$ is small enough to allow for a combination of the optical functions of the plurality of layers. These feature layers may be formed and combined using any suitable combination of the fabrication steps set forth in relation to FIGS. 1 to 8, above.

Embodiments for Incorporating Metasurface Elements with VCSELs

The techniques and processes of fabricating metasurface elements in accordance with embodiments also directly enable their integration with illumination sources. Of particular interest is the combination of metasurface elements with VCSELs and VCSEL arrays. In general, a transmissive metasurface element can imprint an arbitrary phase profile on an electromagnetic wave to produce any radiation pattern in the far-field. Fabrication techniques for the metasurface elements in accordance with embodiments enable direct integration with a VCSEL, solid state laser, quantum cascade laser, LED, superluminescent LED or any solid-state light source.

VCSELs can be conceptualized as single- (or few-) mode lasers which generate an approximately collimated beam of laser light at a single wavelength. Often to generate sufficient power or spatial extent a device will contain not one VCSEL, but a 2-dimensional array of VCSELs. This light has a distribution (or illumination) in real space and in angular space. Metasurfaces when properly co-designed and integrated with a VCSEL array have the ability to transform both the real and angular space distribution of either a VCSEL or VCSEL array. In particular, pairing a metasurface element with a VCSEL allows the metasurface element to imprint an arbitrary radiation pattern on the source (e.g., batwing, top hat, super-Gaussian, or other patterns known in the art).

Figure 10A:
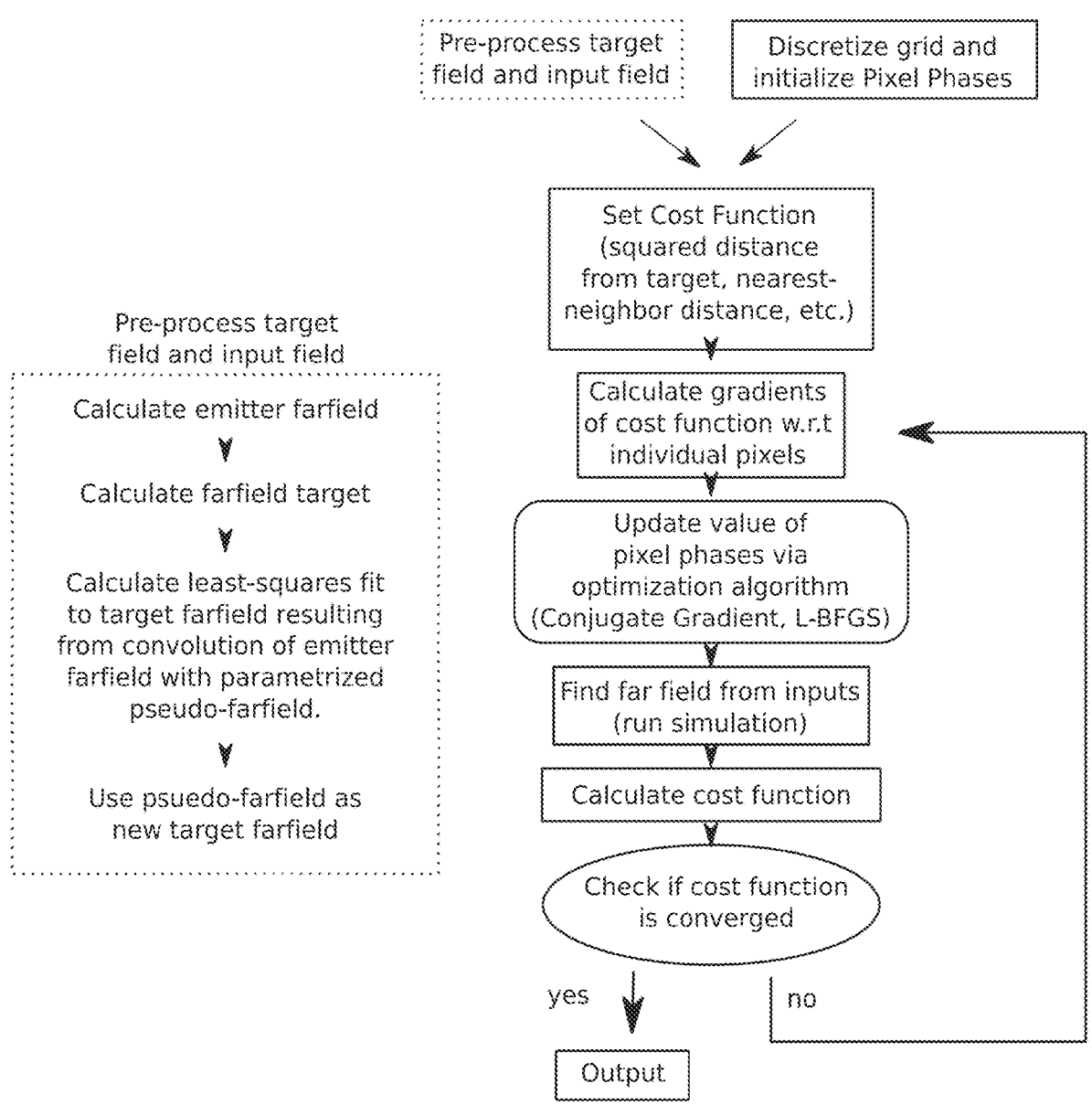
FIG. 10A provides a flowchart for using metasurface elements to produce an arbitrary radiation pattern out of a VCSEL or VCSEL array in accordance with embodiments of the invention.
Figure 10B:
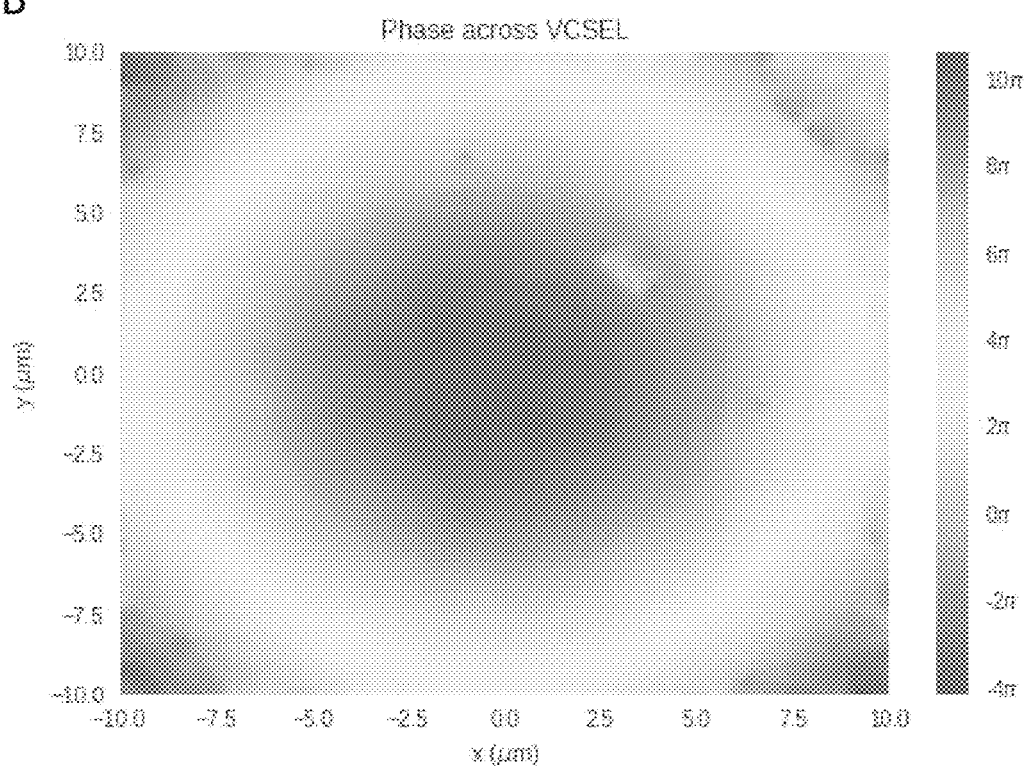
FIGS. 10B and 10C provide diagrams of phase (10B) and intensity (10C) obtained using the process of FIG. 10A in accordance with embodiments of the invention.
Figure 10C:
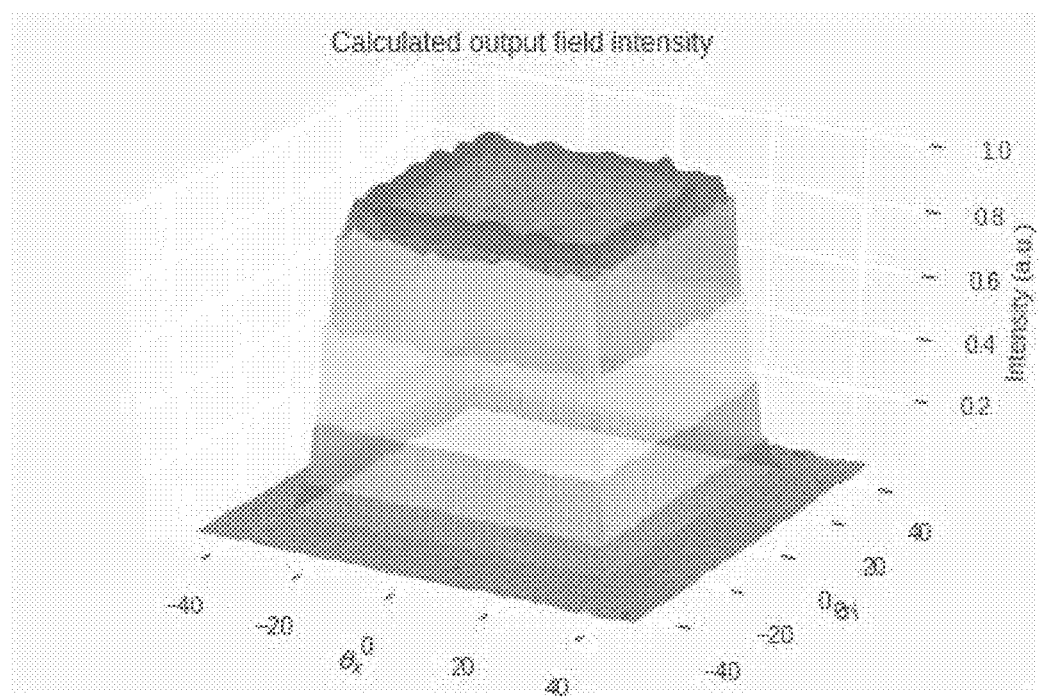

FIG. 10A presents a flow-chart of a process, in accordance with embodiments, for fabricating a metasurface to create any desired far-field intensity from a VCSEL array. To obtain the illumination in real space, in accordance with embodiments, the VCSEL is assumed to operate in the far-field regime. The VCSEL's characteristic far field (VCSEL-FF), from experimental data, is propagated to the surface under illumination, which in this case is a metasurface element as defined above. In the case of a VCSEL array, the output from many VCSELs via (VCSEL-FF) is summed at the surface under an assumption of incoherence to generate the illumination. This surface illumination then gives the intensity distribution at the metasurface element (I-MS). Every point at this illuminated surface also has a distribution of angles of incident light on it, taken from the VCSEL far field angular distribution. In a simplifying case, it is possible in accordance with embodiments to consider where all the illuminated points have this same VCSEL far field angular distribution, though each point has a slightly different angular distribution.

To generate a metasurface element which takes into account the distribution of angles at the metasurface element in the design, from a target far-field distribution (TAR- GET_FF) embodiments of the process construct a pseudo-far-field (PSEUDO-FF) that has the property that the convolution:

$$((PSEUDO\text{-}FF) * (VCSEL\text{-}FF))(x, y) = (TARGET\text{-}FF)(x, y) \quad (EQ.\ 1)$$

That is, in accordance with embodiments, the pseudo-far-field convolved with the VCSEL far-field reproduces the target far-field. In such embodiments, the pseudo-far-field is calculated by fitting a curve to the target function. Then (PSEUDO-FF) is used as the target (or objective function) in the remainder of the process.

In various embodiments, the process proceeds by initializing the metasurface grid by discretizing it and setting the phases to some initial condition. In many embodiments, a cost function is decided upon. In various embodiments, this is chosen to be the squared error of the far field projection of the metasurface under VCSEL illumination to (PSEUDO-FF). In some embodiments, other objectives, such as the smoothness of the result in the calculated far-field, can also optionally be set. For each objective, a corresponding gradient function is also derived. This gradient function and the results of the calculation of the cost function are then used in embodiments as an input into an optimization algorithm in accordance with embodiment, and as summarized in FIG. 10A. The optimization algorithm, in accordance with embodiments, updates the results of the pixel phases and continues until the objective function meets some criteria (i.e., convergence). Upon convergence of the cost function, the required metasurface phase profile is output and a metasurface element design is chosen depending on the wavelength and desired material (e.g., as described in detail below), and a physical design for the metasurface element may be created.

Exemplary data plots showing the output of the process according to embodiments for phase (10B) and intensity (10C) after employing the algorithm described above for an example case. As shown, in such embodiments, the phase is encoded by the metasurface elements and the intensity profile on the right is produced after the laser source passes through the metasurface element and is projected into the far-field. Accordingly, using such a process it is possible to obtain predictive performance data for a proposed metasurface element under desired operating conditions and to illustrate ways of optimizing that performance by modifying aspects of the metasurface element design, such as, for example, size, height and spacing of elements, etc.

Embodiments for Incorporating Metasurface Elements with Illumination Arrays

Figure 11:
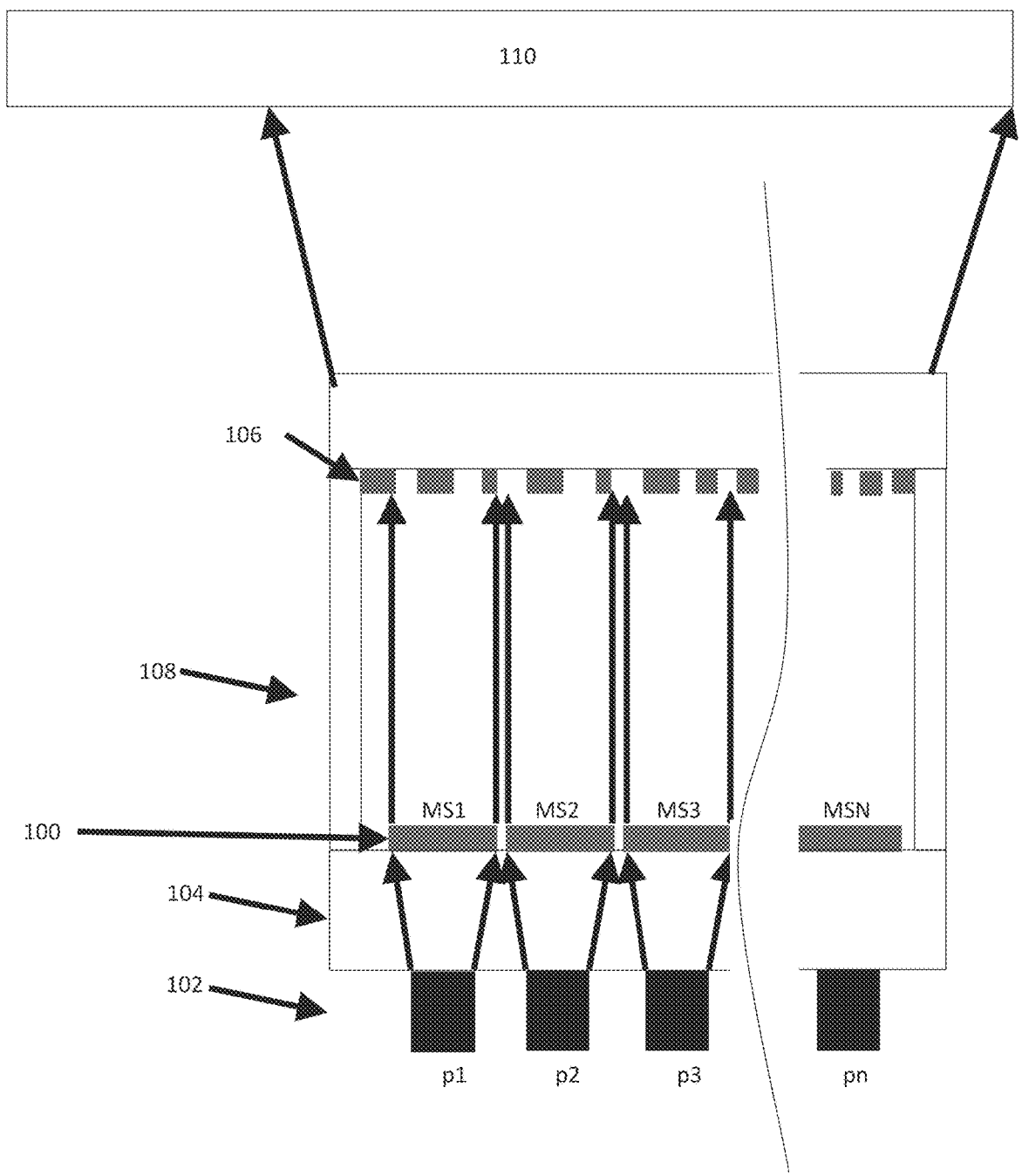
FIG. 11 provides a schematic illustrating an array metasurface element coupled with a set of pixelated sensor elements or illumination sources combined with a second metasurface into an integrated package in accordance with embodiments of the invention.

While the above processes have focused on integrating metasurface elements with a single illumination source, e.g., as shown in FIGS. 7 and 8A, metasurface elements can also be integrated with a set of pixelated and distributed sources. As illustrated in FIG. 11, various embodiments may comprise a set of illumination sources, $p_1, p_2, \ldots p_n$ (while this is shown in 1 D, it will be understood that the system can be extended to a 2D array and in general the array need not be periodically spaced) designed to illuminate a scene (110). Although each illuminator may be identical, in many embodiments the character of each illuminator may be generally unique. For example, each illuminator may have a different wavelength, bandwidth or may even output a uniquely driven optical waveform. In specific applications, the array in FIG. 11 may be an array of VCSELs. In other applications, there may be three colors (e.g., red, green and blue) that are then repeated periodically within the array. Because each illuminator comprising array may have unique properties, it may also be advantageous to have an array of metasurface elements, each with uniquely designed properties. In such embodiments, the metasurface array (100) may be offset from the illuminator array (102) by a spacer (104) (similar to FIG. 7 or 8B). As previously discussed, the thickness of the spacer layer (104) will depend on the specific design, but in many embodiments the thickness is configured to allow the light from the illumination sources to diverge sufficiently before interacting with the metasurface array (100). Again, the function of each metasurface element in the array may be generally unique but in certain embodiments, each metasurface element may provide collimation of the underlying illuminator pixel or each metasurface element may act to further mix each underlying illuminator pixel.

In addition to the first metasurface array (100), various embodiments may incorporate a second metasurface element (106) to further shape the emitted light from the illuminator array (102). In various embodiments, the second metasurface element (106) is also offset by a second spacer layer (108). Although this second spacer layer (108) is shown in FIG. 11 as an air gap spacer, it will be understood that this spacer can also be a solid state material as in other embodiments as described above. In many embodiments, the first metasurface array (100) is configured to introduce an additional angular divergence into the illuminator array (102) while the second metasurface element (106) imprints a specific far-field radiation pattern onto the light field. In other embodiments, the second metasurface element (106) may also be formed of an array of metasurface elements, each with unique functionality. In all such embodiments, the metasurface elements, and particularly the second metasurface elements in the system, may be designed using embodiments of the algorithm described in FIG. 10A. While in this particular case, the system has been described as an array of pixelated illuminators (102) shaped by the metasurface arrays/elements to illuminate a scene (110); the system can also be considered in the reverse. For example, the pixelated illumination sources may instead be pixels of a CMOS image sensor and instead of light being projected onto a scene, the system may be configured to collect light from a scene (110) and focus the light down to a pixel.

In all embodiments where the illumination source is a VCSEL, it is understood that the disclosures can also apply to an array of VCSELs (VCSEL array). In such a VCSEL array many individual aperture VCSELs with designable properties are combined on a single chip. Such VCSEL arrays are used to increase the total output power of the illumination source. The array may consist of a one-dimensional row of individual VCSELs or 2D grid of individual VCSELs where in each case the specific properties of the VCSELs (e.g., power, wavelength, aperture diameter, beam divergence etc.) and the arrangement of the individual VCSEL (e.g., center-to-center distance, periodic or aperiodic spacing, etc.) can all be freely chosen.

In the context of metasurface element integration, embodiments of metasurface elements with generally (but not necessarily) uniquely designed properties can be patterned on top of each individual VCSEL in the array, utilizing any of the techniques outlined herein. For example, a metasurface may be fabricated directly on the facet of each individual VCSEL in the array or a suitable dielectric spacer may be deposited on the VCSEL followed by the integration of the metasurface on top of the combined dielectric layer and VCSEL. In such embodiments, the metasurfaces may provide a particular radiation pattern for each VCSEL and the entire system (VCSEL properties, geometrical parameters and metasurface-enabled radiation pattern) can be iteratively optimized for a specific set of performance parameters.

In various other embodiments, a dielectric material, with an index of refraction lower than that of the constituent VCSEL material may be deposited and planarized such that a single metasurface can be patterned on top of the dielectric material. This contrasts with embodiments where each VCSEL in the array has a unique metasurface patterned on its facet. Again, in such embodiments the combined system may be optimized to achieve a desired performance. Finally, in all of the above embodiments, integration of a metasurface with a VCSEL array may be accomplished using wafer level optics processes. In such embodiments, the spacer layer may be air rather than a solid dielectric, similar to the device shown in FIG. 7.

Embodiments for Incorporating Metasurface Elements into 3D Applications

In certain 3D structured light applications, a pseudo-random binary array (PSBA) is projected onto a scene. A typical PSBA is built by discretizing 2D space, for example, in a square grid. Each grid point in the x-y plane can be characterized by a unique index (i,j), where i and j are integers. At each point (i,j) a pseudo-random algorithm is used to determine whether the grid point has a dot (representing the binary value of 1) or no dot (representing a binary value of 0).

Typically, a diffractive optical element (DOE) is used to convert incident laser light, for example from a VCSEL or VCSEL array into a single dot pattern. Such conversion schemes rely only on two intensity values in the projected field (dot or no dot). However, in general it is desirable to impart multiple patterns onto a single scene and for each of the multiple patterns to exist on separable information channels (i.e., having two patterns projected from a single element onto a scene and having a method for uniquely identifying each pattern at a sensor plane). In some schemes of 3D imaging, multiple patterns are projected onto a scene at different time slices (temporal variation). These schemes use either multiple distinct illumination patterns or some active element, such as a spatial light modulator, which can be electrostatically tuned to alter the projected pattern at different points in time. These schemes, however, do not allow single-shot acquisition, increase the complexity and therefore the cost of the system and tend to be substantially larger than an integrated laser/DOE. Accordingly, many embodiments are directed to metasurface elements configured to provide single-shot acquisition for 3D structure light applications.

Referring to FIGS. 12A to 12C, exemplary embodiments of a metasurface element (120) composed of a plurality of metasurface features (122) with an asymmetric cross-section (e.g., rectangular or elliptical), a fixed height, and an axis of rotation are provided that are capable of imprinting two unique dot patterns with two orthogonal polarizations onto a illumination source (124). While this exemplary embodiments will be discussed in reference to a laser of fixed polarization, embodiments may also be configured to operate on an unpolarized source (e.g., a light emitting diode (LED)), where the function of the metasurface element would be to split the unpolarized light into two distinct polarizations (as shown schematically in FIG. 12B) and imprint any desired arbitrary pattern onto the projected light. Whatever the illumination source, in various embodiments, the metasurface elements can be integrated with the illumination source, (e.g., LED, VCSEL, VCSEL array, etc.), in accordance with embodiments described in this disclosure. For example, referring to FIG. 12A, the metasurface element (120) may be fabricated on a substrate (126) of desired thickness and then bonded, either with a spacer layer that is subsequently bonded to the illumination source (124), bonded directly to the illumination source or the substrate upon which the metasurface elements are formed can be subsequently diced into individual units and combined with the laser source through back-end packaging. For various embodiments of 3D imaging systems, the illumination source may be in the near infrared (NIR) (e.g., at wavelengths of 850 or 940 nm).

Regardless of the specific configuration and manufacture of the metasurface elements used, in such embodiments the metasurface elements operate by shaping not only intensity, but also the polarization of the light emitted from an illumination source. Specifically, in addition to intensity variations, light also has a vector quantity known as polarization. Given a polarized illumination source, it is possible to decompose the illumination polarization into a basis of two orthogonal polarizations or channels. Due to the orthogonality of these polarization bases, any pattern imprinted on these different polarization channels can also be independently sensed through a suitable detector configured to separate these polarization channels.

As a specific example, consider the following case. For an illumination source (in this example a polarized illumination source such as a laser) that emits light in horizontal polarization, $|H\rangle$, it is possible to decompose the output into two polarizations according to the equation:

$$|H\rangle = \frac{|A\rangle + |D\rangle}{\sqrt{2}} \quad (\text{EQ. 2})$$

where $|A\rangle$ and $|D\rangle$ in this example are diagonal and anti-diagonal linear polarizations (although it will be understood that any set of polarizations may be used in accordance with embodiments). In such a case, as shown in FIG. 12C, the pattern of metasurface features (122) of the metasurface element (120) disposed over the illumination source (124) is configured such that it imprints a separate dot pattern (as shown in FIG. 12B) onto each of these two polarizations. In accordance with embodiments these dot patterns may be unique for each polarization for clarity, as shown in the exemplary schematic of FIG. 12B, or they may be partially overlapping. Regardless of the specific configuration of the dots, however, in embodiments these patterns are projected on the same region of space (i.e., their grids have an identical spatial origin). In various embodiments, complimentary dot patterns may be used such that for every point that there is a dot in Pattern 1, there is the absence of a dot in Pattern 2 and vice versa, however, this is not essential. Such complimentary dot pattern configurations have the advantage that if a single dot (e.g., area) of a scene is lost during the capture, there is a complimentary dot of separate polarization that may capture it, thus providing a certain redundancy. In addition, while two patterns of dots on a square grid are described in relation to this specific exemplary embodiment, it should be understood that the projected patterns might be of any configuration having any suitable geometry and shape. Similarly, while a specific illumination polarization and number of polarizations upon which that illumination polarization was decomposed have been described, it will be understood that any polarization and any number of different polarizations may be used in accordance with embodiments.

As described above, the embodiments operate as a result of the orthogonality of the polarization channels upon which each pattern is imprinted. Because of this orthogonality, the reflected light from a given scene can be separated, by a suitable detector, to create multiple images of the same scene, one with Polarization 1 corresponding to Pattern 1 and one with Polarization 2 corresponding to Pattern 2, as shown in FIG. 12B. The net result is that embodiments of such a system provide two nominally independent measurements of the distorted pattern reflected from the scene without the need for time multiplexing. Accordingly, embodiments of such a system can be used to provide single-shot, multiple measurements in 3D imaging systems, thus reducing ambiguities and increasing accuracy.

Typical pattern projection systems used in mobile devices, for example, have a limitation on the total number of points that they can project onto a scene. This limitation arises from a combination of the number of constituent VCSELs in a VCSEL array (which is not alterable by any operation of the optic producing the pattern) and the ability of the optic producing the structured light pattern to create multiple replicas of each VCSEL comprising the VCSEL array. In practical implementations, this limits the number of projected points in a pattern to a specific number, N (typically around 30,000). In accordance with embodiments of the polarization-dependent metasurface systems described above, since a single metasurface element has the ability to create multiple completely unique patterns for each orthogonal polarization, even within the limitations stated above, the total number of dots in a given pattern can be doubled (e.g., 2N), leading in a typical system to as many as 60,000 points in a single projected pattern. This doubling can be understood by examining the nature of the patterns. Conceptually, a typical projected pattern has a set of grid points separated by some period, p. At some distance away from the projector, the pattern spans a field of view given by a vertical and horizontal distance, H and Y. For traditional projectors, 30,000 grid points at a maximum will fill that field of view such that the product $$\frac{H}{p}\left(\frac{Y}{p}\right) = 30,000.$$

In embodiments of the metasurface-polarization based solution, the optic projects one pattern with a period, p, and a second pattern, also at a period, p, but with a linear offset of p+p/2 such that a new grid point is projected at each half period. The net result is that within the same field of view, H and Y, the density of grid points can be doubled using the metasurface-enabled 3D systems in accordance with embodiments.

Finally, because two unique and distinguishable patterns can be generated from systems in accordance with embodiments, such systems can also be optimized for both short distance (<1 m) and long distance (>1 m) 3D imaging. For example, certain patterns can be configured to distinguish objects that are a short distance from the device, while different patterns may be configured to distinguish patterns that are at a greater distance from the device. In such embodiments, it would be possible to use a single device to create, e.g., pattern 1 with polarization 1 for short distance measurement and pattern 2 with polarization 2 for long distance measurement in a single-shot.

Embodiments for Incorporating Metasurface Elements into Imaging Systems

Figure 8:
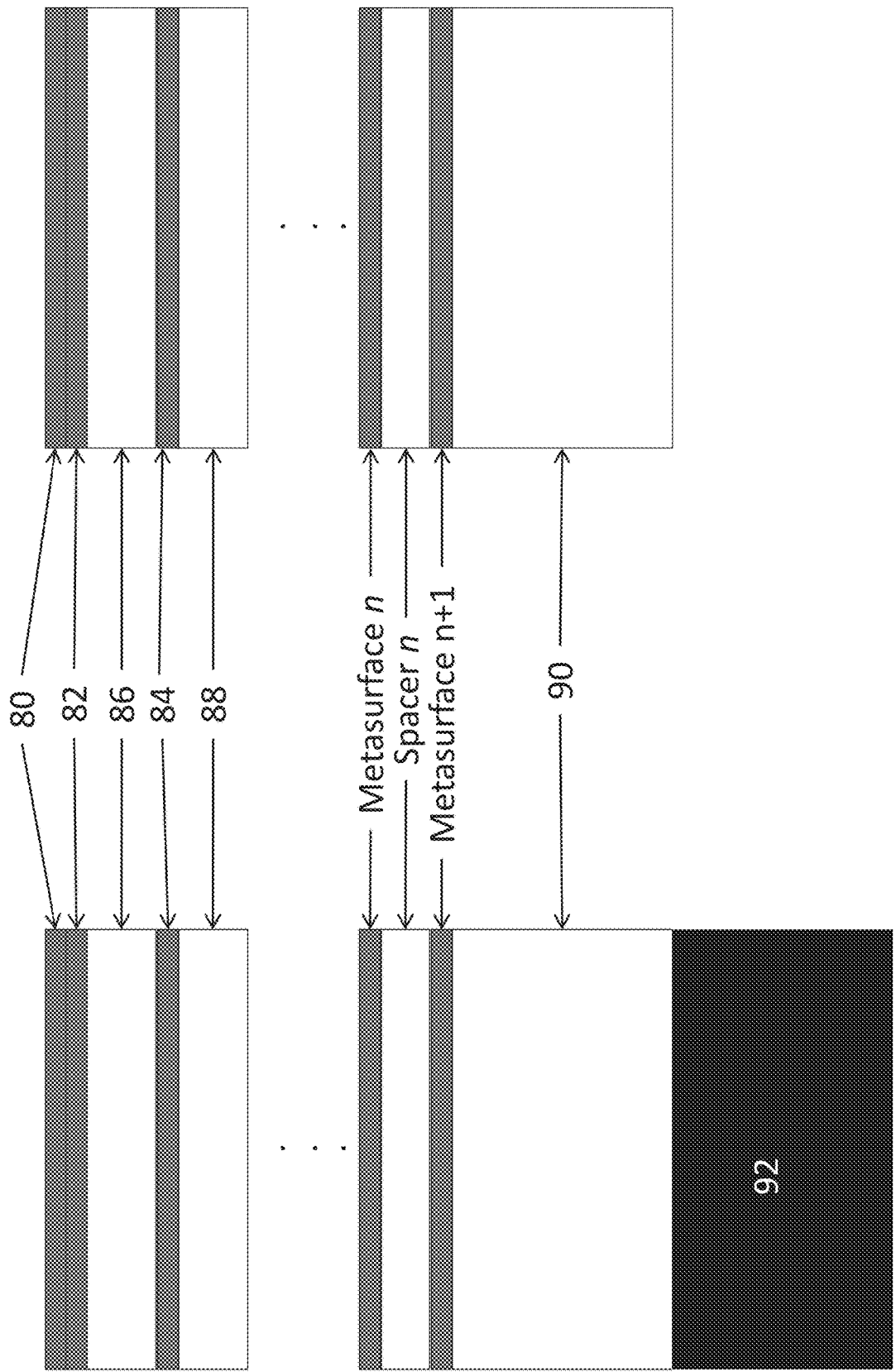
FIG. 8A provides a schematic illustrating metasurface elements incorporating spacers integrated with a sensor/illuminator component in accordance with embodiments of the invention.
FIG. 8B provides a schematic illustrating metasurface elements incorporating spacers in accordance with embodiments of the invention.
Figure 9:
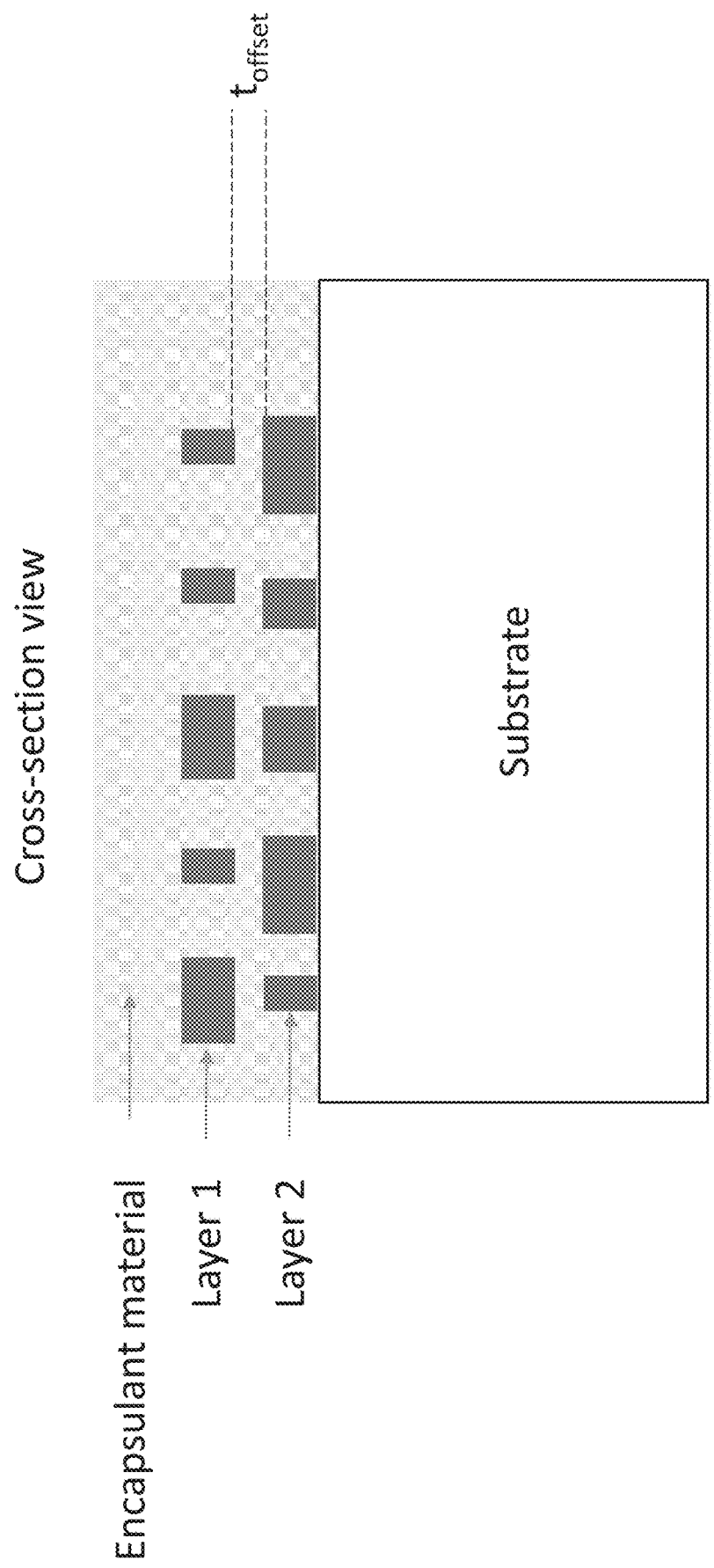
FIG. 9 provides a schematic illustrating a multiple metasurface element substrate in accordance with embodiments of the invention.

In some embodiments, the integration of multiple metasurface elements (two or more, for example), using methods such as those described in FIGS. 7 and 8 allow the combined system to achieve functionality necessary for practical CMOS camera imaging. Specifically, CMOS cameras, (such as those used in cell phones, computers, tablets etc., for collecting images of a scene of visible light or in the infrared for biometric authentication), require the imaging system to have an increased field-of-view (FOV), independent control of the chief ray angle (CRA) as a function of field height at the CMOS image sensor, and minimal optical distortion of the scene being imaged. These terms will be understood to have a meaning conventional to those skilled in the art. For traditional imaging systems, comprised of refractive lenses, as many as five or six unique lenses must be combined to perform this function. Moreover, implementing one metasurface element in such imaging systems does not provide enough degrees of freedom to adequately control these parameters (CRA, FOV and minimizing distortion). However, by combining multiple metasurfaces, each with a unique and independent phase profile, an imaging system with a wide FOV, controllable distortion and controllable CRA can be realized in accordance with embodiments.

Figure 13:
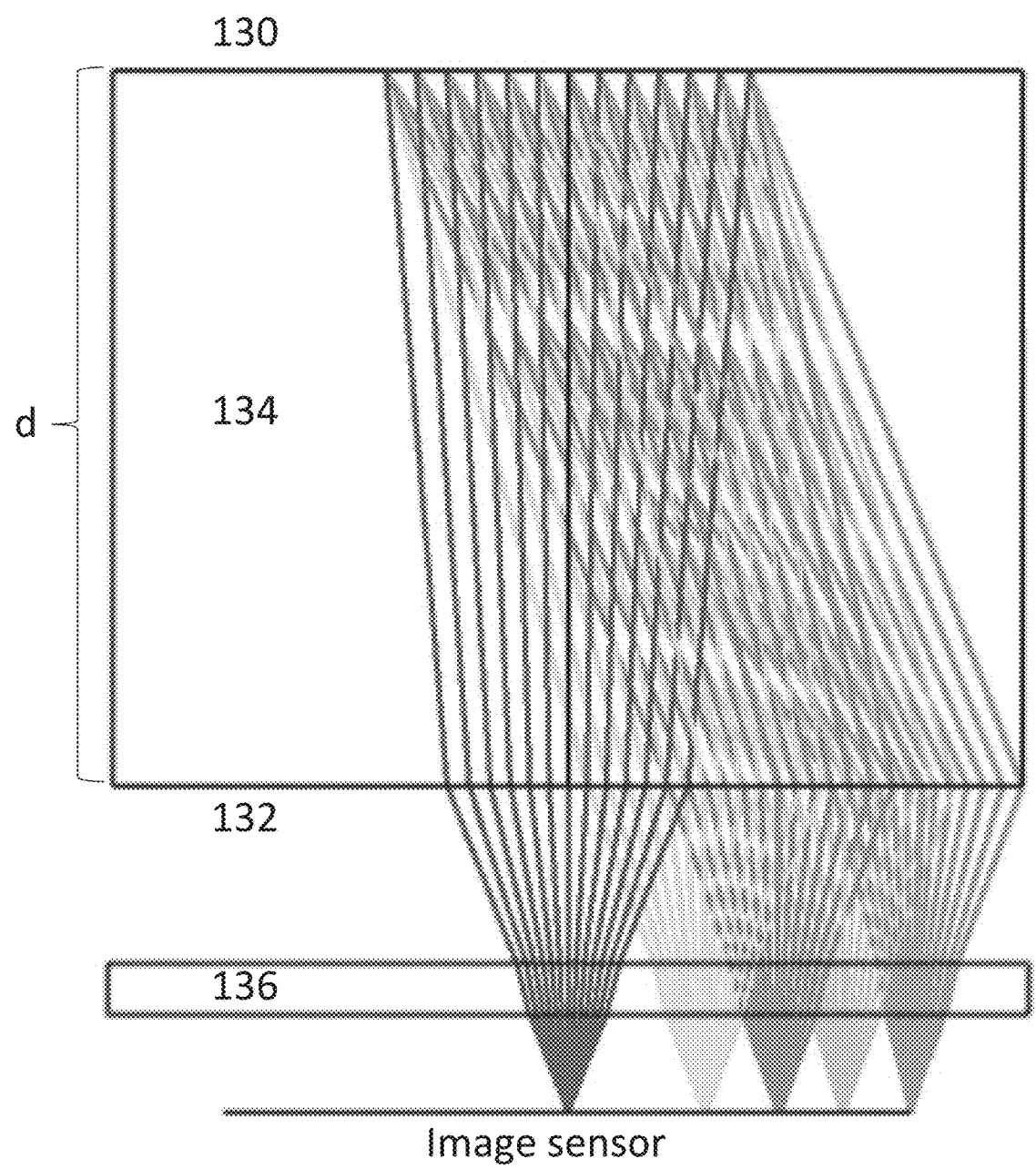
FIG. 13 provides a schematic illustrating a two metasurface element combined with a second element such as a cut filter where the chief-ray-angle of the focused light is 0 degrees with respect to the filter plane in accordance with embodiments of the invention.

Referring to FIG. 13, a ray-tracing diagram through an exemplary embodiment of a system with two metasurface elements (130 & 132) combined on a single substrate (134) in accordance with embodiments is provided. In various such embodiments the metasurface elements on either side of the substrate are formed to have the same height. (Although not described in detail here, it will be understood that these metasurface elements could be fabricated using methods as described in any of the previous figures and combined using processes such as those described in FIG. 5, for example. In many such embodiments the metasurface elements may be formed from films simultaneously deposited on the two sides of the substrate using a suitable conformal deposition process, such as, for example, low pressure chemical vapor deposition or atomic layer deposition.) In this exemplary embodiment, the two metasurface elements have been configured such that in combination they are able to form a good image across a wide FOV (±44 degrees in this example, however, it will be understood that this is not a limiting case). Embodiments of such a two metasurface system, as shown, have been surprisingly found to naturally produce focused rays at the plane of the filter and at the image plane that are telecentric (i.e., having 0 degree CRA). In short, while traditional refractive designs require complex, many-element systems to realize such telecentric designs, in accordance with embodiments only two metasurface elements are needed to achieve similar telecentricity. This telecentricity in turn leads to improved optical properties. In particular, the low (e.g., zero or near zero degree CRA) allows for a narrowing of the bandwidth of the optical filter (136) for narrowband applications. In traditional refractive designs, especially for compact mobile applications, CRAs in are typically on the order of 15 degrees to 30 degrees. These larger CRAs in turn require the filter bandwidth to be significantly increased allowing for more ambient light to enter the detector. In narrowband applications (e.g., a near IR VCSEL array), such ambient light can be a persistent noise source. Thus, embodiments of a combined metasurface/filter system such as that shown in FIG. 13 allow for better ambient light performance.

An additional attribute of embodiments of such a telecentric design is that the metasurface system provides a more uniform illumination at the image sensor (referred to by those in the art as "relative illumination"). Embodiments of the metasurface system also provide an additional design variation with respect to traditional refractive lens systems. Typical CMOS image sensors (CIS) require a microlens to be associated with each pixel. Because there is a large variation in CRA across a given sensor plane that is inherent to refractive optical systems, the microlens array on the CIS also requires a complex CRA specification. However, in embodiments of metasurface systems as described herein, the CRA of the microlens array may be configured to be a constant 0 degrees across the CIS allowing for greater simplicity in the design and fabrication of the microlens array. Alternatively, in certain implementations the microlens array may be completely removed from the CIS, saving a process step in CIS production.

Figure 14:
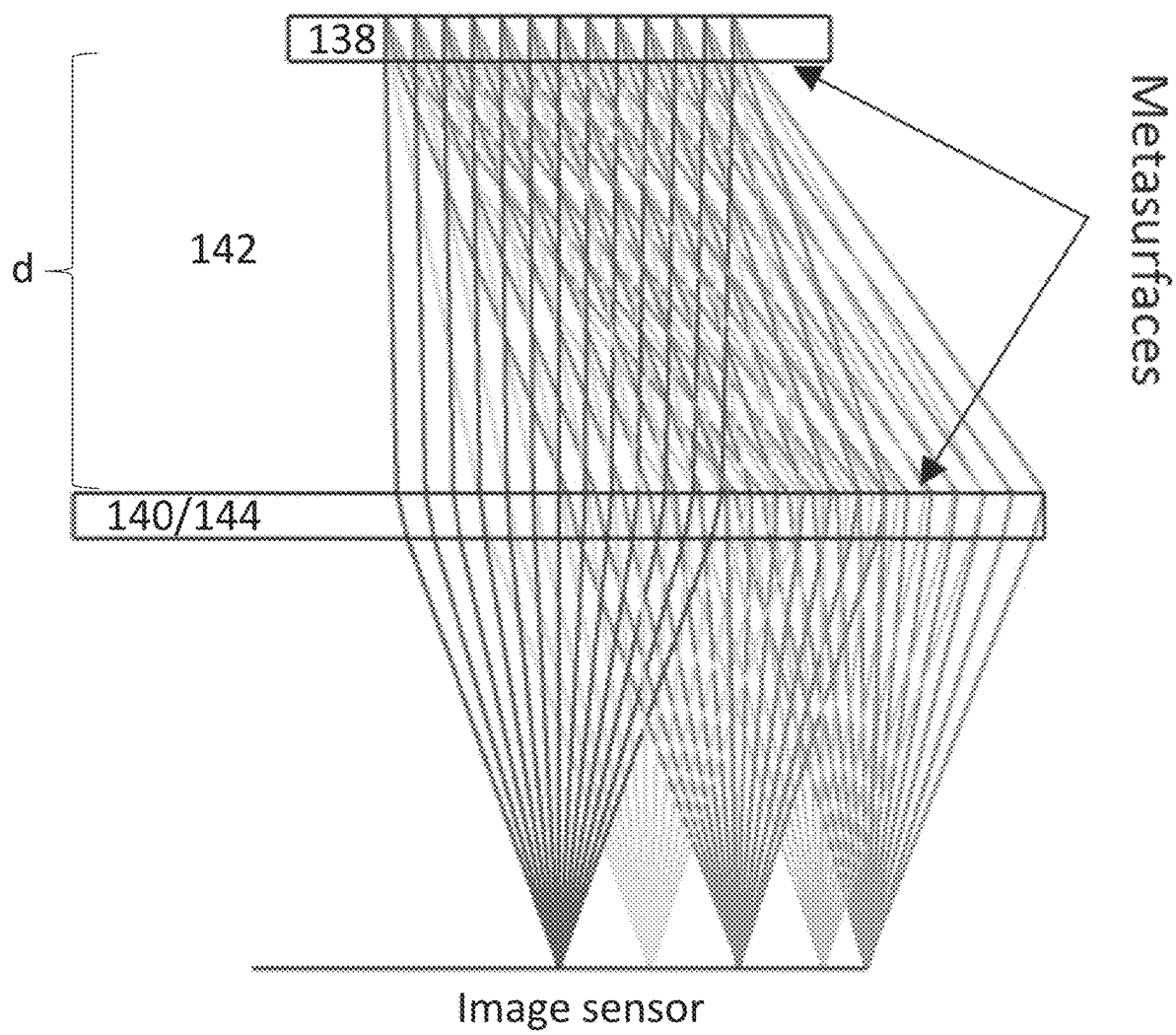
FIG. 14 provides a schematic illustrating a two metasurface element system where each metasurface element is formed on a unique substrate in accordance with embodiments of the invention.

Although the embodiments of metasurface systems for use with CMOS sensors have thus far been shown with two metasurface elements on opposite sides of a single substrate, in various other embodiments the two metasurface elements may be disposed on separate substrates. An exemplary embodiment of such a system is illustrated in FIG. 14. As shown, in many such embodiments the metasurface elements are disposed on two separate substrates (138 & 140) with an air gap (142) disposed between the two elements. One advantage of such embodiments incorporating an air gap is that the light rays can be bent farther over a shorter distance, d, in air than in a glass substrate allowing for a greater widening of the illumination zone with a shorter separation between metasurface elements, thus allowing for a decrease in the overall form factor of the metasurface optical system. As shown in FIG. 14, in various embodiments the metasurface elements are disposed on the air gap (142) facing surfaces of the substrates (138 & 140). Such an implementation allows for the protection of the metasurface elements from environmental contamination. Additionally, such embodiments allow for the outward face of the imager side substrate (140) to remain unpatterned, allowing for the direct integration of an optical filter (144) on the substrate. Although in the embodiments illustrated in FIG. 14 the metasurface elements are arranged to face inward with respect to the air gap between them, it will be understood that they may be disposed on either surface of the two substrates. Production of the metasurface system illustrated in FIG. 15 can follow processes described above, such as, for example, those associated with FIG. 7.

Figure 15:
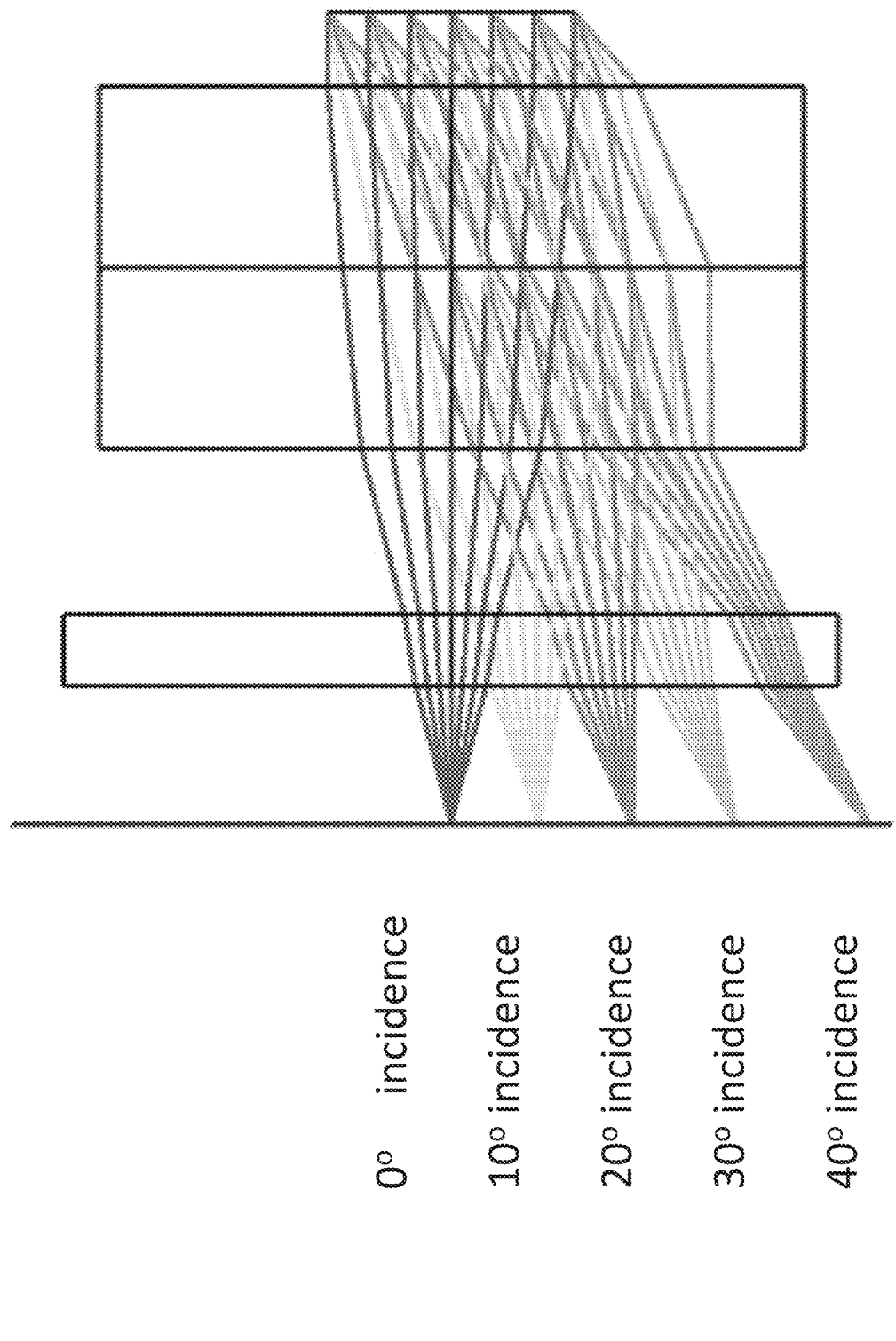
FIG. 15 provides a schematic illustrating a three metasurface element system designed to correct for multiple monochromatic aberrations in accordance with embodiments of the invention.

Although the above discussion has described metasurface systems configured to provide telecentric optical characteristics, in some instances (e.g., where distortion correction is required) it is necessary to introduce a non-zero CRA. Accordingly, embodiments are also directed to metasurface systems comprising at least three metasurfaces capable of controlling for FOV, distortion and CRA simultaneously. A ray-tracing diagram of an exemplary embodiment of a metasurface system comprising three metasurface elements having unique phase profiles is illustrated in FIG. 15. The introduction of the additional metasurface element or elements, each allowing for the realization of a separate arbitrary phase profile, provides more degrees of freedom to control the path of the light rays as compared to a typical system comprised of an equivalent number refractive elements. For example, to duplicate the optical function of a system composed of three metasurfaces, in accordance with embodiments, may require 6-7 refractive optical elements in a conventional system. As such the comparative metasurface system may reduce the overall thickness of such an imaging system by at least 50% while achieving equivalent or even improved performance.

Turning to the metasurface system itself, as shown in FIG. 15 such an imaging system may comprise three or more metasurface elements (150, 152 & 154) disposed on two or more substrates (156 & 158). As previously discussed, these metasurface elements can be comprised of any suitable dielectric material, especially those that have minimal absorption at the wavelength of interest. As shown, in various embodiments the first two metasurface elements (150 & 152) may impart a telecentric optical character on the incoming light, while the third metasurface (154)(e.g., the closest to the filter (156) and imager may impart a further spreading or bending to the light thus imparting non-zero CRA to the light impacting the imager. Although a specific arrangement of metasurface elements and substrates is shown in the system illustrated in FIG. 15, such a diagram is meant to serve as an example and does not limit the current disclosure to this exact system response. Regardless of the specific arrangement of elements, fabrication of such a metasurface element can follow the processes described above, such as, for example, that shown and described in relation to FIG. 6.

Figure 16:
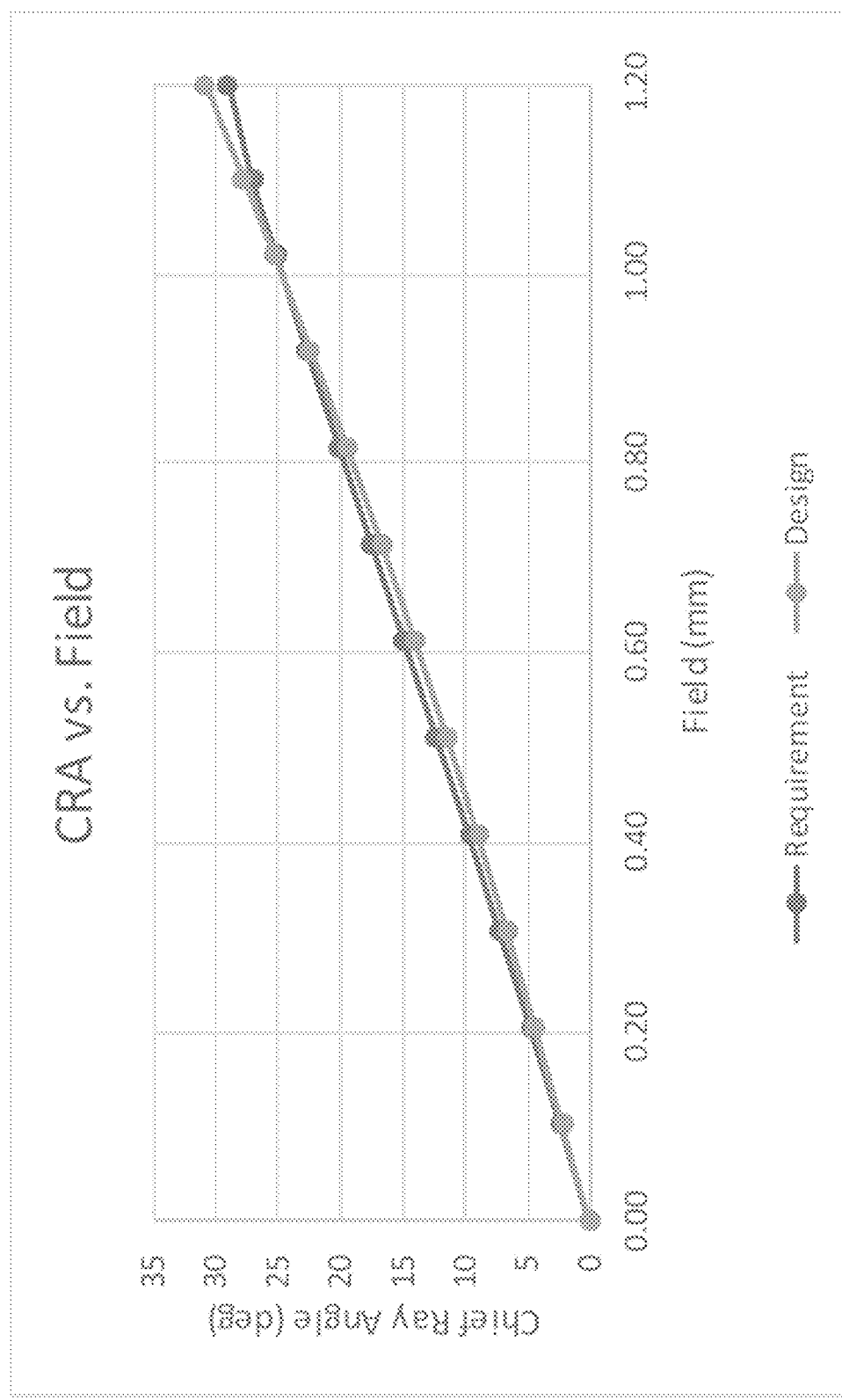
FIG. 16 provides a schematic illustrating the chief ray angle at the image sensor plane as a function of image height for the metasurface element system of FIG. 15 in accordance with embodiments of the invention.
Figure 17:
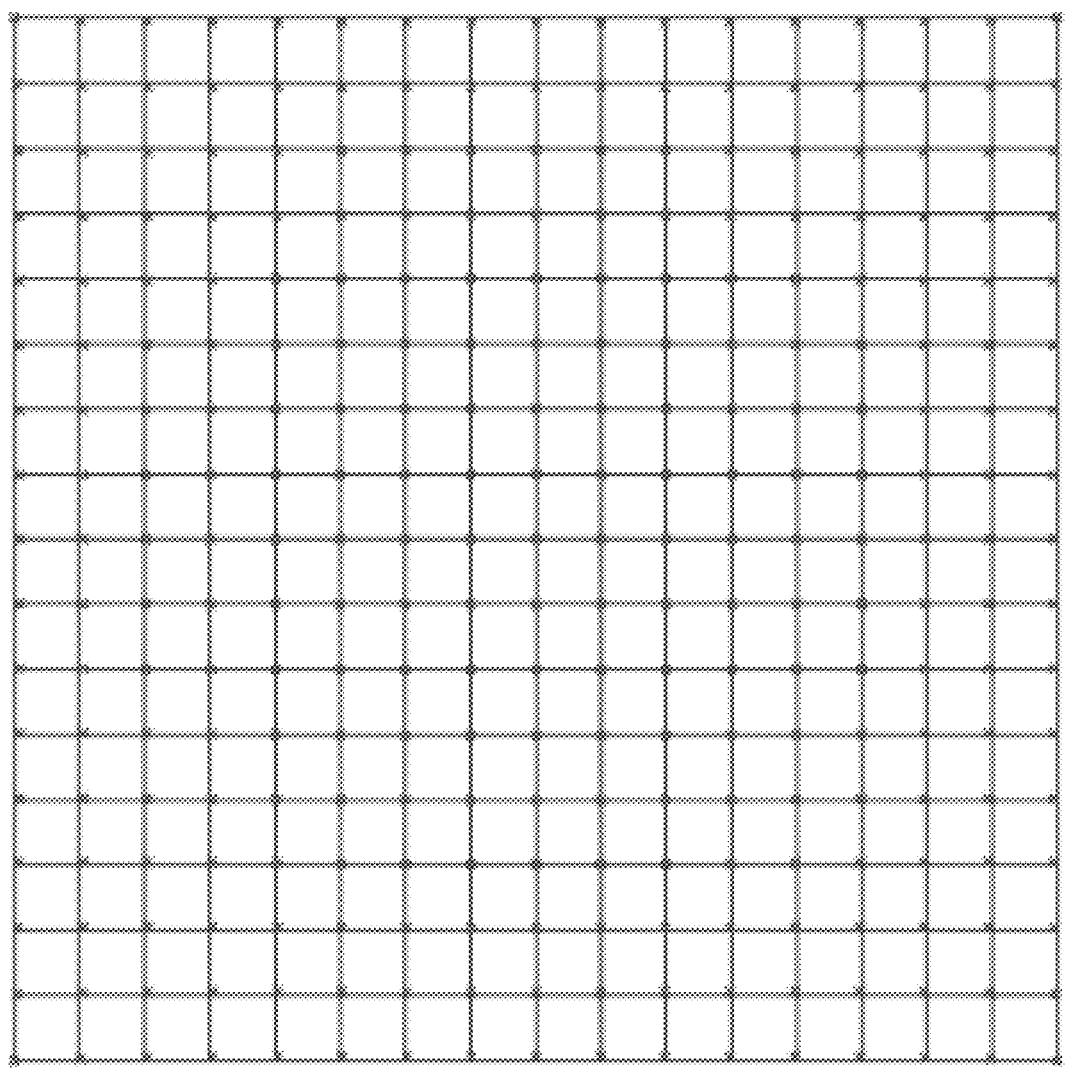
FIG. 17 provides a schematic illustrating an example of grid distortion from the metasurface element system of FIG. 15 in accordance with embodiments of the invention.

Using such three metasurface element systems according to embodiments, it is possible to control CRA and thus minimize grid distortion in CMOS image sensors. For example, FIG. 16 provides a data plot illustrating the resulting control of the CRA as a function of field height at the CMOS image sensor for an imaging system based on the embodiment shown in FIG. 15. This is an exemplary case and the control of the CRA as a function of field height can take on other functional forms rather than the linear case shown below. Similarly, FIG. 17 provides a grid distortion plot for an imaging system based on the embodiment shown in FIG. 15. As shown, embodiments of such an imaging system allows for the minimization of grid distortion to less than 5% over the entire FOV of the imaging system.

Embodiments for Incorporating Metasurface Elements into Imaging/Sensing Systems

Figure 18:
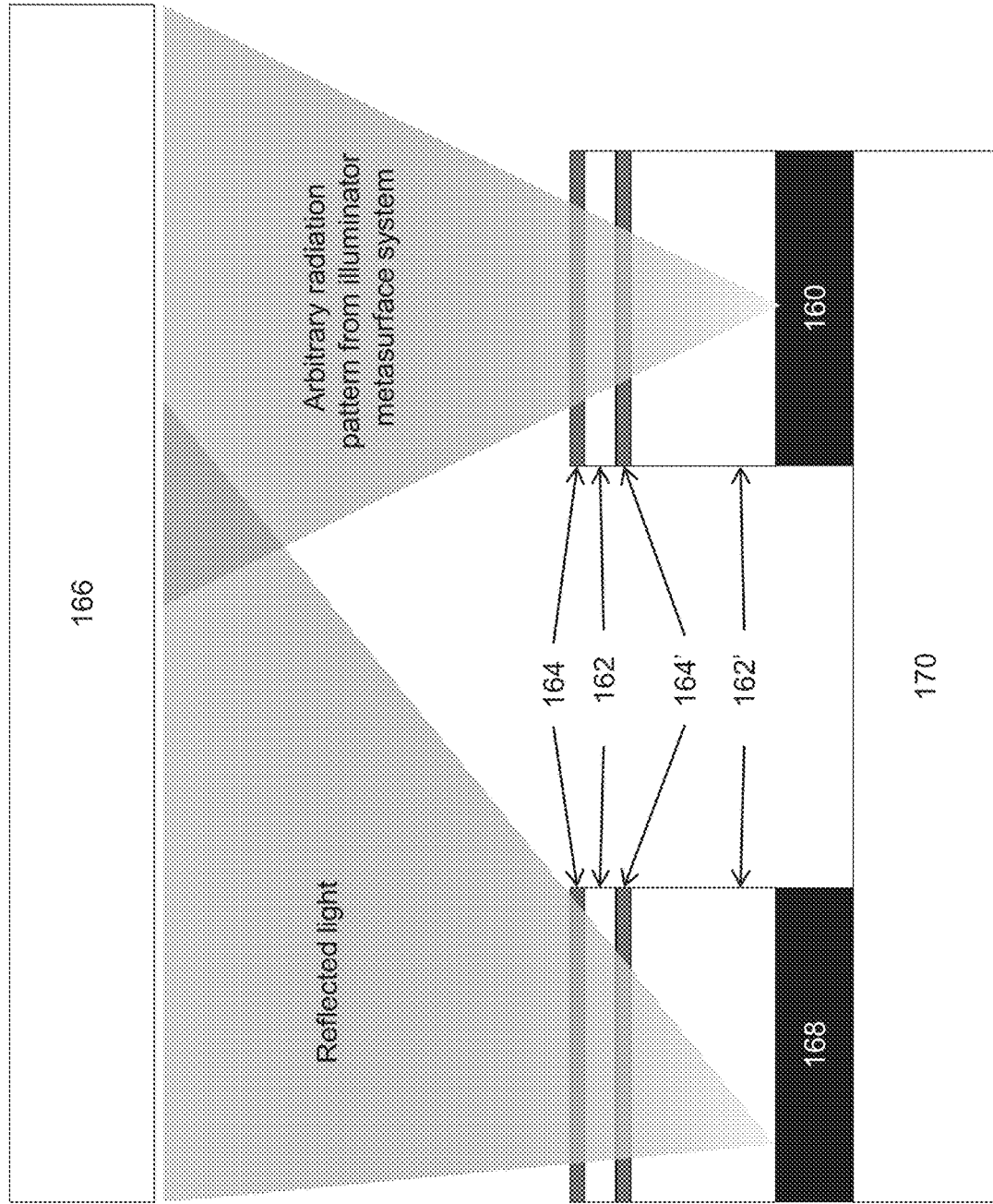
FIG. 18 provides a schematic illustrating an integrated system with metasurface elements on the illuminators and detectors in accordance with embodiments of the invention.

Given the advantages described of using metasurface elements according to embodiments on both sensing optics and on projection optics, various embodiments are directed to metasurface systems configured for use in a combined illumination-sensing module. Referring to FIG. 18, a schematic of an integrated illuminator and sensor system according to embodiments is provided. As shown, in such embodiments an illuminator (160) having a plurality of spacers (162 & 162') and metasurface elements (164 and 164'), either alone or in combination with refractive elements configured therewith to provide a specific radiation pattern is used to illuminate some object or scene (166). A sensor (168) (e.g., a CMOS image sensor) with a corresponding metasurface system is used to detect the radiation or from an image of the scene. In such embodiments, the overall system—metasurface elements (162 & 162'), sensor (168), illuminator (160)—may be configured to operate over some particular bandwidth or at a specific wavelength of interest and may be combined onto a single platform (170). The illuminator and sensor metasurface elements (162 & 162') may be configured to work an any polarization of the electric field. Embodiments of such combined systems may be used on a computer, a cell phone, a television monitor, a wall-mounted unit, a credit card, tablet, mirror etc.

Figure 19:
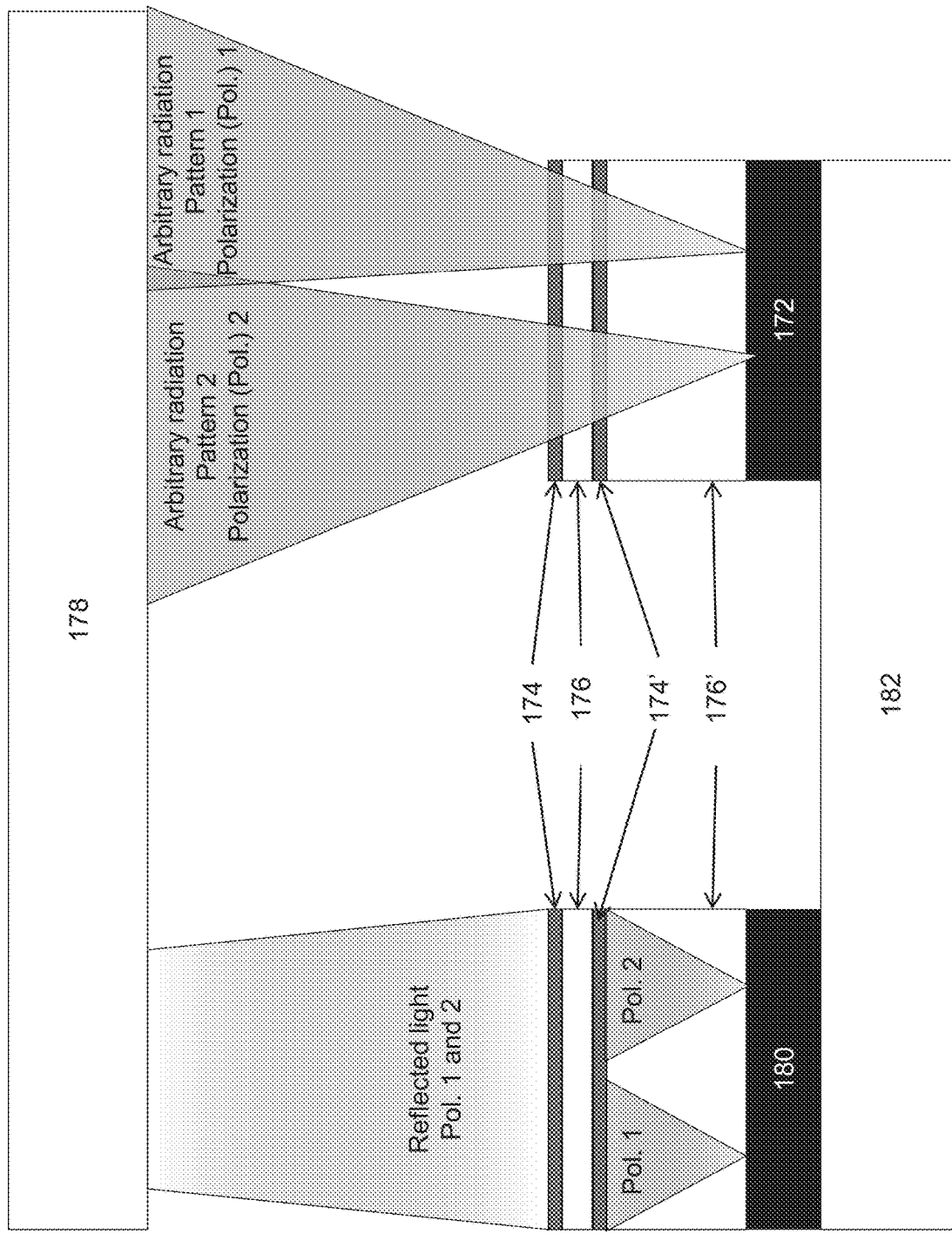
FIG. 19 provides a schematic illustrating an integrated system with metasurface elements on the illuminators and detectors where the polarization of light provides an extra degree of freedom in accordance with embodiments of the invention.

As discussed above in relation to FIGS. 12A to 12C, metasurfaces also allow unique functionality to be imprinted on two orthogonal polarizations. Thus, various embodiments of metasurface illuminator-sensing systems can also be co-designed taking polarization as an additional optimization variable. Referring to FIG. 19, a schematic of an integrated illuminator system that also acts on the polarization of the radiation field is provided. As shown, in one such exemplary embodiment, an illuminator (172) with one or more metasurface elements (174 & 174') along with suitable spacers (176 & 176') an optional refractive elements is used to illuminate a scene or object (178). The metasurface elements in such embodiments have been designed such that for any two orthogonal polarizations of light, two unique and independent radiation patterns can be produced. A sensor (180) with a corresponding set of metasurface elements is used to collect the light reflected from the scene. As shown, the illuminator and sensor metasurface elements have been configured to work cooperatively such that the two orthogonal polarizations used to produce the radiation pattern form two unique images on the sensor. The system—metasurfaces (174 & 174'), sensor (180), illuminator (172)—according to embodiments may be optimized for operation over some bandwidth or at a specific wavelength of interest and may be combined onto a single platform (182). It will be understood that the illuminator and sensor metasurface elements in accordance with embodiments may be configured to work an any polarization of the electric field. The combined system according to embodiments may be used on a computer, a cell phone, a television monitor, a wall-mounted unit, a credit card, tablet, mirror etc.

Embodiments of Metasurface Element Material Systems

As previously discussed, each individual metasurface element in any optical system, whether there be one or many metasurface elements comprising the system, has some specific 2D phase and transmission function, $\phi(x, y)$ and $t(x, y)$, that it carries out. While in general each metasurface element may have a unique distribution of phase and transmission, the nanostructure features that comprise any metasurface element embedded in the same material, with the same base composition, and at a specific wavelength are identical. In most practical single wavelength applications, the transmission is desired to be maximized (near 1) and uniform across the metasurface while the phase need only take on values between 0 and $2\pi$. In summary, for some wavelength of interest, material system (metasurface material and embedding material), fixed thickness and element spacing, one need only find a set of in-plane dimensions of the comprising nanostructure features such that phase delays from 0 to $2\pi$ can be imprinted on an incident light field. Thus for various embodiments of metasurface element designs at the fixed material and wavelength conditions, the only variable from design to design is the distribution of those nanostructure features across the metasurface element. Accordingly, various embodiments of metasurface element material conditions suitable for performing specific optical functions over desired wavelength ranges are described. Although the following discussion sets forth embodiments of metasurface elements and systems, and processes for fabricating such metasurface elements and systems. It will be understood that the following embodiments are provided only for exemplary purposes and are not meant to be limiting.

Figure 20:
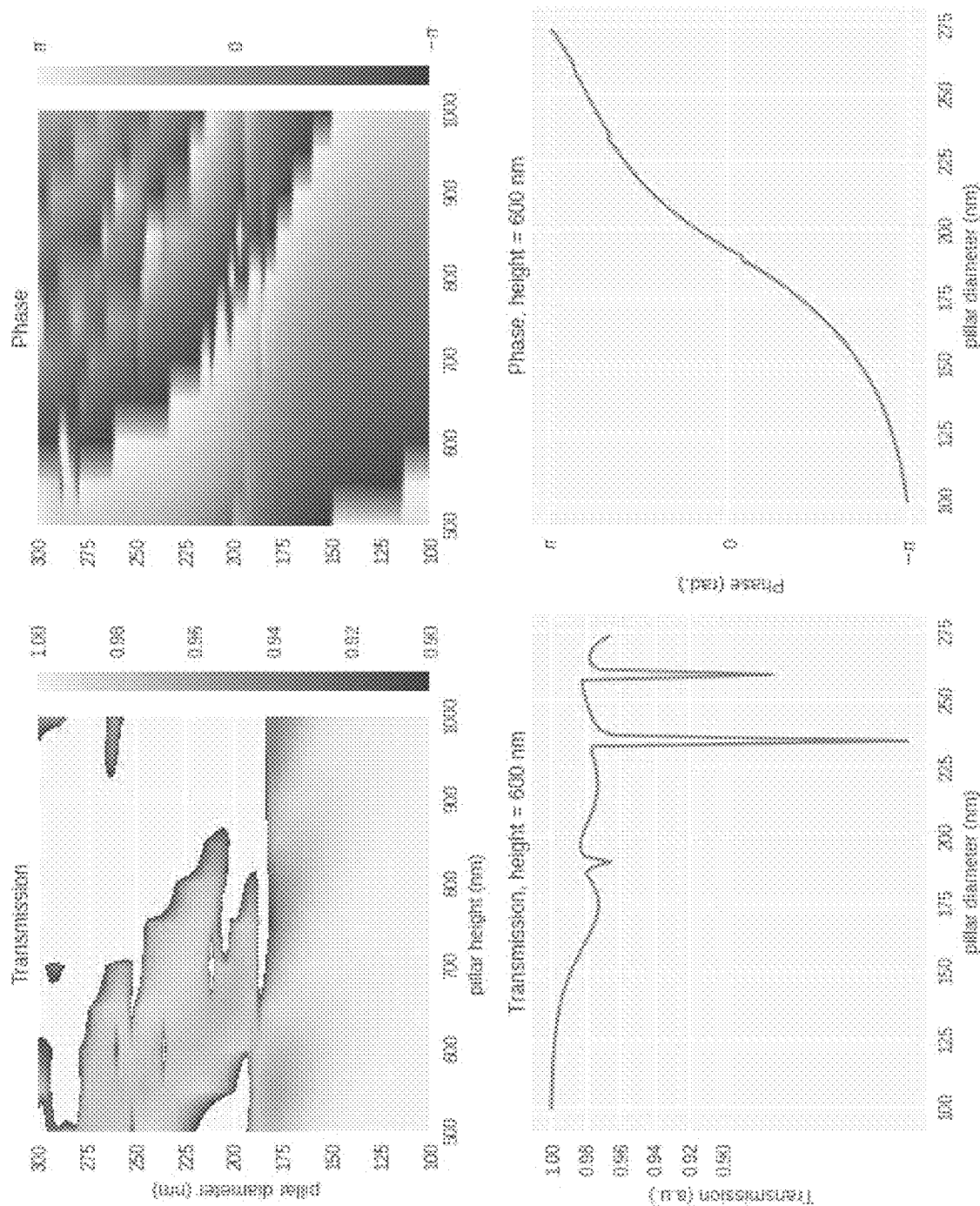
FIG. 20 provides data graphs showing the phase and transmission response of metasurface features comprising cylindrical pillars composed of amorphous silicon embedded in $SiO_2$ in accordance with embodiments of the invention.

Referring to FIG. 20, phase and transmission maps for embodiments of metasurface elements comprising silicon pillars embedded in $SiO_2$ are provided. The top left diagram provides a heat map of transmission as a function of pillar diameter and height, color scale shown to the right. The top right diagram provides a phase map as a function of pillar diameter and height. The bottom left provides a diagram of a line scan of transmission as a function of pillar diameter at a fixed height of 600 nm. The bottom right provides a diagram of a line scan of relative phase as a function of pillar diameter for a fixed height of 600 nm. It will be understood that using these diagrams it is possible to determine a specific set pillar diameters and heights for a specific transmission and phase across all suitable wavelengths in accordance with embodiments, and also specific diameters for a height of 600 nm. In many embodiments, the pillar height may vary from 500 to 1000 nm and the pillar diameter from 100 to 300 nm. In various other embodiments, the pillar diameter may vary from 100 to 200 nm, and the pillar height from 500 to 800 nm. In various other embodiments at a pillar height of 600 nm, the pillar diameter may vary from between 100 to 300 nm. The specific heights and diameters represent a local optimum for the transmission of the elements but other pillar heights may be used in embodiments as required by the design of the specific optical system.

Figure 21:
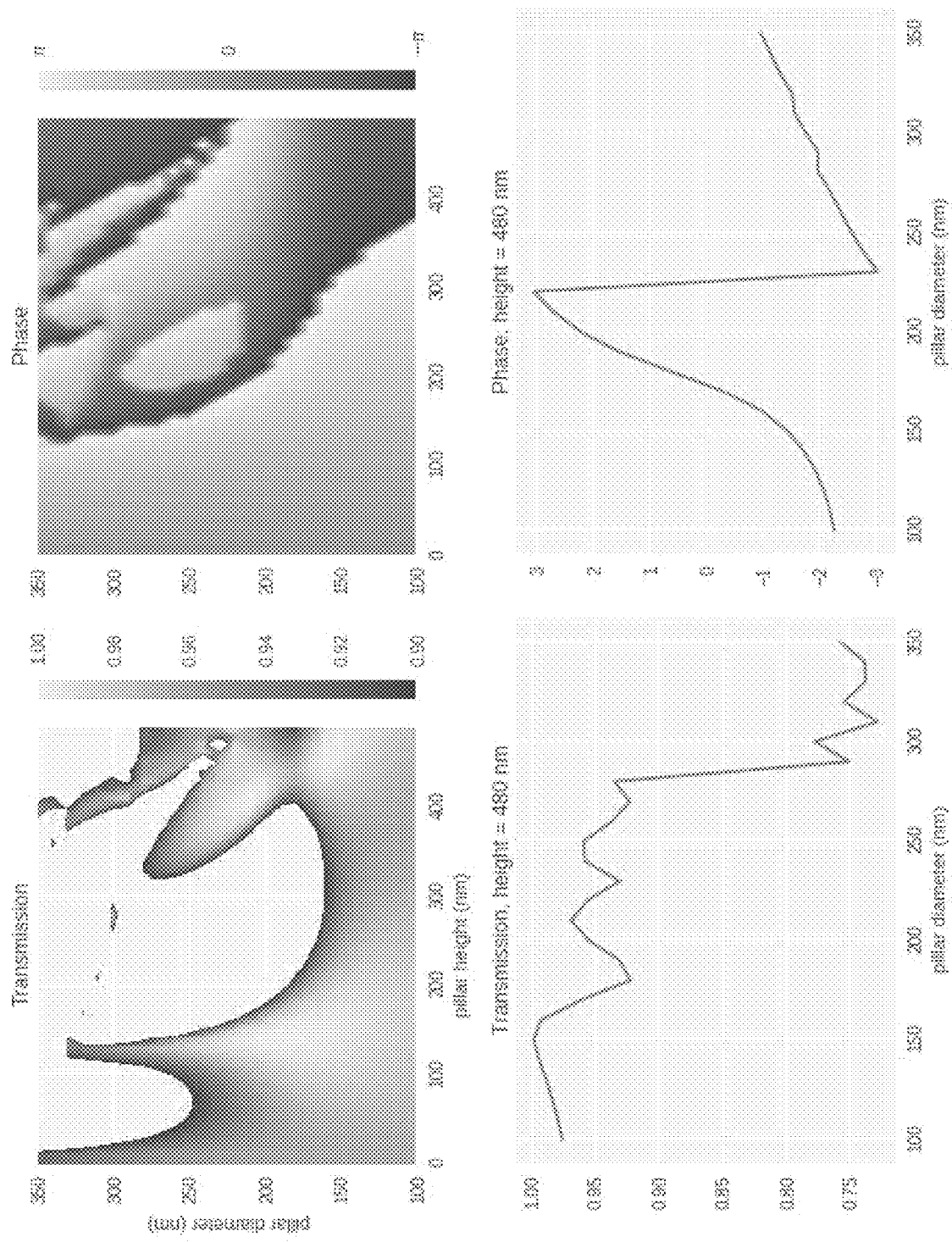
FIG. 21 provides data graphs showing the phase and transmission response of metasurface features comprising cylindrical pillars composed of amorphous silicon in air in accordance with embodiments of the invention.

Referring to FIG. 21, phase and transmission maps for embodiments of metasurface elements comprising silicon pillars in air are provided. The top left diagram provides a heat map of transmission as a function of pillar diameter and height, color scale shown to the right. The top right diagram provides a phase map as a function of pillar diameter and height. The bottom left provides a line scan of transmission as a function of pillar diameter at a fixed height of 480 nm. The bottom right provides a line scan of relative phase as a function of pillar diameter for a fixed height of 480 nm. It will be understood that using these diagrams it is possible to determine a specific set pillar diameters and heights for a specific transmission and phase across all suitable wavelengths in accordance with embodiments, and also specific diameters for a height of 480 nm. In many embodiments, the pillar height may vary from ~1 to 500 nm and the pillar diameter from 100 to 350 nm. In various other embodiments, the pillar diameter may vary from 100 to 250 nm, and the pillar height from 150 to 500 nm. In various other embodiments at a pillar height of 480 nm, the pillar diameter may vary from between 100 to 280 nm. The specific heights and diameters represent a local optimum for the transmission of the elements but other pillar heights may be used in embodiments as required by the design of the specific optical system.

Figure 22:
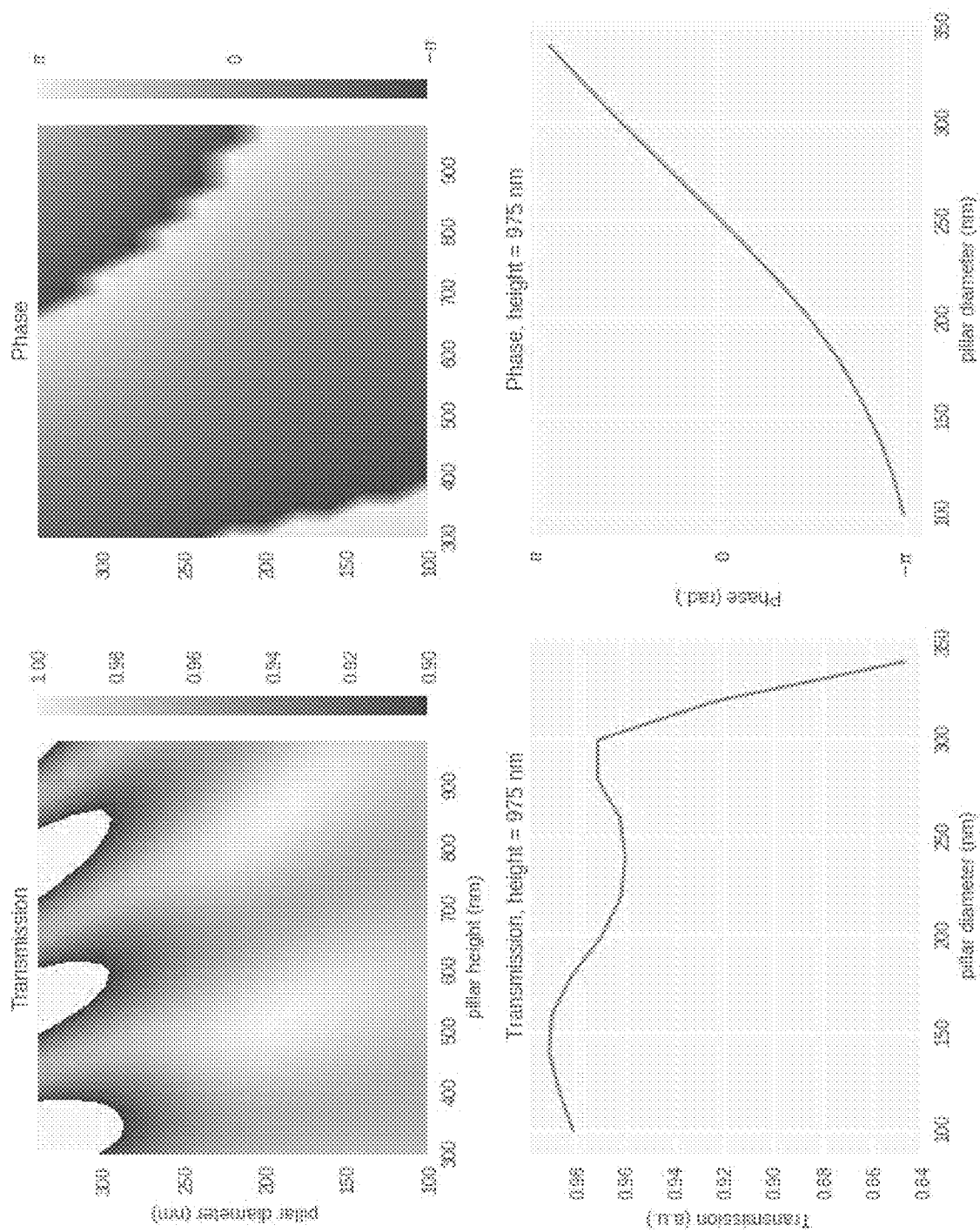
FIG. 22 provides data graphs showing the phase and transmission response of metasurface features comprising cylindrical pillars composed of amorphous $TiO_2$ in air in accordance with embodiments of the invention.

Referring to FIG. 22, phase and transmission maps for embodiments of metasurface element comprising $TiO_2$ pillars in air are provided. The top left diagram provides a heat map of transmission as a function of pillar diameter and height, color scale shown to the right. The top right diagram provides a phase map as a function of pillar diameter and height. The bottom left diagram provides a line scan of transmission as a function of pillar diameter at a fixed height of 975 nm. The bottom right provides a line scan of relative phase as a function of pillar diameter for a fixed height of 975 nm. It will be understood that using these diagrams it is possible to determine a specific set pillar diameters and heights for a specific transmission and phase across all suitable wavelengths in accordance with embodiments, and also specific diameters for a height of 975 nm. In many embodiments, the pillar height may vary from 300 to 1000 nm and the pillar diameter from 100 to 350 nm. In various other embodiments, the pillar diameter may vary from 100 to 300 nm, and the pillar height from 300 to 400 nm and/or 700 to 1000 nm. In various other embodiments at a pillar height of 975 nm, the pillar diameter may vary from between 100 to 300 nm. The specific heights and diameters represent a local optimum for the transmission of the elements but other pillar heights may be used in embodiments as required by the design of the specific optical system.

Figure 23:
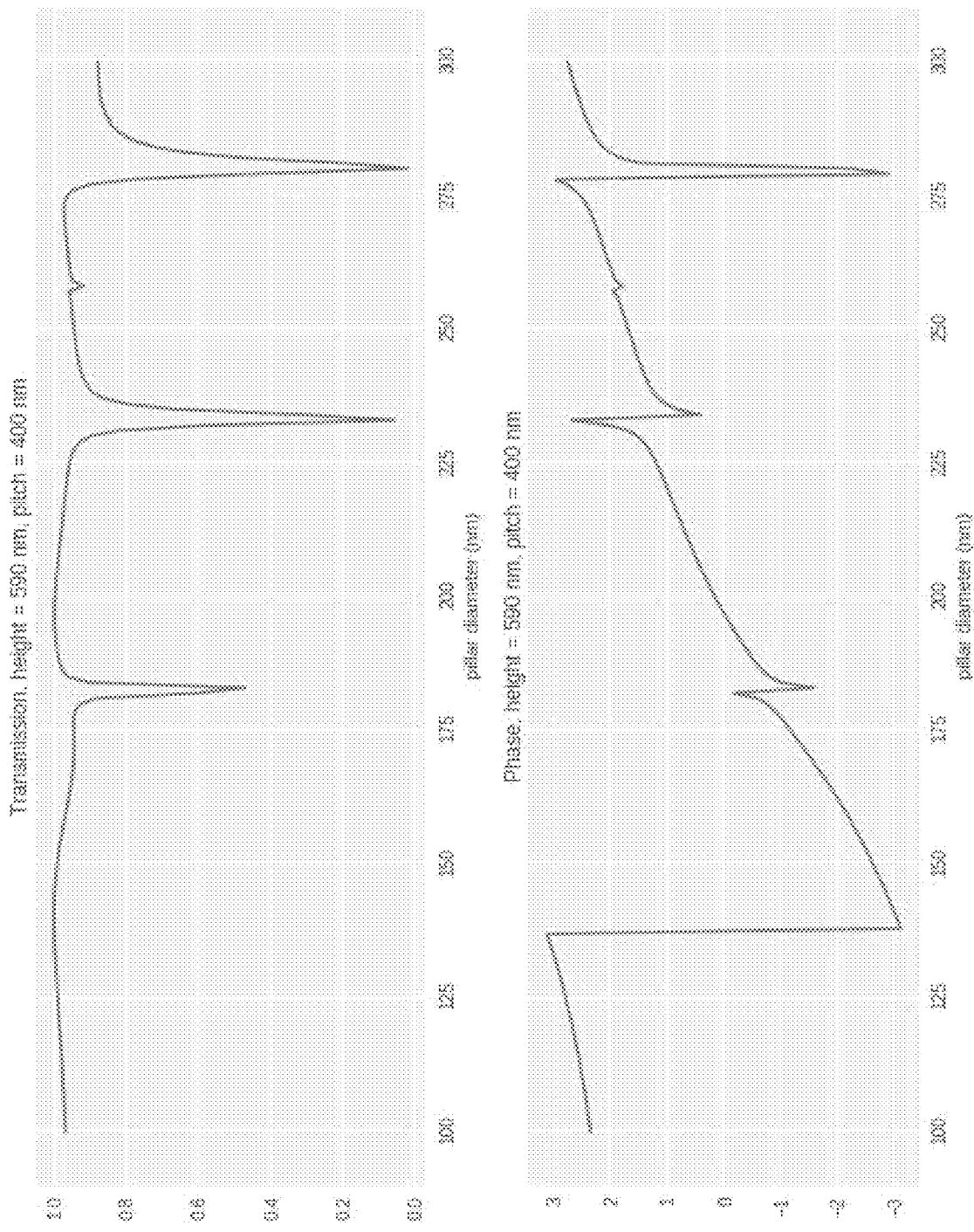
FIG. 23 provides data graphs showing the phase and transmission response of metasurface features comprising cylindrical pillars composed of amorphous silicon encapsulated in polymer for a wavelength of 850 nm in accordance with embodiments of the invention.

Referring to FIG. 23, phase and transmission maps for embodiments of metasurface elements comprising amorphous silicon pillars embedded in a benzocyclobutane (BCB) polymer are provided. The top diagram provides a line scan of transmission as a function of pillar diameter at a fixed height of 590 nm and element period of 400 nm. The bottom diagram provides a line scan of phase as a function of pillar diameter at a fixed height of 590 nm and element period of 400 nm. It will be understood that using these diagrams it is possible to determine a specific set pillar diameters and heights for a specific transmission and phase across all suitable wavelengths in accordance with embodiments, and also specific diameters for a height of 590 nm. In many embodiments, at a pillar height of 975 nm, the pillar diameter may vary from between 100 to 300 nm. In various other embodiments, the pillar diameter made vary from 100 to 225 nm. The specific heights represent a local optimum for the transmission of the elements but other pillar heights may be used as required by the design of the specific optical system.

Figure 24:
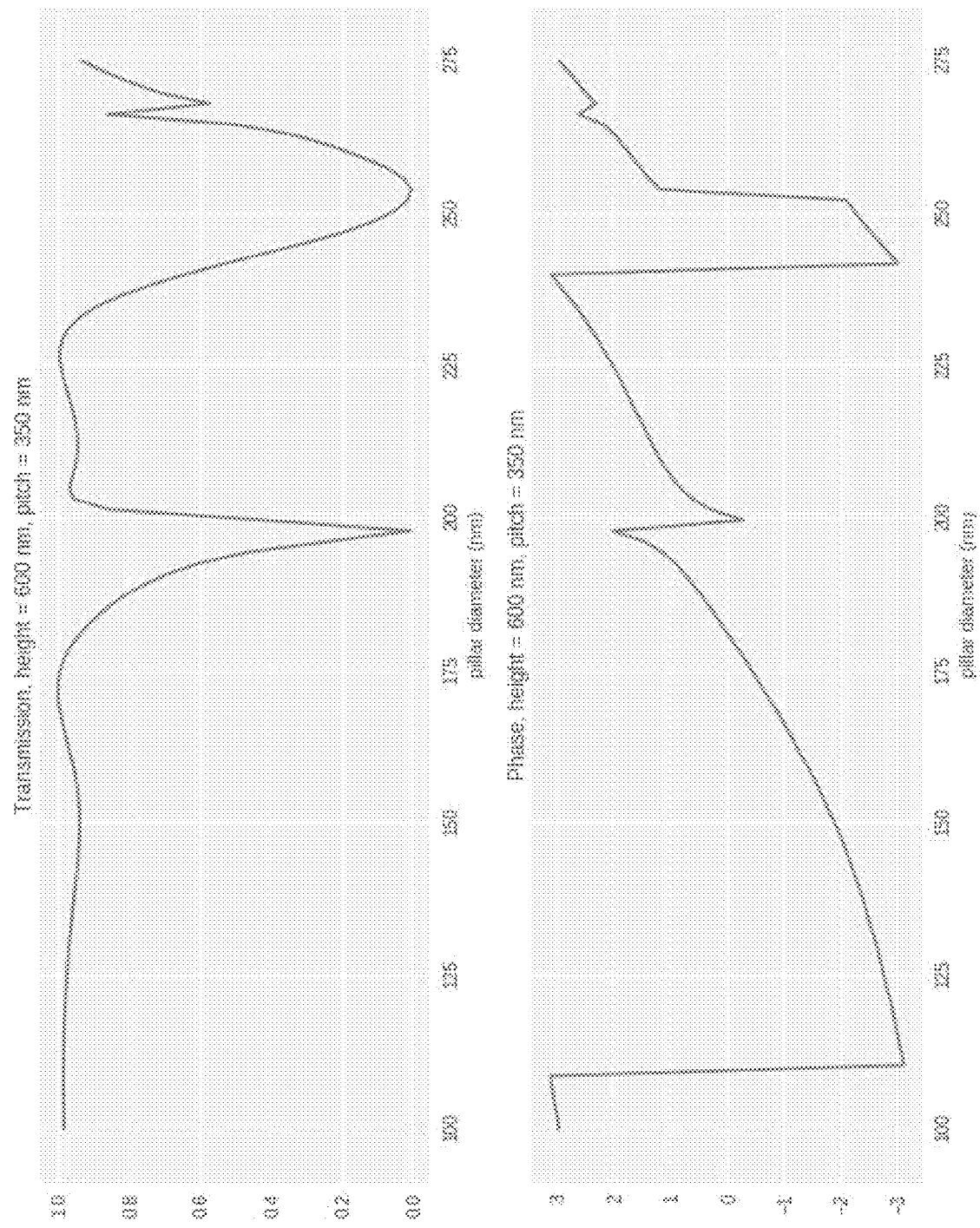
FIG. 24 provides data graphs showing the phase and transmission response of metasurface features comprising cylindrical pillars composed of Si encapsulated in $SiO_2$ for a wavelength of 850 nm in accordance with embodiments of the invention.

Referring to FIG. 24, phase and transmission maps for embodiments of metamaterial elements comprising amorphous silicon pillars embedded in a silicon dioxide are provided. The top diagram provides a line scan of transmission as a function of pillar diameter at a fixed height of 600 nm and element period of 350 nm. The bottom diagram provides a line scan of phase as a function of pillar diameter at a fixed height of 600 nm and element period of 350 nm. It will be understood that using these diagrams it is possible to determine a specific set pillar diameters and heights for a specific transmission and phase across all suitable wavelengths in accordance with embodiments, and also specific diameters for a height of 600 nm. In many embodiments, at a pillar height of 600 nm, the pillar diameter may vary from between 100 to 275 nm. In various other embodiments, the pillar diameter made vary from 100 to 175 nm. The specific heights represent a local optimum for the transmission of the elements but other pillar heights may be used as required by the design of the specific optical system.

In other embodiments tests were also conducted on amorphous-Si metasurface features embedded in SU8, and it was found such surfaces having a pillar height of 675 nm and a pillar diameter from 100 to 300 nm are suitable for use. In addition, amorphous-Si metasurface features in air having a pillar height of 600 nm and a pillar diameter from 100 to 300 nm with an element spacing of 450 nm may be suitable in accordance with various embodiments.

Although specific combinations of metamaterials and embedding materials are described above, it will be understood that similar maps of metasurface feature, transmissivity and phase may be made in accordance with embodiments of the invention.

DOCTRINE OF EQUIVALENTS

Accordingly, although the present invention has been described in certain specific aspects, many additional modifications and variations would be apparent to those skilled in the art. It is therefore to be understood that the present invention may be practiced otherwise than specifically described. Thus, embodiments of the present invention should be considered in all respects as illustrative and not restrictive.

What is claimed is:

1. An illumination device comprising:
   a vertical cavity surface emitting laser (VCSEL) array; and
   a plurality of metasurface elements arranged in a planar array such that light emitted from the VCSEL array passes through the planar array of metasurface elements,
   wherein the plurality of metasurface elements are disposed on a substrate,
   wherein the plurality of metasurface elements, the VCSEL array, and the substrate form an integrated structure with the VCSEL array on an opposite side of the substrate from the plurality of metasurface elements, and
   wherein the planar array of metasurface elements collimates light from the VCSEL array and multiplies the light from the VCSEL array in the far field.

2. The illumination device of claim 1, wherein the focal length of the planar array of metasurface elements is equal to the distance from the top of the VCSEL array to planar array of metasurface elements.

3. The illumination device of claim 1, wherein the metasurface elements comprise amorphous silicon and the VCSEL array is operating at a wavelength of 940 nm.

4. The illumination device of claim 1, wherein the collimated light from the lens is telecentric across the planar array of metasurface elements.

5. An illumination device comprising:
   a vertical cavity surface emitting laser (VCSEL) array emitting light comprising a first polarization and a second polarization; and
   a plurality of metasurface elements arranged in a planar array such that the light emitted from the VCSEL array passes through the planar array of metasurface elements,
   wherein the plurality of metasurface elements are disposed on a substrate,
   wherein the light from the VCSEL array having the first polarization passing through the planar array of metasurface elements produces a first dot pattern,
   wherein the light from the VCSEL array having the second polarization passing through the planar array of metasurface elements produces a second dot pattern,
   wherein the first dot pattern is denser in the far field than the second dot pattern, and
   wherein the planar array of metasurface elements collimates light from the VCSEL array with equal focal length for the first dot pattern and the second dot pattern.

6. The illumination device of claim 5, wherein the focal length of the planar array of metasurface elements is equal to the distance from the top of the VCSEL array to planar array of metasurface elements.

7. The illumination device of claim 5, wherein the metasurface elements comprise amorphous silicon and the VCSEL array is operating at a wavelength of 940 nm.

8. The illumination device of claim 5, wherein the collimated light from the planar array of metasurface elements is telecentric across the planar array of metasurface elements.

9. The illumination device of claim 5, wherein the first dot pattern is randomly distributed and the second dot pattern is spaced on an equal grid.

10. An illumination device comprising:
a vertical cavity surface emitting laser (VCSEL) array emitting light comprising a first polarization and a second polarization; and
a plurality of metasurface elements arranged in a planar array such that light emitted from the VCSEL array passes through the planar array of metasurface elements,
wherein the plurality of metasurface elements are disposed on a substrate,
wherein the light from the VCSEL array having the first polarization through the planar array of metasurface elements produces a first dot pattern,
wherein the light from the VCSEL array having the second polarization passing through the planar array of metasurface elements produces a second dot pattern, and
wherein the first dot pattern has a narrower field of illumination than the second dot pattern.

11. The illumination device of claim 10, wherein, in the first dot pattern and the second dot pattern, the field of illumination is controlled by the number of dots in the first dot pattern and the second dot pattern but the collimation functionality is substantially identical.

12. The illumination device of claim 10, wherein the first dot pattern is randomly distributed and the second dot pattern is spaced on an equal grid.

13. The illumination device of claim 10, wherein the focal length of the planar array of metasurface elements is equal to the distance from the top of the VCSEL array to planar array of metasurface elements.

14. The illumination device of claim 10, wherein the metasurface elements comprise amorphous silicon and the VCSEL array is operating at a wavelength of 940 nm.

15. The illumination device of claim 10, wherein the collimated light from the planar array of metasurface elements is telecentric across the planar array of metasurface elements.

16. The illumination device of claim 10, wherein the second dot pattern has an equivalent dot pattern at an offset to the first dot pattern so that the neighboring dots of the first dot pattern and the second dot pattern in the illuminated field have orthogonal polarizations.

17. An illumination device comprising:
a vertical cavity surface emitting laser (VCSEL) array emitting light comprising a first polarization and a second polarization; and
a plurality of metasurface elements arranged in a planar array such that light emitted from the VCSEL array passes through the planar array of metasurface elements,
wherein the plurality of metasurface elements are disposed on a substrate,
wherein the light from the VCSEL array having the first polarization passing through the planar array of metasurface elements produces a dot pattern in the far field,
wherein the light from the VCSEL array having the second polarization passing through the planar array of metasurface elements produces arbitrary radiation pattern with an angle-dependent intensity in the far field, and
wherein the planar array of metasurface elements collimates light with equal focal length for both the first polarization light and the second polarization light.

18. The illumination device of claim 17, wherein the focal length of the planar array of metasurface elements is equal to the distance from the top of the VCSEL array to planar array of metasurface elements.

19. The illumination device of claim 17, wherein the metasurface elements comprise amorphous silicon and the VCSEL array is operating at a wavelength of 940 nm.

20. The illumination device of claim 17, wherein the collimated light from the planar array of metasurface elements is telecentric across the planar array of metasurface elements.

21. The illumination device of claim 17, wherein the arbitrary radiation pattern has a batwing pattern, top hat pattern, or super-gaussian pattern.

22. The illumination device of claim 1, wherein the light from the VCSEL array comprises a first polarization and a second polarization, and wherein the first polarization is orthogonal to the second polarization.

23. The illumination device of claim 5, wherein the first polarization is orthogonal to the second polarization.

24. The illumination device of claim 10, wherein the first polarization is orthogonal to the second polarization.

25. The illumination device of claim 17, wherein the first polarization is orthogonal to the second polarization.

26. The illumination device of claim 1, wherein the planar array of metasurface elements includes metasurface elements with rectangular or elliptical cross-sections, and the planar array of metasurface elements produces, from the light from the VCSEL array, two simultaneously overlapping dot patterns in the far field.

27. The illumination device of claim 5, wherein the planar array of metasurface elements includes metasurface elements with rectangular or elliptical cross-sections, and the light passing through the planar array of metasurface elements simultaneously produces the first dot pattern and the second dot pattern.

28. The illumination device of claim 10, wherein the planar array of metasurface elements includes metasurface elements with rectangular or elliptical cross-sections, and the light passing through the planar array of metasurface elements simultaneously produces the first dot pattern and the second dot pattern.

29. The illumination device of claim 17, wherein the planar array of metasurface elements includes metasurface elements with rectangular or elliptical cross-sections, and the light passing through the planar array of metasurface elements simultaneously produces the dot pattern and the arbitrary radiation pattern.

* * * * *